(12) United States Patent
Floren et al.

(10) Patent No.: US 12,430,017 B2
(45) Date of Patent: *Sep. 30, 2025

(54) INTERACTIVE GRAPHICAL USER INTERFACES FOR SIMULATED SYSTEMS

(71) Applicant: Palantir Technologies Inc., Denver, CO (US)

(72) Inventors: Andrew Floren, Brooklyn, NY (US); Feridun Arda Kara, San Francisco, CA (US); Adil Majid, San Jose, CA (US); Ted Mabrey, Denver, CO (US); Thomas McArdle, London (GB); Timothy Slatcher, Golden, CO (US); Christopher Martin, Minneapolis, MN (US); Thomas Pearson, Twickenham (GB); Jesse Rickard, Houston, TX (US); Gabriel Boning, Seattle, WA (US); Joh Reeves, San Diego, CA (US); David Skiff, Iowa City, IA (US); Adam Storr, San Francisco, CA (US); Vipul Shekhawat, Brooklyn, NY (US); Sander Kromwijk, New York, NY (US)

(73) Assignee: Palantir Technologies Inc., Denver, CO (US)

(*) Notice: Subject to any disclaimer, the term of this patent is extended or adjusted under 35 U.S.C. 154(b) by 0 days.

This patent is subject to a terminal disclaimer.

(21) Appl. No.: 18/297,490

(22) Filed: Apr. 7, 2023

(65) Prior Publication Data

US 2023/0259263 A1 Aug. 17, 2023

Related U.S. Application Data

(63) Continuation of application No. 17/447,105, filed on Sep. 8, 2021, now Pat. No. 11,650,728.

(Continued)

(51) Int. Cl.
G06F 3/04847 (2022.01)

(52) U.S. Cl.
CPC .............. G06F 3/04847 (2013.01)

(58) Field of Classification Search
None
See application file for complete search history.

(56) References Cited

U.S. PATENT DOCUMENTS 6,957,188 B1   10/2005   Dellevi et al.
7,051,036 B2   5/2006    Rosnow et al.
(Continued)

FOREIGN PATENT DOCUMENTS

EP   3866024   8/2021
EP   3869414   8/2021
(Continued)

OTHER PUBLICATIONS

U.S. Pat. No. 11,567,639, Interactive Graphical User Interfaces for Simulated Systems, Jan. 31, 2023.
(Continued)

Primary Examiner — Tuan S Nguyen
(74) Attorney, Agent, or Firm — Knobbe, Martens, Olson & Bear, LLP

(57) ABSTRACT

Systems, computer program products, and computer-implemented methods for visualizing and interacting with a plurality of models that collectively represent a real-world system depicted in a graphical user interface. The system described herein may generate an interactive graphical user interface with multiple modes and a plurality of panels associated with the plurality of models. These panels and modes lay the framework for how a user can properly visualize and analyze the models at a particular point in time or over a period of time. The systems, computer program products, and computer-implemented methods may thus, (Continued)

according to various embodiments, enable a plurality of models that collectively represent a real-world system be interacted with and visualized by a graphical user interface.

20 Claims, 49 Drawing Sheets

Related U.S. Application Data

(60) Provisional application No. 63/201,109, filed on Apr. 13, 2021, provisional application No. 63/142,417, filed on Jan. 27, 2021, provisional application No. 63/141,378, filed on Jan. 25, 2021, provisional application No. 63/075,722, filed on Sep. 8, 2020.

(56) References Cited

U.S. PATENT DOCUMENTS

| | | | |
|---|---|---|---|
| 7,685,140 | B2 | 3/2010 | Jackson |
| 7,788,631 | B2 | 8/2010 | Sieron et al. |
| 8,121,874 | B1 | 2/2012 | Guheen et al. |
| 8,225,223 | B2 | 7/2012 | Becerra, Jr. |
| 8,498,985 | B2 | 7/2013 | Spence et al. |
| 9,032,312 | B2 | 5/2015 | Barnes et al. |
| 9,767,557 | B1 | 9/2017 | Gulsun et al. |
| 10,740,292 | B2* | 8/2020 | Haddad .................. G06F 9/455 |
| 11,567,639 | B2 | 1/2023 | Rickard et al. |
| 11,650,728 | B2 | 5/2023 | Floren et al. |
| 11,816,555 | B2 | 11/2023 | Rickard et al. |
| 11,947,934 | B2 | 4/2024 | Rahill-Marier et al. |
| 12,061,780 | B2 | 8/2024 | Rickard et al. |
| 2003/0065663 | A1 | 4/2003 | Chu |
| 2007/0297675 | A1* | 12/2007 | Lee ..................... G06F 18/2113 382/190 |
| 2011/0153540 | A1* | 6/2011 | Beg ..................... G06F 11/079 706/46 |
| 2013/0289774 | A1 | 10/2013 | Day |
| 2015/0220311 | A1* | 8/2015 | Salter ..................... G06F 8/34 717/105 |
| 2016/0180466 | A1* | 6/2016 | Caldwell ................ G06Q 40/06 705/17 |
| 2018/0218042 | A1 | 8/2018 | Krishnan et al. |
| 2018/0322396 | A1 | 11/2018 | Ahuja-Cogny et al. |
| 2018/0337940 | A1 | 11/2018 | Seiver |
| 2020/0104401 | A1* | 4/2020 | Burnett .................. G06F 16/287 |
| 2020/0162340 | A1* | 5/2020 | Rossi ..................... H04L 41/22 |
| 2020/0211160 | A1 | 7/2020 | Zhang et al. |
| 2020/0293501 | A1 | 9/2020 | Awasthi et al. |
| 2020/0311199 | A1 | 10/2020 | Yan et al. |
| 2021/0119576 | A1 | 4/2021 | Padullaparthi et al. |
| 2021/0166445 | A1 | 6/2021 | Wang et al. |
| 2021/0248447 | A1 | 8/2021 | Rickard et al. |
| 2021/0334738 | A1* | 10/2021 | Jelvis .................. G06Q 10/087 |
| 2021/0390420 | A1* | 12/2021 | Barnett ..................... G06N 5/02 |
| 2022/0236965 | A1 | 7/2022 | Rahill-Marier et al. |
| 2023/0125026 | A1 | 4/2023 | Rickard et al. |
| 2024/0037374 | A1 | 2/2024 | Rickard et al. |
| 2024/0201956 | A1 | 6/2024 | Rahill-Marier et al. |

FOREIGN PATENT DOCUMENTS

| | | |
|---|---|---|
| WO | WO 2022/056529 | 3/2022 |
| WO | WO 2022/159890 | 7/2022 |

OTHER PUBLICATIONS

U.S. Pat. No. 11,650,728, Interactive Graphical User Interfaces for Simulated Systems, May 16, 2023.
U.S. Appl. No. 18/067,505, Interactive Graphical User Interfaces for Simulated Systems, filed Dec. 16, 2022.
U.S. Appl. No. 17/171,898, System and Method for Chaining Discrete Models, filed Feb. 9, 2021.
U.S. Appl. No. 17/583,058, Auto-Generating Interactive Workflow User Interfaces for Simulated Systems, filed Jan. 24, 2022.
Official Communication for European Patent Application No. 22709433.1, dated Apr. 2, 2025, 6 pages.
Bock et al. "Advantageous usage of textual domain-specific languages for scenario-driven development of automated driving functions." 2019 IEEE International Systems Conference (SysCon). IEEE, 2019.pp.1-8.
Casati et al. "Using patterns to design rules in workflows." IEEE Transactions on Software Engineering 26.8 (2000): pp. 760-785.
Clerckx et al., "Dyna-Mo-AID: A design process and a runtime architecture for dynamic model-based user interface development", IFIP International Conference on Engineering for Human-Computer Interaction, Berlin, Heidelberg: Springer Berlin Heidelberg, pp. 1-19 (2004).
Kuhn et al., "Introspective Black Box Failure Predicition for Autonomous Driving", 2020 IEEE Intelligent Vehicles Symposium (IV), p. 7.
Mandal et al., "Integrating existing scientific workflow systems: the Kepler/Pegasus example", Proceedings of the 2nd workshop on Workflows in support of large-scale science, 2007, pp. 21-28.
Marru et al. "Apache airavata: a framework for distributed applications and computational workflows", Proceedings of the 2011 ACM workshop on Gateway computing environments, 2011, pp. 21-28.
Myers et al., "Past, present, and future of user interface software tools", ACM Transactions on Computer-Human Interaction (TOCHI), 7.1, pp. 3-28 (2000).
Rubiolo et al., "Knowledge Discovery Through Ontology Matching: An Approach Based on an Artificial Neural Network Model", Information Sciences, vol. 194, Jul. 1, 2012, pp. 107-119.
Tamilselvam et al., "A visual programming paradigm for abstract deep learning model development", Proceedings of the 10th Indian Conference on Human-Computer Interaction, (2019).
Vodislav, "HandMove: a system for creating animated user interface components by direct manipulation", IFIP International Conference on Engineering for Human-Computer Interaction, Boston, MA, Springer US, pp. 1-15 (1995).
You et al., "Dynamic process modeling with recurrent neural networks", AIChE Journal, vol. 39(10):1654-1667 (1993).
Official Communication for European Patent Application No. 21156704.5 dated Oct. 6, 2023, 4 pages.
Official Communication for European Patent Application No. 21156705.2 dated Jan. 3, 2024, 9 pages.

* cited by examiner

FIG. 9C

Alert Details ⊗ Close ⓩ Snooze « Escalate

⚠ Production step took longer than forecast
[TS] Production Alert
Overview Properties Title
Production step took longer than forecast

Process Step | Process Name | Priority | Status
1a | mixing cathode slurry | High | in progress

▦ Affected Components    1 result ▦ ··· ▽

| ☐ | #TITLE | # PLANT ID |
|---|---|---|
| ☐ | ⓘ Mixer 1 | 0 |

▦ Affected Batches    1 result ▦ ··· ▽

| ☐ | #TITLE | # PRODUCT ID | # PLANT ID |
|---|---|---|---|
| ☐ | ⊡ 1 | ev_94Ah | 1 |

Alert Remediation

New Orders

| | Assigned Delivery Date | Estimated Delivery Date | Cost | Quantity Requested | Supplier Id |
|---|---|---|---|---|---|
| ⊕ | Apr 30,2021 | Apr 30,2021 | $10,257 | 100 | IPS 5690 |

Successfully applied change. ✕

Create Order ▼

| Quantity to Resolve 85 | Coverage (Days) 11 | Destination Southeast 01 |
|---|---|---|

| Potential Backorders (Next 30days) | Total Cost |
|---|---|
| 0 | $26,802 |

| Part Cost | Logistics Cost | Quantity Cost | Carbon Cost |
|---|---|---|---|
| $24,600 | $560 | $830 | $12 |

Changes
⊕ HV Connector
Status-New
Distribution Center-Dist_SE_01
Quantity Requested-100
Original Delivery Date-Apr16,2021
Current Delivery Date-Apr16,2021
Total Cost-$26,802
Supplier id-IPS-5690

Existing Orders — Edit selected ∨

| | Supplier Id | Original Delivery Date | Current Delivery Date | Quantity Requested | Distribution Centre | Part |
|---|---|---|---|---|---|---|
| ⊕ | AM_0145 | Apr7,2021 | Apr7,2021 | 250 | Dist_MW_01 | HV Connector |
| ○ | AM_0145 | Apr14,2021 | Apr14,2021 | 50 | Dist_NE_01 | HV Connector |
| ○ | AM_0145 | Jun 29,2021 | Jun 29,2021 | 50 | Dist_SW_01 | HV Connector |
| ○ | DS_1235 | May 29,2021 | May 29,2021 | 100 | Dist_MW_01 | HV Connector |
| ○ | AM_0145 | Apr12,2021 | Apr12,2021 | 250 | Dist_MW_01 | HV Connector |
| ○ | AM_0145 | Jun27,2021 | Jun27,2021 | 250 | Dist_MW_01 | HV Connector |
| ○ | AM_0145 | Apr19,2021 | Apr19,2021 | 50 | Dist_NE_01 | HV Connector |

Existing Inventory — Edit Selected ∨

| | Title | Location Type | Original Inventory | Adjusted Inventory | Demand | Location |
|---|---|---|---|---|---|---|
| ○ | Plant Germany Warehouse | Production | 600 | 600 | 400 | DE |
| ○ | Plant Mexico Warehouse | Production | 500 | 500 | 450 | MX |
| ○ | Plant Alabama Warehouse | Production | 500 | 500 | 450 | USA |
| ○ | Plant Michigan Warehouse | Production | 300 | 300 | 280 | USA |
| ○ | US Northeast Distribution Centre | After sales | 62 | 62 | 20 | USA |

Clear    Process Actions

INTERACTIVE GRAPHICAL USER INTERFACES FOR SIMULATED SYSTEMS

CROSS-REFERENCE TO RELATED APPLICATIONS

This application is a continuation of U.S. patent application Ser. No. 17/447,105, filed Sep. 8, 2021, and titled "INTERACTIVE GRAPHICAL USER INTERFACES FOR SIMULATED SYSTEMS," which claims benefit of U.S. Provisional Patent Application No. 63/075,722, filed Sep. 8, 2020, and titled "GRAPH AND MAP BASED SYSTEM EXPLORATION, VISUALIZATION, MONITORING, ALERTING, SIMULATION MODELING, AND MANAGEMENT," U.S. Provisional Patent Application No. 63/141,378, filed Jan. 25, 2021, and titled "OPTIMIZATION OF SIMULATIONS TO PROVIDE RECOMMENDED ACTIONS," U.S. Provisional Patent Application No. 63/142,417, filed Jan. 27, 2021, and titled "OPTIMIZATION OF SIMULATIONS TO PROVIDE RECOMMENDED ACTIONS," and U.S. Provisional Patent Application No. 63/201,109, filed Apr. 13, 2021, and titled "GRAPH AND MAP BASED SYSTEM EXPLORATION, VISUALIZATION, MONITORING, ALERTING, SIMULATION, OPTIMIZATION, RECOMMENDATIONS, AND MANAGEMENT." The entire disclosure of each of the above items is hereby made part of this specification as if set forth fully herein and incorporated by reference for all purposes, for all that it contains.

Any and all applications for which a foreign or domestic priority claim is identified in the Application Data Sheet as filed with the present application are hereby incorporated by reference under 37 CFR 1.57 for all purposes and for all that they contain.

TECHNICAL FIELD

The present disclosure relates to models for simulating real-world systems and interactive user interfaces for data integration, analysis, and visualization.

BACKGROUND

A database may store a large quantity of measurement data. For example, a system may comprise a large number of sensors that each collect measurements at regular intervals, and the measurements may be stored in the database. The measurement data can be supplemented with other data, such as simulated information based on the sensor measurements, and the supplemental data can also be stored in the database. In some cases, a user may attempt to analyze a portion of the stored data. For example, the user may attempt to analyze the simulated information. However, as the number of measurements increases over time, it can become very difficult for the user to identify, visualize, and perform analysis on the relevant measurement data.

SUMMARY

The systems, methods, and devices described herein each have several aspects, no single one of which is solely responsible for its desirable attributes. Without limiting the scope of this disclosure, several non-limiting features will now be described briefly.

Disclosed herein are various systems, computer program products, and computer-implemented methods for visualizing and interacting with various inputs, outputs, and other data resulting from a simulation of multiple models that collectively represent a real-world system, e.g., a technical or physical real-world system. For example, an interactive graphical user interface ("GUI") may include one or more panels to display objects and object properties. The objects and object properties may represent the inputs and outputs of the simulated models. The GUI may further comprise at least one of information, trend, simulation, mapping, schematic, time, equipment, and toolbar panels. These panels may display the objects, object properties, inputs, and outputs of the simulated models.

Moreover, the GUI may include a viewing and editing mode to view or edit at least one of the information, trend, simulation, mapping, schematic, time, equipment, and toolbar panels. These panels and modes lay the framework for how a user can properly visualize and analyze the models at a particular point in time or over a period of time. The visualization and analysis may be performed in real-time. For example, the trend panel in the viewing mode may display the trends for one or more object properties of an object for a given period of time. In the editing mode, the trend panel may allow the user to edit one or more object properties of an object at a specific time instant or for a period of time. The user may further minimize or maximize any panel to optimally achieve the user's display preferences for the system. The user may also markup the system using annotations, change graph line widths to represent different object properties, change the colors or highlighting of various objects or object properties to represent the state of the corresponding object, view events that occurred in association with an object, and the like. The highly configurable and editable nature of the GUI allows any user the ability to visualize, simulate, and interact with the models that collectively represent a real-world system in order to assist the user in monitoring and/or controlling the real-world system by means of a continued and/or guided human-machine interaction process. In some of the embodiments the monitoring and/or controlling is performed in real-time.

Accordingly, in various embodiments, large amounts of data are automatically and dynamically calculated interactively in response to user inputs, and the calculated data is efficiently and compactly presented to a user by the system. Thus, in some embodiments, the user interfaces described herein are more efficient as compared to previous user interfaces in which data is not dynamically updated and compactly and efficiently presented to the user in response to interactive inputs. In some embodiments, the data is updated and presented to the user in real-time Further, as described herein, the system may be configured and/or designed to generate user interface data useable for rendering the various interactive user interfaces described. The user interface data may be used by the system, and/or another computer system, device, and/or software program (for example, a browser program), to render the interactive user interfaces. The interactive user interfaces may be displayed on, for example, electronic displays (including, for example, touch-enabled displays). The interactive user interfaces may allow a user to monitor and/or control various technical components and processes of technical real-world systems.

Additionally, it has been noted that design of computer user interfaces "that are useable and easily learned by humans is a non-trivial problem for software developers." (Dillon, A. (2003) User Interface Design. MacMillan Encyclopedia of Cognitive Science, Vol. 4, London: MacMillan, 453-458.) The various embodiments of interactive and dynamic user interfaces of the present disclosure are the result of significant research, development, improvement, iteration, and testing. This non-trivial development has resulted in the user interfaces described herein which may provide significant cognitive and ergonomic efficiencies and advantages over previous systems. The interactive and dynamic user interfaces include improved human-computer interactions that may provide reduced mental workloads, improved decision-making, reduced work stress, and/or the like, for a user. For example, user interaction with the interactive user interfaces described herein may provide an optimized display of time-varying report-related information and may enable a user to more quickly access, navigate, assess, and digest such information than previous systems.

In some embodiments, data may be presented in graphical representations, such as visual representations, such as charts and graphs, where appropriate, to allow the user to rapidly review the large amount of data and to take advantage of humans' particularly strong pattern recognition abilities related to visual stimuli. In some embodiments, the system may present aggregate quantities, such as totals, counts, and averages. The system may also utilize the information to interpolate or extrapolate (e.g. forecast) future developments.

Further, the interactive and dynamic user interfaces described herein are enabled by innovations in efficient interactions between the user interfaces and underlying systems and components. For example, disclosed herein are improved methods of receiving user inputs, translation and delivery of those inputs to various system components, automatic and dynamic execution of complex processes in response to the input delivery, automatic interaction among various components and processes of the system, and automatic and dynamic updating of the user interfaces. The interactions and presentation of data via the interactive user interfaces described herein may accordingly provide cognitive and ergonomic efficiencies and advantages over previous systems. The manner of presentation assists the user in controlling various technical components and processes by means of a continued and/or guided human-machine interaction process.

In some of the embodiments, the methods and systems described herein may receive input from one or more real-world systems and may also provide output to one or more real-world systems. In some of these embodiments, (measured) parameter values are obtained from measuring devices or sensors in a (technical) real-world system, the parameter values may be used, for example, to train one or more models (e.g., based on machine learning) or a basic model is already provided and the parameter values are used to adapt to the real-world system and/or to further refine the model. The model then allows to simulate the (technical) real-word system and the insights/predictions obtained via the simulation may again be used for monitoring and/or controlling the real-world system, e.g., using actuators, via the interactive and dynamic graphical user interfaces that are described herein. Such an approach may be employed, for example, to monitor and/or control a water treatment physical system or any other real-world system as will be explained in more detail below.

Various embodiments of the present disclosure provide improvements to various technologies and technological fields. For example, existing data storage and processing technology (including, e.g., in memory databases) is limited in various ways (e.g., manual data review is slow, costly, and less detailed; data is too voluminous; etc.), and various embodiments of the disclosure provide significant improvements over such technology. Additionally, various embodiments of the present disclosure are inextricably tied to computer technology. In particular, various embodiments rely on detection of user inputs via graphical user interfaces, calculation of updates to displayed electronic data based on those user inputs, automatic processing of related electronic data, and presentation of the updates to displayed images via interactive graphical user interfaces. Such features and others (e.g., processing and analysis of large amounts of electronic data) are intimately tied to, and enabled by, computer technology, and would not exist except for computer technology. For example, the interactions with displayed data described below in reference to various embodiments cannot reasonably be performed by humans alone, without the computer technology upon which they are implemented. Further, the implementation of the various embodiments of the present disclosure via computer technology enables many of the advantages described herein, including more efficient interaction with, and presentation of, various types of electronic data.

Various combinations of the above and below recited features, embodiments, and aspects are also disclosed and contemplated by the present disclosure.

Additional embodiments of the disclosure are described below in reference to the appended claims, which may serve as an additional summary of the disclosure.

In various embodiments, systems and/or computer systems are disclosed that comprise a computer readable storage medium having program instructions embodied therewith, and one or more processors configured to execute the program instructions to cause the systems and/or computer systems to perform operations comprising one or more aspects of the above- and/or below-described embodiments (including one or more aspects of the appended claims).

In various embodiments, computer-implemented methods are disclosed in which, by one or more processors executing program instructions, one or more aspects of the above- and/or below-described embodiments (including one or more aspects of the appended claims) are implemented and/or performed.

In various embodiments, computer program products comprising a computer readable storage medium are disclosed, wherein the computer readable storage medium has program instructions embodied therewith, the program instructions executable by one or more processors to cause the one or more processors to perform operations comprising one or more aspects of the above- and/or below-described embodiments (including one or more aspects of the appended claims).

BRIEF DESCRIPTION OF THE DRAWINGS

The following drawings and the associated descriptions are provided to illustrate embodiments of the present disclosure and do not limit the scope of the claims. Aspects and many of the attendant advantages of this disclosure will become more readily appreciated as the same become better understood by reference to the following detailed description, when taken in conjunction with the accompanying drawings, wherein:

FIGS. 9A-9H illustrate example map-based interactive graphical user interfaces, according to one or more embodiments;

FIGS. 10A-10B illustrate example alert-related interactive graphical user interfaces, according to one or more embodiments;

FIGS. 13A-13E and 14A-14D illustrate example panel-based and optimization interactive graphical user interfaces, according to one or more embodiments.

DETAILED DESCRIPTION

Figure 1:
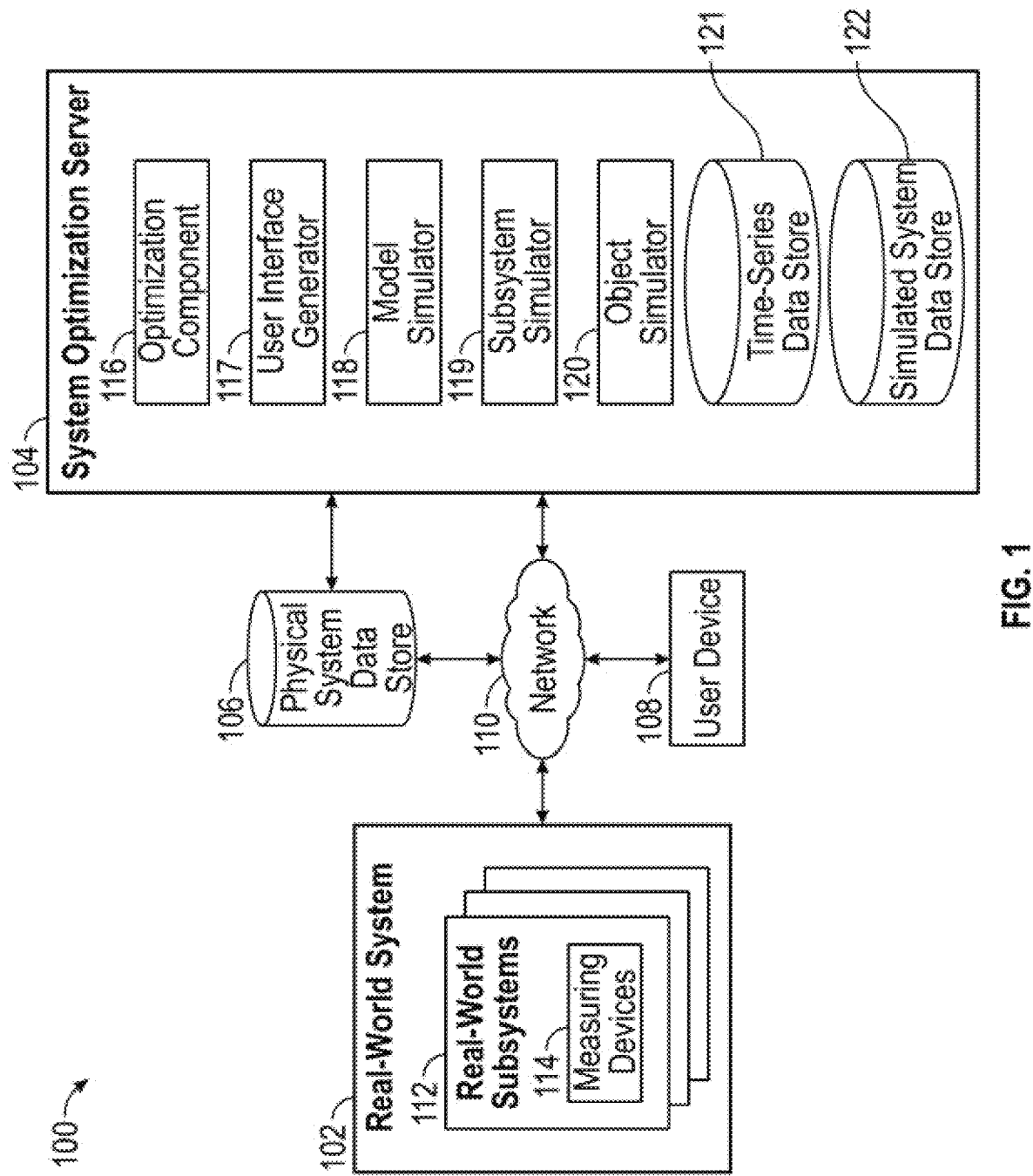
FIG. 1 shows a block diagram illustrating an example computing environment for visualizing and interacting with a plurality of models that collectively may represent a real-world system, and including various interactive graphical user interface functionality and improvements, according to one or more embodiments of the present disclosure.

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

I. Overview

Multiple data models may be used to accurately and/or approximately simulate a real-world and/or physical system (e.g., an actual system present in the real world, such as a physical system, a logical system (e.g., a supply chain), a technical system, etc.). Visualizing a simulation of these data models, however, is challenging because these data models may be constructed by different teams or organizations, use different objects and object properties, and contain known or black box (e.g., unknown) components. Therefore, though a user may have multiple data models to work with and analyze, visualizing how the data models interact together during a simulation of a real-world system can be difficult. Visualizing the interaction of the data models is often useful in understanding the rea-world system. For example, properly visualizing simulations of the data models over time can be useful in understanding how the real-world system may perform, specifically at a particular point in time, over a period of time, or in real-time.

It may be beneficial to be able to visualize a simulation of a real-world system based on the data models so that the impact a broken object in a particular data model has on another data model can be viewed, trends in how objects interact can be charted over time, an optimal coupling of data models can be viewed, etc. Thus, a system that can visualize the interaction of multiple data models that collectively represent a real-world system can achieve the technical benefits described above and be used to design more accurate real-world systems.

To satisfy the technical challenges outlined above, among others, disclosed herein are various computer systems, computer program products, and computer-implemented methods for visualizing and interacting with various inputs and outputs, running simulations, optimizing simulations, and automatically determining and implementing recommendations. The optimization and simulation aspects may be based on multiple models that can collectively represent a real-world system, e.g., a real-world technical system. For example, live sensor data can be provided as an input to one or more of the simulated models which represent, for example, a technical system in the real world. In response, graphical user interfaces ("GUIs") may be generated that can include, for example, graph-based GUIs, map-based GUIs, and panel-based GUIs, among others. The GUIs may include one or more panels to display data including technical data objects (also referred to herein as "objects") (e.g., pumps, compressors, valves, machinery, welding stations, vats, containers, products or items, organizations, countries, counties, factories, customers, hospitals, etc.), technical object properties (e.g., flow rate, suction temperature, volume, capacity, order volume, sales amounts, sales quantity during a time period (e.g., a day, a week, a year, etc.), population density, patient volume, etc.), simulations, alerts, recommendations, and the like. The technical objects and technical object properties may represent the inputs and outputs of the simulated models. Various GUIs may further comprise at least one of information, trend, simulation, mapping, schematic, time, equipment, and toolbar panels. Various panels may display the objects, object properties, inputs, and outputs of the simulated models.

Moreover, in various embodiments the GUIs can include viewing and editing modes. In a viewing mode, the user may view the displayed information, schematic, trend, simulation, time, equipment, toolbar, and/or mapping panels. In an editing mode, the user may edit the displayed information, schematic, trend, simulation, time, equipment, toolbar, and/or mapping panels. These panels and modes can lay the framework for how a user can properly visualize and analyze the models at a particular point in time, over a period of time, or in real time. For example, the trend panel in the viewing mode may display the trends for one or more object properties (e.g., temperature, pressure, flow rate, etc.) of an object (e.g., a pump) for a given period of time (e.g., Monday to Wednesday). In the editing mode, the trend panel may allow the user to edit one or more object properties of an object at a specific time instant (e.g., Monday at noon) or for a period of time (e.g., Monday to Wednesday). The user can further minimize or maximize any panel to optimally achieve the user's display preferences for the system. The user can also markup the system using annotations, change graph line widths to represent different object properties, configure the coloring or highlighting of various objects or object properties to change automatically based on the state (e.g., open, closed, running above specification, running below specification, etc.) of the corresponding object, view events (e.g., weather events, maintenance events) that occurred in association with an object, and/or the like. Thus, the highly configurable and editable nature of the GUIs allows any user the ability to visualize, simulate, and interact with the models that collectively represent a real-world system. Further, a well-designed GUI allows for analysts to more quickly analyze data that, when presented in other formats, would be analyzed much more slowly.

The GUIs, use cases, and/or other functionality of the present disclosure may comprise, in various implementations, "applications" of the system, which "applications" may comprise particular configurations or implementations of "products" of the system. For example, the system may include various "products" which products may include various items of software that may be configured in various ways, and which provide various types of software functionality. Examples of such products include a "dashboard builder" (which may be used to build/provide various types of data visualization dashboards), a "geospatial map" (which may be used to build/provide various types of geospatial map-based interactive software and associated analyses), an "object graph" (which may be used to build/provide various types of node and edge graphs of data objects and associated analyses), a "data analysis" (which may include "programming notebook"-type functionality, among other functionality, for building/providing various types of sequential data analyses), an "alerts viewer" (which may be used to build/provide various types of alerts indications and functionality, including viewing details associated with alerts), and/or the like. Each of the products may be customizable depending on a needed use. For example, the products may be configured to receive certain types of data inputs, provide certain types of data outputs, provide certain types of data visualizations, provide certain types of interactive user interface functionality, have certain user interface organization and/or modules, and/or the like. Accordingly, the products may be "templatized" in the system, meaning that each of the products may be pre-configured in various ways to comprise "templates" depending on various use cases. These product templates can be referred to as "applications". Thus, the products of the system may effectively provide base-level building blocks for various "applications". The products may be used multiple times, in multiple applications, and may be customized for each application. Thus, the system may provide various "applications" that may include various GUIs and other functionality. Examples of "applications" of the present disclosure include, for example, an example graph-based GUI (which may be an implementation of, for example, an "object graph" product of the system), an example map-based GUI (which may be an implementation of, for example, a "geospatial map" product of the system), an example panel-based GUI (which may be an implementation of, for example, an "alerts viewer" product of the system), an example optimization/remediation GUI (which may be an implementation of, for example, any one or a combination of the products of the system), and the various other example implementations of applications for various use case examples described herein. Just as the products may each be implemented/configured/employed in multiple applications/configurations/templates, the applications may each be implemented/employed in various instantiations by being hooked up to different data sources. The products and applications shown and described herein are only examples for illustrative purposes, and various other types of products and/or applications may be possible in the system.

The system of the present disclosure can provide various technical solutions, features, use cases, and advantages. For example, organizations have proliferating data and modeling needs across functions in their internal operations as well as adjacent value chains. The system (and associated methods) of the present disclosure can combine data, models, and workflows into a platform for running highly connected systems and organizations. The system offers various user interfaces and/or frontends (e.g., graph, map, etc.) to visualize these systems across conventional data sources and functional silos, and a backend to weave the (e.g., quantitative, physics-based, machine-learning, etc.) models into the operational workflows to simulate cause and effect relationships.

The system of the present disclosure can include multiple technical aspects to provide various technical advantages, according to various implementations. Some of these technical aspects can include, for example, a data ontology; data models for simulations; and workflow modules including various "applications" as mentioned above.

A data ontology can provide various advantages, for example: operational workflows in system can use data from objects as modeled by an ontology around which objects, links, and data properties are available; objects can comprise primary units of data, similar to a row in a database table but integrating data across many sources; objects can act as a digital twin to a real entity such as plants, widgets, patients; objects can be connected to each other by relations (for a basic relationship between two objects), links (links that contain data properties of their own), or transactions (specific events that happen between two objects at a point in time) which determine the connections that show up in the system; objects can have static (e.g., name and location) and time-dependent (e.g., current inventory levels) properties that can be measures or time series and can be charted over time. Additional explanations of ontology, objects, links, and the like are provided in present disclosure, according to various embodiments.

Data models can provide various advantages, for example: the system enables analytics to be tightly coupled to operational decisions, which can advantageously make it simple to leverage models for what-if simulations and optimizations across functions. This means that operational users can easily explore what-if scenarios, simulate effects across the enterprise, and run optimizations to find global optimal leveraging models in the platform. It also means that analytical users can receive continuous feedback on the accuracy of their models based on real-world operational usage which leads to significantly accelerated learning and improvement. Additional explanations of data models and running simulations are provided in present disclosure, according to various embodiments.

Workflow modules ("applications") can provide various advantages, for example: the system can provide benefits to operational users as the system can provide customized views for the users' specific contexts which may be accessible from objects in the system, where available. This can make it simpler to switch between a "zoomed out" view of the system, and a zoomed-in view for a specific functional workflow. Additional explanations of applications of the system are provided in present disclosure, according to various embodiments.

II. Terms

In order to facilitate an understanding of the systems and methods discussed herein, a number of terms are defined below. The terms defined below, as well as other terms used herein, should be construed to include the provided definitions, the ordinary and customary meaning of the terms, and/or any other implied meaning for the respective terms. Thus, the definitions below do not limit the meaning of these terms, but only provide exemplary definitions.

Data Store: Any computer readable storage medium and/or device (or collection of data storage mediums and/or devices). Examples of data stores include, but are not limited to, optical disks (e.g., CD-ROM, DVD-ROM, etc.), magnetic disks (e.g., hard disks, floppy disks, etc.), memory circuits (e.g., solid state drives, random-access memory (RAM), etc.), and/or the like. Another example of a data store is a hosted storage environment that includes a collection of physical data storage devices that may be remotely accessible and may be rapidly provisioned as needed (commonly referred to as "cloud" storage).

Database: Any data structure (and/or combinations of multiple data structures) for storing and/or organizing data, including, but not limited to, relational databases (e.g., Oracle databases, PostgreSQL databases, etc.), non-relational databases (e.g., NoSQL databases, etc.), in-memory databases, spreadsheets, as comma separated values (CSV) files, eXtensible markup language (XML) files, TeXT (TXT) files, flat files, spreadsheet files, and/or any other widely used or proprietary format for data storage. Databases are typically stored in one or more data stores. Accordingly, each database referred to herein (e.g., in the description herein and/or the figures of the present application) is to be understood as being stored in one or more data stores. Similarly, each data store referred to herein (e.g., in the description herein and/or the figures of the present application) can be understood as implementing, according to various embodiments, one or more databases for storage and retrieval of data.

Data Object or Object: A data container, structure, or file for information representing specific things in the world that have a number of definable properties. For example, a data object can represent an entity such as a person, a place, an organization, a market instrument, or other noun. A data object can represent an event that happens at a point in time or for a duration. A data object can represent a document or other unstructured data source such as an e-mail message, a news report, or a written paper or article. Each data object may be associated with a unique identifier that uniquely identifies the data object. The object's attributes (e.g., metadata about the object) may be represented in one or more properties. Data objects may also be referred to herein as data items.

Object Type: Type of a data object (e.g., Person, Event, or Document). Object types may be defined by an ontology and may be modified or updated to include additional object types. An object definition (e.g., in an ontology) may include how the object is related to other objects, such as being a sub-object type of another object type (e.g., an agent may be a sub-object type of a person object type), and the properties the object type may have.

Property: Attribute of a data object that represents information associated with the data object. A property of a data object may have a property type and a value or values.

Link: A connection between two data objects, based on, for example, a relationship, an event, and/or matching properties. Links may be directional, such as one representing a payment from person A to B, or bidirectional.

Link Set: Set of multiple links that are shared between two or more data objects.

Measuring Device or Sensor: A device, system, or collection of devices or systems that can provide information, e.g., associated with an entity (e.g., device, system, gauge, instrument, detector, antenna, monitor, or any kind of scope, meter, or graph). For example, a sensor may provide reporting values (e.g., measurements or other information) associated with a manufacturing instrument. The received values may comprise values related to physical attributes or measurements (e.g., temperature, pressure, size, etc.), values related to virtual activity or measurements (e.g., network traffic, IP addresses, etc.), and/or the like. The information provided by sensors may be utilized and analyzed for various purposes.

Ontology: Stored information that provides a data model for storage of data in one or more databases/data stores. For example, the stored data may comprise definitions for data object types and respective associated property types. An ontology may also include respective link types/definitions associated with data object types, which may include indications of how data object types may be related to one another. An ontology may also include respective actions associated with data object types. The actions associated with data object types may include defined changes to values of properties based on various inputs. An ontology may also include respective functions, or indications of associated functions, associated with data object types, which functions may be executed when a data object of the associated type is accessed. An ontology may constitute a way to represent things in the world. An ontology may be used by an organization to model a view on what objects exist in the world, what their properties are, and how they are related to each other. An ontology may be user-defined, computer-defined, or some combination of the two. An ontology may include hierarchical relationships among data object types.

III. Example System Optimization Server and Related Computing Environment

FIG. 1 shows a block diagram illustrating an example computing environment 100 for visualizing and interacting with a plurality of models that collectively may represent a real-world system, and including various interactive graphical user interface functionality and improvements, according to one or more embodiments.

As illustrated in FIG. 1, the example computing environment 100 may include a real-world and/or physical system 102, a system optimization server 104, a real-world/physical system data store 106, and a user computing device 108. In an embodiment, the real-world system 102, the system optimization server 104, the physical system data store 106, and the user device 108 communicate via a network 110. In other embodiments, there may be multiple real-world systems 102. These multiple real-world systems 102 may be of the same and/or different types. Further the multiple real-world systems 102 may also communicate via the network 110. Similarly, the functionality disclosed with reference to these components may be distributed to other computing devices and/or partially performed by multiple computing devices. In various implementations, the components of the example computing environment 100 may be in communication with each other via the network 110, one or more other computer networks, and/or via one or more direct connections.

The real-world system 102 may be a logical system, such as a representation of a supply chain. The real-world system 102 can also be a physical system that has a structure that comprises various components and equipment and may be located in various areas. For example, the real-world system 102 may be located at an environmental monitoring and/or research site such as a volcano, an ocean, a river, a lake, an ice sheet, a forest, and/or the like. In another example, the real-world system 102 may be a technical system, e.g., a manufacturing site, such as a location in which machinery is used to make articles. In another example, the real-world system 102 may be a vehicle such as a car, a bus, an airplane, a train, a boat, a bicycle and/or the like. In another example, the real-world system 102 may be a mine, a fracking site, an oil well, an oil, water, or gas pipeline, and/or the like.

The real-world system 102 may further include a plurality of real-world subsystems 112. The real-world subsystems 112 may make up the real-world system 102. For example, the real-world subsystems 112 may be a logical subsystem (e.g., a supply chain subsystem, such as a group of activities performed at a particular location like a distribution center). As another example, the real-world subsystems 112 may be a physical or technical subsystem, such as a gas pumping subsystem, a gas separation subsystem, and a gas compression subsystem that make up a gas pipeline physical system. As another example, the real-world subsystems 112 may be a movement detection subsystem, a gas detection subsystem, and/or other related subsystems that form a volcano monitoring physical system.

A plurality of logical computations (e.g., order volume, sales quantity during a time period, etc.), sensors, and/or measuring devices 114 may couple to the real-world subsystems 112. For example, the real-world subsystem 112 may include one or more logical computations if the real-world subsystem 112 is a logical subsystem. The measuring devices 114 may detect or measure statistics or other numerical values associated with the object (e.g., an item, a product, etc.) passing through the logical subsystem. As another example, the real-world subsystem 112 may include one or more sensors and/or measuring devices if the real-world subsystem 112 is a physical or logical subsystem. As an illustrative example, a gas compression subsystem may include a sensor and/or measuring device coupled to a gas compressor and a sensor and/or measuring device coupled to a gas compressor valve. As another illustrative example, a movement detection system may include a seismograph, a motion detector, a camera, and/or the like. The sensors and/or measuring devices 114 may detect or measure physical properties, such as pressure, flow rate, acoustic signals, temperature or changes in temperature, vehicle speed, motion, images, and/or the like.

In some embodiments, the real-world subsystems 112 may not exist and only a real-world system 102 includes the plurality of logical computations, sensors, and/or measuring devices 114. For example, a supply chain system may include one or more logical computations associated with the supply chain itself. As another example, a gas pipeline physical system may include a sensor and/or measuring device coupled to the gas pipeline. Another example may include a manufacturing site physical system that may include sensors and/or measuring devices coupled to a machinery physical subsystem so that monitoring of the operation of machinery at the manufacturing site and variations in manufacturing conditions, such as temperature, efficiency, output, etc., and/or the like may occur. Another example may include an airplane physical system that may include sensors and/or measuring devices coupled to one or more airplane physical subsystems, such as the engine, the transmission, the flaps, the propeller, the wheels, the landing gear, the exhaust, the rudder, etc., to track operation of the airplane physical subsystems, monitor weather conditions, identify deviations from an expected travel route, track fuel efficiency, and/or the like. The examples described herein are not meant to be limiting.

The real-world system 102 may further include logical computations, sensors, and/or measuring devices 114 coupled to real-world subsystems 112 that directly transmit the measurement data over the network 110 to the system optimization server 104. In another embodiment, the real-world system 102 may include logical computations, sensors, and/or measuring devices 114 coupled to real-world subsystems 112 that transmit the measurement data over the network 110 to the physical system data store 106. In another embodiment, the real-world system 102 may include logical computations, sensors, and/or measuring devices 114 coupled to real-world subsystems 112 that transmit the measurement data over the network 110 to the user device 108.

The system optimization server 104 may include various data stores and executable code modules. In an embodiment, the system optimization server 104 may include an optimization component 116, a user interface generator 117, a model simulator 118, a subsystem simulator 119, an object simulator 120, a time-series data store 121, and a simulated system data store 122. In an embodiment, the optimization component 116, the user interface generator 117, the model simulator 118, the subsystem simulator 119, and the object simulator 120 are each implemented as executable code modules that are stored in the memory of, and executed by one or more processors of, the system optimization server 104. The optimization component 116, the user interface generator 117, model simulator 118, the subsystem simulator 119, and the object simulator 120 may also be implemented partly or wholly in application-specific hardware.

In some embodiments, the executable code modules of the system optimization server 104 may call an application programming interface ("API") to perform various functions. The executable code modules may receive data via the network 110 and/or from the physical system data store 106, time-series data store 121, and/or simulated system data store 122. One or more of the data stores may be databases. Each of the real-world system data store 106, time-series data store 121, and/or simulated system data store 122 may store data items of various types, as described herein.

The physical system data store 106 may store and provide to the network 110, and/or to the system optimization server 104, various data items that may be related to logical computations, measuring devices, physical subsystems, technical subsystems, logical subsystems, physical systems, technical systems, and logical systems. For example, such data items may include a statistic related to a product or item that is the subject of a supply chain, a measurement of a measuring device, a category of a physical or logical subsystem, a health of a physical or logical system, and/or other like data items. In some implementations, the physical system data store 106 may additionally or alternatively include data or information derivable from or based on physical objects or events, or data or information related to non-real-world/non-physical objects or events. Further, in various implementations the physical system data store 106 may be included in the system optimization server 104, and/or other aspects and components of the system optimization server 104 and/or the computing environment 100 may be arranged differently from shown in the example of FIG. 1.

The time-series data store 121 may store and provide to the network 110, physical system data store 106 and/or to the other various data stores and executable code modules within the system optimization server 104, various data items related to objects, subsystems, and/or measured or generated over a period of a time and/or at a specific point in time. For example, such data items may include a shelf life of an object, a schedule of a subsystem, historical information of a model, and/or other like data items.

The simulated system data store 122 may store and provide to the network 110, physical system data store 106, and/or to the other various data stores and/or executable code modules within the system optimization server 104, various data items related to objects, subsystems, and/or models generated as a result of a simulation of the objects, subsystems, and/or models. For example, such data items may include a virtual copy of a physical object and related properties, a virtual subsystem simulated from a physical or logical subsystem, a model characterized by a physical or logical system, and/or other like data items.

While the time-series data store 121 and simulated system data store 122 are illustrated as being stored in the system optimization server 104, this is not meant to be limiting. The time-series data store 121 and/or simulated system data store 122 may be external to the system optimization server 104 and may communicate via network 110.

The model simulator 118 may simulate one or more real-world systems 102, and/or other like physical, technical, or logical structures to obtain and/or generate one or more models. In some embodiments, the one or more models may be known (e.g., the relationships, subsystems and/or objects that make up the model based on the real-world systems 102 and/or other like physical, technical, or logical structures that the one or more models may simulate are known). In some embodiments, the one or more models may be black box or unknown (e.g., the relationships, subsystems and/or objects that make up the one or more models based on the real-world systems 102 and/or other like physical, technical, or logical structures that the models may simulate may not be all known such that at least one parameter of the black box models is unknown). In some embodiments, the model simulator 118 may be one or more third party physics and/or simulation engines that may simulate one or more known and/or black box models.

In various embodiments, models may be based on and/or trained based on historical data (e.g., historical cost data, historical quality data (e.g., number of warranty claims for materials from various suppliers), historical sustainability data, and the like).

The subsystem simulator 119 may simulate one or more real-world subsystems 112 and/or other like subsystem structures of the real-world system 102. In some embodiments, the subsystem simulator 119 may extract subsystem data (e.g., data of the physical or logical subsystems, present in the physical system data store 106) to perform the simulation. For example, in the case of an oil well physical system, the subsystem data may include parameters or measured data values originating from an oil well separation subsystem, an oil pumping subsystem, and/or the like.

The object simulator 120 may simulate one or more technical objects (e.g., measuring devices, components etc.) of the real-world subsystem 112 and/or real-world system 102. In some embodiments, the object simulator 120 may extract object data (e.g., measuring device data, logical computation data (e.g., statistical values), etc.) present in the physical system data store 106 to perform the simulation. The data may include unusual or periodic (e.g., some component oscillating) object properties or events that may have occurred (e.g., historical object properties) during operation of the real-world system 102, real-world subsystem 112, or any other structure in which the logical computations, sensors, and/or measuring devices 114 are present. For example, in the case of a supply chain, the technical object properties may include a time that an item or product was shipped from one location to another location, a time that an item or product arrived at a particular location, etc. As another example, in the case of an oil well physical system, the object properties may include sand entering a well during the drilling process, a structural vibration in a component or a piece of equipment of the oil well, a failure of a component or a piece of equipment of the oil well, and/or the like.

The user interface generator 117 may generate user interface code or data that, when executed (e.g., by a user device 108), causes a user device 108 to render and/or display a user interface that comprises one or more panels, where the panel(s) may comprise model, subsystem, and/or object data generated or obtained over a period of time. The user interface rendered as a result of the user interface code generated by the user interface generator 117 may be an "interactive GUI" or "interactive user interface" comprised of one or more panels. The terms "GUI", "interactive GUI", "user interface", and "interactive user interface" may be used interchangeably herein. The one or more panels may display technical objects (e.g., pumps, compressors, valves, machinery, welding stations, vats, containers, products or items, factories, customers, hospitals, etc.) and/or technical object properties (e.g., flow rate, suction temperature, volume, capacity, order volume, sales amounts, sales quantity during a time period (e.g., a day, a week, a year, etc.), patient volume, etc.) simulated by the object simulator 120. The interactive user interface visualizes and allows a user to interact with at least one of an information, schematic, trend, simulation, time, equipment, toolbar, and/or mapping panel.

These panels display the subsystems, objects, object properties, inputs, outputs, and/or connections therein of the simulated models.

The interactive user interface rendered and/or displayed as a result of the user interface code generated by the user interface generator 117 may include a viewing mode and/or an editing mode. In the viewing mode, the user may view the displayed information, schematic, trend, simulation, time, equipment, toolbar, and/or mapping panels. In the editing mode, the user may edit the displayed information, schematic, trend, simulation, time, equipment, toolbar, and/or mapping panels. These panels and modes lay the framework for how a user can properly visualize and analyze the models at a particular point in time or over a period of time.

For example, the trend panel in the viewing mode may display the trends for one or more technical object properties (e.g., temperature, pressure, flow rate, order volume, sales amounts, sales quantity during a time period (e.g., a day, a week, a year, etc.), patient volume, etc.) of a technical object (e.g., a pump, a product or item, a factory, a customer, a hospital, etc.) for a given period of time (e.g., Monday to Wednesday). In the editing mode, the trend panel may allow the user to edit one or more object properties of an object at a specific time instant (e.g., Monday at noon) or for a period of time (e.g., Monday to Wednesday). The user can further minimize or maximize any panel to optimally achieve the user's display preferences for the system. The user can also markup the system using annotations, change graph line widths to represent different object properties, change the colors or highlighting of various objects or object properties to represent the state (e.g., open, closed, running above specification, running below specification, etc.) of the corresponding object, and/or the like.

The user interface generator 117 may be configured to generate user interface code or data that, when executed, results in additional features being depicted in the rendered and/or displayed interactive user interface. For example, the interactive user interface may allow the user to scroll on any of the displayed panels and/or change a zoom level of the displayed panels to view information at different depths and/or times.

In some embodiments, the interactive user interface may be configured to allow a user to view or edit error detection data (e.g., information associated with the detection of a malfunction or miscalibration of measuring devices 114 and/or real-world subsystems 112 depicted in at least one of the displayed panels). For example, the interactive user interface can display a message indicating that a fault is detected when such an error is detected by the logical computations, sensors, and/or measuring devices 114 and/or real-world subsystems 112 depicted in at least one of the displayed panels.

The real-world system data store 106 may store the error detection data that may indicate a real-world subsystem 112, logical computation, and/or physical sensor error in one or more real-world systems 102. The real-world systems 102 may be known or transparent systems and/or black box systems.

The model simulator 118 may obtain, generate, and/or simulate one or more models based on the one or more real-world systems 102 and/or the error detection data stored in the real-world system data store 106. The one or more models may be stored in the simulated system data store 122. The error detection data from the real-world system data store 106 may include when the real-world subsystem 112, logical computations, and/or physical sensor error may have occurred over a period of time (e.g., historical sensor error data, live sensor data, real-time sensor data, etc.) and may store this time-series data in the time-series data store 121. The model simulator 118 may transmit the various models and/or data from the time-series data store 121 and/or the simulated system data store 122 to the object simulator 120 to generate objects (e.g., virtual items or products, virtual sensors, virtual measuring devices, etc.) and/or to the subsystem simulator 119 to generate subsystems (e.g., virtual subsystems that may further include the set of virtual logical computations, virtual sensors, virtual measuring devices, etc.). If no real-world subsystem, logical computations, and/or physical sensor error has occurred, the one or more model relationships, subsystems and/or objects may closely mirror the actual real-world subsystem, logical computations, and/or physical sensors. The model simulator 118 may compare actual real-world subsystem 112, logical computations, and/or physical sensor data with simulated data of the one or more simulated models (e.g., data from the generated virtual logical computations, virtual sensors, virtual measuring devices, virtual subsystems, etc.). If the difference between the two datasets is greater than a threshold value, then the model simulator 118 may determine that a virtual subsystem and/or virtual sensor error has occurred. The system optimization server 104 (e.g., the model simulator 118) may use the difference between the two datasets to determine the health of a subsystem (e.g., virtual subsystem), object (e.g., virtual item or product, virtual sensor, etc.), and/or object property (e.g., measurement of the virtual sensor), and display the health on at least one of the displayed panels. The system optimization server 104 (e.g., the model simulator 118) may determine that a smaller difference may result in a healthier subsystem, object, and/or object property, and therefore indicate a healthier model given that these components make up the model.

Additionally the interactive user interface may be configured to allow a user to view or edit, in at least one of the displayed panels, unusual (e.g., abnormal) or periodic events that have occurred and/or that may occur in the future during operation of the logical computations, sensors, and/or measuring devices 114 and/or real-world subsystems 112. Such events may also apply to the simulated virtual objects (e.g., virtual items or products, virtual measuring devices, and/or virtual subsystems). For example, in the case of a supply chain, the object properties may include a time that an item or product was shipped from one location to another location, a time that an item or product arrived at a particular location, etc. In the case of an oil well, events may include sand entering a well during the drilling process, a structural vibration in a component or a piece of equipment of the oil well, a failure of a component or a piece of equipment of the oil well, maintenance being performed on a component or equipment of the oil well, deferral of a component or equipment of the oil well, and/or the like. In the case of a manufacturing site, events may include machinery malfunction, a structural vibration in a part of the machinery, changes in manufacturing conditions (e.g., temperature, efficiency, output, etc.), and/or the like. In the case of a vehicle, events may include a component malfunction, a change in a weather condition (e.g., humidity, wind speed, temperature, etc.), a weather phenomenon (e.g., icing, a lightning strike, a large wave, a tornado, etc.), deviations from an expected travel route (e.g., a change from an expected route determined by a navigation system, a change from the flight plan, etc.), a change in fuel efficiency, and/or the like. In the case of a fracking site, events may include the movement of fluids across various depths, changes in the rock layer, equipment failure, and/or the like. In the case of an environmental monitoring and/or researching site, events may include seismic activity (e.g., as caused by tectonic plates, volcanoes, etc.), ice breakage, lava flow, weather phenomena, and/or the like. In the case of a mine, events may include rock movements, rock burst bumps (e.g., seismic jolts within the mine), blasts, micro-seismic events (e.g., events associated with impending ground control problems like roof collapses or other structural failures), equipment failure, and/or the like. In the case of other types of logical computations, sensors, and/or measuring devices 114 and/or real-world subsystems 112, events can include misalignment of parts on a manufacturing machine, trees falling, landslides, mudslides, avalanches, and/or the like. Although several specific cases are mentioned as example events that have occurred and/or that may occur during operation, this is merely illustrative and not meant to be limiting. For example, maintenance, deferral, weather, equipment failure, delivery delays, re-routing of items or products, order cancellation, etc. are other events that may occur in other cases.

The system optimization server 104 may be implemented as a special-purpose computer system having logical elements. In an embodiment, the logical elements may comprise program instructions recorded on one or more machine-readable storage media. Alternatively, the logical elements may be implemented in hardware, firmware, or a combination thereof. In one embodiment, the system optimization server 104 may be implemented in a Java Virtual Machine (JVM) that is executing in a distributed or non-distributed computer system. In other embodiments, the system optimization server 104 may be implemented as a combination of programming instructions written in any programming language (e.g., C++, Java, Python, etc.) and hardware components (e.g., memory, CPU time) that have been allocated for executing the program instructions.

A user may use the user computing device 108 to view and interact with the interactive user interfaces. For example, the user device 108 may be in communication with the system optimization server 104 via a network 110. The user device 108 can include a wide variety of computing devices, including personal computing devices, terminal computing devices, laptop computing devices, tablet computing devices, electronic reader devices, mobile devices (e.g., mobile phones, media players, handheld gaming devices, etc.), wearable devices with network access and program execution capabilities (e.g., "smart watches" or "smart eyewear"), wireless devices, set-top boxes, gaming consoles, entertainment systems, televisions with network access and program execution capabilities (e.g., "smart TVs"), and various other electronic devices and appliances. The user devices 108 may execute a browser application to communicate with the system optimization server 104.

In an embodiment, the network 110 includes any communications network, such as the Internet. The network 110 may be a wired network, a wireless network, or a combination of the two. For example, network 110 may be a local area network (LAN) and/or a wireless area network (WAN). The network 110 may include cables and/or other equipment that allow the transport of data from underwater locations to above-ground locations and/or vice-versa. For example, the network 110 may include one or more firewalls (e.g., a firewall that provides an interface between the real-world system 102 and the other components of the network 110 and/or a firewall that provides an interface between the other components of the network 110 and the system optimization server 104 and/or the physical system data store 106) and/or an endpoint server, such as a secure HTTP endpoint system.

In various implementations, the various aspects of the computing environment 100 (e.g., the system optimization server 104, and the like) may be implemented in various ways. For example, the system optimization server 104 may be implemented as a single computing system, and/or various functions or services of the system optimization server 104 may be split up and/or arranged differently from that shown in the example computing environment 100 of FIG. 1. Thus, for example, while in FIG. 1 the physical system data store 106, the time-series data store 121, and the simulated system data store 122 are shown as being implemented in particular respective components of the computing environment 100, in other implementations the data stores may combined, separated into additional data stores, and/or the like. As another example, the various components of the system optimization server 104 may be combined and/or separated in additional components/services, and/or may be implemented in different ones of the various systems of the present disclosure. However, for the purpose of providing a concise description in the present disclosure, the various functionalities are described in reference to the example implementation shown in the computing environment 100 of FIG. 1.

As used herein, the terms "server" and "system" generally refer to the system optimization server 104, but various implementations may also include various other aspects of the computing environment 100 and/or other computer systems of the present disclosure.

As noted above, simulations may be performed by a user by providing simulated values for attributes that are then evaluated by multiple chained models to simulate outputs. As discussed further herein, the optimization component 116 provides optimization functionality that enables automatic exploration of a problem space resulting in one or more recommended actions that may be performed based on key performance indicators ("KPIs") or other key metrics. For example, in the supply chain example, an optimization may enable the user to find a precise price point that satisfies multiple targets, such as (1) optimizing revenue (2) without going under inventory limits.

An optimization may be performed by evaluating thousands (or more) scenarios, with each scenario representing a different set of possible actions. For every scenario, a simulation chains together several models and calculates metrics, such as the one or more key metrics that are being optimized. One output of the optimization engine may be a set of actions associated with the optimal scenario, which may be presented as a recommendation to the user. For example, the actions may include the same types of simulated changes that a user may manually simulate, and may be accepted by the user in a similar manner as other simulated changes.

Additional details of example functionality and implementations of various aspects of the computing environment 100 (e.g., the system optimization server 104, and the like) are described below, including in reference to FIGS. 2A-2C, 3-7, 11A-11B, 12, and 15A-15B. Additionally, various example GUIs, applications, use cases, methods and processes, and other functionality are also described below in reference to the various other figures to illustrate various aspects and functionality of the system. In various implementations, various GUIs, functionality of the GUIs, and/or other aspects of the GUIs and use cases may be combined in various ways, some of which are described below as illustrative examples.

IV. Additional Example Aspects of the System Optimization Server

In various implementations, the system of the present disclosure may employ a data model and/or an ontology 152, examples of which are described below. This description is provided for the purpose of providing an example and is not intended to limit the techniques to the example data model, the example system optimization server 104, or the example system's use of an ontology to represent information.

In some embodiments, a body of data is conceptually structured according to an object-centric data model represented by ontology 152. The conceptual data model is independent of any particular database used for durably storing one or more database(s) 150 based on the ontology 152. For example, each object of the conceptual data model may correspond to one or more rows in a relational database, or an entry in Lightweight Directory Access Protocol (LDAP) database or other type of database, or any combination of one or more databases.

Figure 2A:
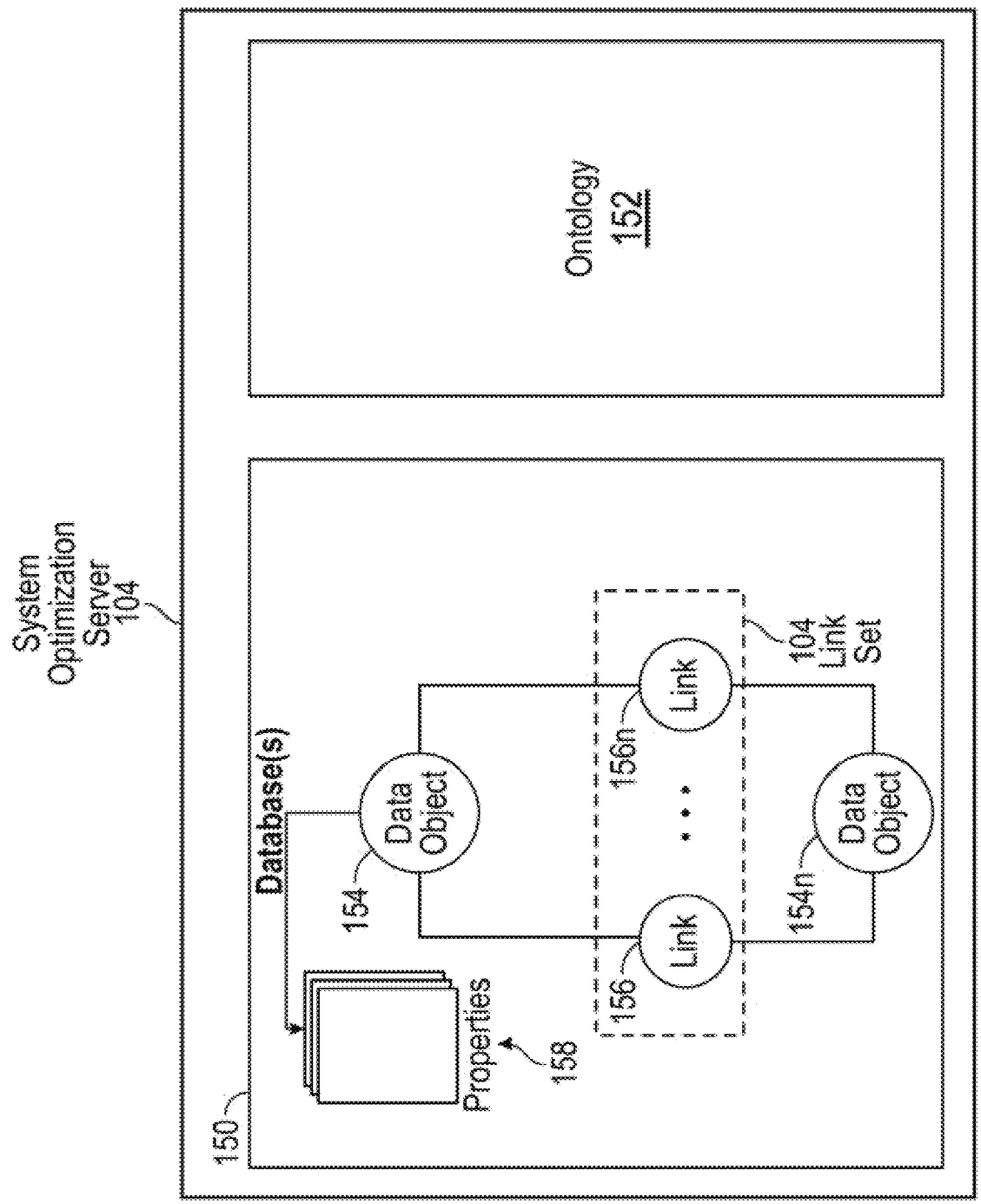
FIG. 2A shows a block diagram illustrating example optional aspects of a system optimization server, including an example object-centric conceptual data model, according to one or more embodiments of the present disclosure.

FIG. 2A shows a block diagram illustrating example additional optional aspects of the system optimization server 104, including an example object-centric conceptual data model, according to one or more embodiments of the present disclosure. An ontology 152, as noted above, may include stored information providing a data model for storage of data in a database 150. According to various implementations, the database 150 may be comprised in any or one or more of the data stores of the example computing environment 100 described above, or separately from those data stores. The ontology 152 may be defined by one or more object types, which may each be associated with one or more property types. At the highest level of description, data object 154 is a container for information representing things in the world. For example, data object 154 can represent an entity such as a person or user, a place, a group, an organization, a resource, a data asset, a request, a purpose, a link, or other noun. Data object 154 can represent an event that happens at a point in time or for a duration. Data object 154 can represent a document or other unstructured data source such as an e-mail message, a news report, or a written paper or article. Each data object 154 is associated with a unique identifier that uniquely identifies the data object within the access management system.

Different types of data objects may have different property types. For example, a "Person" data object might have an "Eye Color" property type and an "Event" data object might have a "Date" property type. Each property 158 as represented by data in the system optimization server 104 may have a property type defined by the ontology 152 used by the database 150.

Objects may be instantiated in the database 150 in accordance with the corresponding object definition for the particular object in the ontology 152. For example, a specific folder (e.g., an object of type "Data Asset") at "C: \Folder" (e.g., a property of type "directory") may be stored in the database 150 as a data asset object metadata as defined within the ontology 152.

The data objects defined in the ontology 152 may support property multiplicity. In particular, a data object 154 may be allowed to have more than one property 158 of the same property type. For example, a "Person" data object might have multiple "Address" properties or multiple "Name" properties.

Each link 156 represents a connection between two data objects 154. In some embodiments, the connection can be through a relationship, an event, a property, or through matching properties. A relationship connection may be asymmetrical or symmetrical. For example, "Person" data object A may be connected to "Person" data object B by a "Boss Of" relationship (where "Person" data object B has an asymmetric "Boss Of" relationship to "Person" data object A), a "Kin Of" symmetric relationship to "Person" data object C, and an asymmetric "Member Of" relationship to "Organization" data object X. The type of relationship between two data objects may vary depending on the types of the data objects. For example, "Person" data object A may have an "Appears In" relationship with "Document" data object Y or have a "Participate In" relationship with "Event" data object E. As an example of an event connection, two "Person" data objects may be connected by an "Office" data object representing a particular business office if they worked at the same place, or by a "Meeting" data object representing a particular meeting if they both attended that meeting. In one embodiment, when two data objects are connected by an event, they are also connected by relationships, in which each data object has a specific relationship to the event, such as, for example, an "Appears In" relationship.

As an example of a matching properties connection, two "Person" data objects representing accountants at a finance firm, may both have a "CPA Qualified" property that indicates that both of them have CPA licenses. If both people work at the same office, then their "Business Address" properties likely contain similar, if not identical property values. In some embodiments, a link between two data objects may be established based on similar or matching properties (e.g., property types and/or property values) of the data objects. These are just some examples of the types of connections that may be represented by a link, and other types of connections may be represented; embodiments are not limited to any particular types of connections between data objects. For example, a document might contain references to two different objects. For example, a document may contain a reference to an event (one object), and a person (a second object). A link between these two objects may represent a connection between these two entities through their co-occurrence within the same document.

Each data object 154 can have multiple links with another data object 154 to form a link set. Each link 156 as represented by data in a database may have a link type defined by the database ontology used by the database.

Figure 2B:
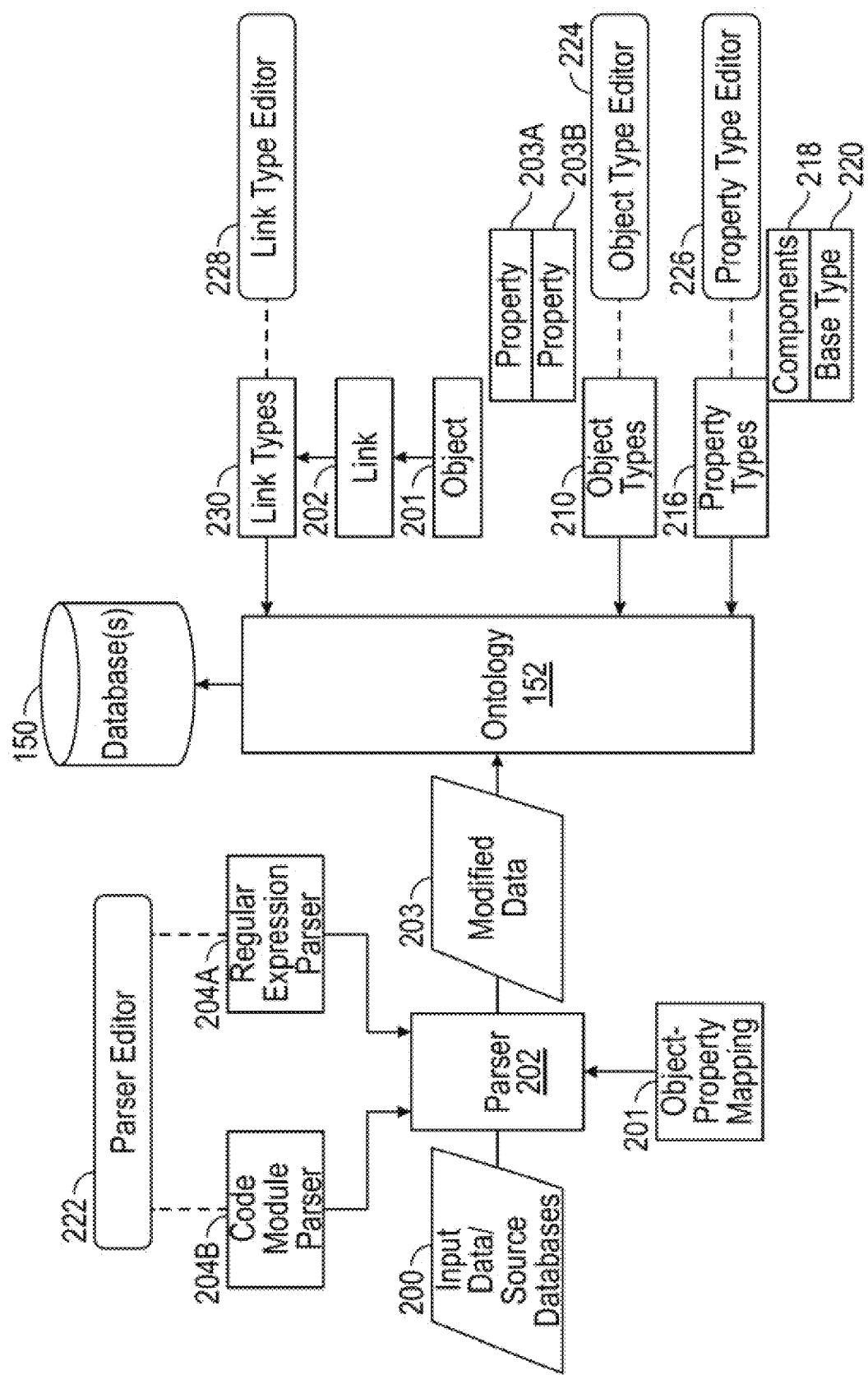
FIG. 2B shows a block diagram illustrating example components and data that may be used in identifying and storing data according to an ontology, according to one or more embodiments.

FIG. 2B shows a block diagram illustrating example components and data that may be used in identifying and storing data according to an ontology, according to one or more embodiments. In this example, the ontology may be configured, and data in the data model populated, by a system of parsers and ontology configuration tools. In the embodiment of FIG. 2B, input data 200 is provided to parser 202. The input data may comprise data from one or more sources. For example, a rental car institution may have one or more databases with information on calendar entries, rental cars, and people. The databases may contain a variety of related information and attributes about each type of data, such as a "date" for a calendar entry, an address for a person, and a date for when a rental car is rented. The parser 202 is able to read a variety of source input data types and determine which type of data it is reading.

In accordance with the discussion above, the example ontology 152 comprises stored information providing the data model of data stored in database 150, and the ontology is defined by one or more object types 210, one or more property types 216, and one or more link types 230. Based on information determined by the parser 202 or other mapping of source input information to object type, one or more data objects 154 may be instantiated in the database 150 based on respective determined object types 210, and each of the objects 154 has one or more properties 158 that are instantiated based on property types 216. Two data objects 154 may be connected by one or more links 156 that may be instantiated based on link types 230. The property types 216 each may comprise one or more data types 218, such as a string, number, etc. Property types 216 may be instantiated based on a base property type 220. For example, a base property type 220 may be "Locations" and a property type 216 may be "Home."

In some embodiments, an administrator of the system (e.g., a user with the proper role and/or permissions) uses an object type editor 224 to create and/or modify the object types 210 and define attributes of the object types. In some embodiments, an administrator of the system uses a property type editor 226 to create and/or modify the property types 216 and define attributes of the property types. In some embodiments, an administrator of the system uses link type editor 228 to create the link types 230. Alternatively, other programs, processes, or programmatic controls may be used to create link types and property types and define attributes, and using editors is not required.

In some embodiments, creating a property type 216 using the property type editor 226 involves defining at least one parser definition using a parser editor 222. A parser definition comprises metadata that informs parser 202 how to parse input data 200 to determine whether values in the input data can be assigned to the property type 216 that is associated with the parser definition. In an embodiment, each parser definition may comprise a regular expression parser 204A or a code module parser 204B. In other embodiments, other kinds of parser definitions may be provided using scripts or other programmatic elements. Once defined, both a regular expression parser 204A and a code module parser 204B can provide input to parser 202 to control parsing of input data 200.

Using the data types defined in the ontology, input data 200 may be parsed by the parser 202 determine which object type 210 should receive data from a record created from the input data, and which property types 216 should be assigned to data from individual field values in the input data. Based on the object-property mapping 201 (including properties 208A, 208B), the parser 202 selects one of the parser definitions that is associated with a property type in the input data. The parser parses an input data field using the selected parser definition, resulting in creating new or modified data 203. The new or modified data 203 is added to the database 150 according to ontology 152 by storing values of the new or modified data in a property of the specified property type. As a result, input data 200 having varying format or syntax can be created in database 150. The ontology 152 may be modified at any time using object type editor 224, property type editor 226, and link type editor 228, or under program control without human use of an editor. Parser editor 222 enables creating multiple parser definitions that can successfully parse input data 200 having varying format or syntax and determine which property types should be used to transform input data 200 into new or modified input data 203.

Figure 2C:
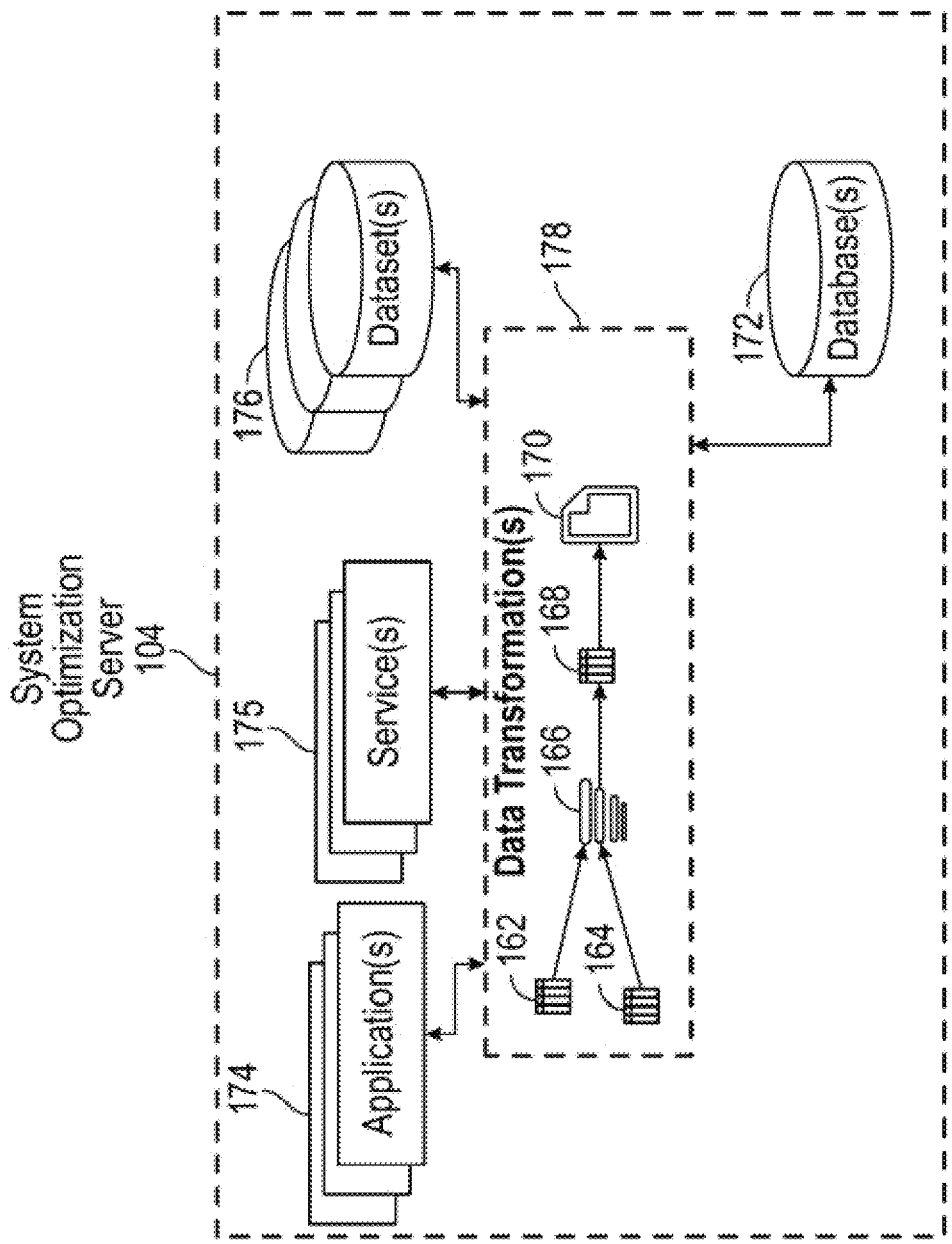
FIG. 2C shows a block diagram illustrating example optional aspects of the system optimization server, according to one or more embodiments.

FIG. 2C shows a block diagram illustrating example additional optional aspects of the system optimization server 104 related to data management, according to one or more embodiments. The example data management functionality of the system optimization server 104 can include one or more applications 174, one or more services 175, one or more initial datasets 176, and a data transformation process 178 (also referred to herein as a build process). The example data management functionality can also include a data pipeline system. The system can transform data and record the data transformations. The one or more applications 174 can include applications that enable users to view datasets, interact with datasets, filter data sets, and/or configure dataset transformation processes or builds. The one or more services 175 can include services that can trigger the data transformation builds and API services for receiving and transmitting data. The one or more initial datasets 176 can be automatically retrieved from external sources and/or can be manually imported by a user. The one or more initial datasets 176 can be in many different formats such as a tabular data format (SQL, delimited, or a spreadsheet data format), a data log format (such as network logs), or time series data (such as sensor data).

Via the one or more services 175, the system can apply the data transformation process 178. An example data transformation process 178 is shown. The system optimization server 104 can receive one or more initial datasets 162, 164. The system can apply a transformation to the dataset(s). For example, the system can apply a first transformation 166 to the initial datasets 162, 164, which can include joining the initial datasets 162, 164 (such as or similar to a SQL JOIN), and/or a filtering of the initial datasets 162, 164. The output of the first transformation 166 can include a modified dataset 168. A second transformation of the modified dataset 168 can result in an output dataset 170, such as a report or a joined table in a tabular data format that can be stored in one or more database(s) 172. Each of the steps in the example data transformation process 178 can be recorded by the system and made available as a resource or data asset. For example, a data asset can include a dataset and/or a dataset item, a transformation, or any other step in a data transformation process. As mentioned above, the data transformation process or build 178 can be triggered by the system, where example triggers can include nightly build processes, detected events, or manual triggers by a user. Additional aspects of data transformations and the system are described in further detail below.

The techniques for recording and transforming data in the system may include maintaining an immutable history of data recording and transformation actions such as uploading a new dataset version to the system and transforming one dataset version to another dataset version. The immutable history is referred to herein as "the catalog." The catalog may be stored in a database. Preferably, reads and writes from and to the catalog are performed in the context of ACID-compliant transactions supported by a system. For example, the catalog may be stored in a relational database managed by a relational database system that supports atomic, consistent, isolated, and durable (ACID) transactions.

The catalog can include versioned immutable "datasets." More specifically, a dataset may encompass an ordered set of conceptual dataset items. The dataset items may be ordered according to their version identifiers recorded in the catalog. Thus, a dataset item may correspond to a particular version of the dataset. A dataset item may represent a snapshot of the dataset at a particular version of the dataset. As a simple example, a version identifier of '1' may be recorded in the catalog for an initial dataset item of a dataset. If data is later added to the dataset, a version identifier of '2' may be recorded in the catalog for a second dataset item that conceptually includes the data of the initial dataset item and the added data. In this example, dataset item '2' may represent the current dataset version and is ordered after dataset item '1'.

As well as being versioned, a dataset may be immutable. That is, when a new version of the dataset corresponding to a new dataset item is created for the dataset in the system, pre-existing dataset items of the dataset are not overwritten by the new dataset item. In this way, pre-existing dataset items (i.e., pre-existing versions of the dataset) are preserved when a new dataset item is added to the dataset (i.e., when a new version of the dataset is created). Note that supporting immutable datasets is not inconsistent with pruning or deleting dataset items corresponding to old dataset versions. For example, old dataset items may be deleted from the system to conserve data storage space.

A version of dataset may correspond to a successfully committed transaction against the dataset. In these embodiments, a sequence of successfully committed transactions against the dataset corresponds to a sequence of dataset versions of the dataset (i.e., a sequence of dataset items of the dataset).

A transaction against a dataset may add data to the dataset, edit existing data in the dataset, remove existing data from the dataset, or a combination of adding, editing, or removing data. A transaction against a dataset may create a new version of the dataset (i.e., a new dataset item of the dataset) without deleting, removing, or modifying pre-existing dataset items (i.e., without deleting, removing, or modifying pre-existing dataset versions). A successfully committed transaction may correspond to a set of one or more files that contain the data of the dataset item created by the successful transaction. The set of files may be stored in a file system.

In the catalog, a dataset item of a dataset may be identified by the name or identifier of the dataset and the dataset version corresponding to the dataset item. In a preferred embodiment, the dataset version corresponds an identifier assigned to the transaction that created the dataset version. The dataset item may be associated in the catalog with the set of files that contain the data of the dataset item. In a preferred embodiment, the catalog treats the set of files as opaque. That is, the catalog itself may store paths or other identifiers of the set of files but may not otherwise open, read, or write to the files.

In sum, the catalog may store information about datasets. The information may include information identifying different versions (i.e., different dataset items) of the datasets. In association with information identifying a particular version (i.e., a particular dataset item) of a dataset, there may be information identifying one or more files that contain the data of the particular dataset version (i.e., the particular dataset item).

The catalog may store information representing a non-linear history of a dataset. Specifically, the history of a dataset may have different dataset branches. Branching may be used to allow one set of changes to a dataset to be made independent and concurrently of another set of changes to the dataset. The catalog may store branch names in association with dataset version identifiers for identifying dataset items that belong to a particular dataset branch.

The catalog may provide dataset provenance at the transaction level of granularity. As an example, suppose a transformation is executed in the system multiple times that reads data from dataset A, reads data from dataset B, transforms the data from dataset A and the data from dataset B in some way to produce dataset C. As mentioned, this transformation may be performed multiple times. Each transformation may be performed in the context of a transaction. For example, the transformation may be performed daily after datasets and B are updated daily in the context of transactions. The result being multiple versions of dataset A, multiple versions of dataset B, and multiple versions of dataset C as a result of multiple executions of the transformation. The catalog may contain sufficient information to trace the provenance of any version of dataset C to the versions of datasets A and B from which the version of dataset C is derived. In addition, the catalog may contain sufficient information the trace the provenance of those versions of datasets A and B to the earlier versions of datasets A and B from which those versions of datasets A and B were derived.

The provenance tracking ability is the result of recording in the catalog for a transaction that creates a new dataset version, the transaction or transactions that the given transaction depends on (e.g., is derived from). The information recorded in the catalog may include an identifier of each dependent transaction and a branch name of the dataset that the dependent transaction was committed against.

According to some embodiments, provenance tracking extends beyond transaction level granularity to column level granularity. For example, suppose a dataset version A is structured as a table of two columns and a dataset version B is structured as a table of five columns. Further assume, column three of dataset version B is computed from column one of dataset version A. In this case, the catalog may store information reflecting the dependency of column three of dataset version B on column one of dataset version A.

The catalog may also support the notion of permission transitivity. For example, suppose the catalog records information for two transactions executed against a dataset referred to in this example as "Transaction 1" and Transaction 2." Further suppose a third transaction is performed against the dataset which is referred to in this example as "Transaction 3." Transaction 3 may use data created by Transaction 1 and data created by Transaction 2 to create the dataset item of Transaction 3. After Transaction 3 is executed, it may be decided according to organizational policy that a particular user should not be allowed to access the data created by Transaction 2. In this case, as a result of the provenance tracking ability, and in particular because the catalog records the dependency of Transaction 3 on Transaction 2, if permission to access the data of Transaction 2 is revoked from the particular user, permission to access the data of Transaction 3 may be transitively revoked from the particular user.

The transitive effect of permission revocation (or permission grant) can apply to an arbitrary number of levels in the provenance tracking. For example, returning to the above example, permission may be transitively revoked for any transaction that depends directly or indirectly on the Transaction 3.

According to some embodiments, where provenance tracking in the catalog has column level granularity. Then permission transitivity may apply at the more fine-grained column level. In this case, permission may be revoked (or granted) on a particular column of a dataset and based on the column-level provenance tracking in the catalog, permission may be transitively revoked on all direct or indirect descendent columns of that column.

A build service can manage transformations which are executed in the system to transform data. The build service may leverage a directed acyclic graph data (DAG) structure to ensure that transformations are executed in proper dependency order. The graph can include a node representing an output dataset to be computed based on one or more input datasets each represented by a node in the graph with a directed edge between node(s) representing the input dataset(s) and the node representing the output dataset. The build service traverses the DAG in dataset dependency order so that the most upstream dependent datasets are computed first. The build service traverses the DAG from the most upstream dependent datasets toward the node representing the output dataset rebuilding datasets as necessary so that they are up-to-date. Finally, the target output dataset is built once all of the dependent datasets are up-to-date.

The system can support branching for both data and code. Build branches allow the same transformation code to be executed on multiple branches. For example, transformation code on the master branch can be executed to produce a dataset on the master branch or on another branch (e.g., the develop branch). Build branches also allow transformation code on a branch to be executed to produce datasets on that branch. For example, transformation code on a development branch can be executed to produce a dataset that is available only on the development branch. Build branches provide isolation of re-computation of graph data across different users and across different execution schedules of a data pipeline. To support branching, the catalog may store information represents a graph of dependencies as opposed to a linear dependency sequence.

The system may enable other data transformation systems to perform transformations. For example, suppose the system stores two "raw" datasets R1 and R2 that are both updated daily (e.g., with daily web log data for two web services). Each update creates a new version of the dataset and corresponds to a different transaction. The datasets are deemed raw in the sense that transformation code may not be executed by the system to produce the datasets. Further suppose there is a transformation A that computes a join between datasets R1 and R2. The join may be performed in a data transformation system such a SQL database system, for example. More generally, the techniques described herein are agnostic to the particular data transformation engine that is used. The data to be transformed and the transformation code to transform the data can be provided to the engine based on information stored in the catalog including where to store the output data.

According to some embodiments, the build service supports a push build. In a push build, rebuilds of all datasets that depend on an upstream dataset or an upstream transformation that has been updated are automatically determined based on information in the catalog and rebuilt. In this case, the build service may accept a target dataset or a target transformation as an input parameter to a push build command. The build service than determines all downstream datasets that need to be rebuilt, if any.

As an example, if the build service receives a push build command with dataset R1 as the target, then the build service would determine all downstream datasets that are not up-to-date with respect to dataset R1 and rebuild them. For example, if dataset D1 is out-of-date with respect to dataset R1, then dataset D1 is rebuilt based on the current versions of datasets R1 and R2 and the current version of transformation A. If dataset D1 is rebuilt because it is out-of-date, then dataset D2 will be rebuilt based on the up-to-date version of dataset D1 and the current version of transformation B and so on until all downstream dataset of the target dataset are rebuilt. The build service may perform similar rebuilding if the target of the push build command is a transformation.

The build service may also support triggers. In this case, a push build may be considered a special case of a trigger. A trigger, generally, is a rebuild action that is performed by the build service that is triggered by the creation of a new version of a dataset or a new version of a transformation in the system.

A schema metadata service can store schema information about files that correspond to transactions reflected in the catalog. An identifier of a given file identified in the catalog may be passed to the schema metadata service and the schema metadata service may return schema information for the file. The schema information may encompass data schema related information such as whether the data in the file is structured as a table, the names of the columns of the table, the data types of the columns, user descriptions of the columns, etc.

The schema information can be accessible via the schema metadata service may versioned separately from the data itself in the catalog. This allows the schemas to be updated separately from datasets and those updates to be tracked separately. For example, suppose a comma separated file is uploaded to the system as particular dataset version. The catalog may store in association with the particular dataset version identifiers of one or more files in which the CSV data is stored. The catalog may also store in association with each of those one or more file identifiers, schema information describing the format and type of data stored in the corresponding file. The schema information for a file may be retrievable via the scheme metadata service given an identifier of the file as input. Note that this versioning scheme in the catalog allows new schema information for a file to be associated with the file and accessible via the schema metadata service. For example, suppose after storing initial schema information for a file in which the CSV data is stored, updated the schema information is stored that reflects a new or better understanding of the CSV data stored in the file. The updated schema information may be retrieved from the schema metadata service for the file without having to create a new version of the CSV data or the file in which the CSV data is stored.

When a transformation is executed, the build service may encapsulate the complexities of the separate versioning of datasets and schema information. For example, suppose transformation A described above in a previous example that accepts the dataset R1 and dataset R2 as input is the target of a build command issued to the build service. In response to this build command, the build service may determine from the catalog the file or files in which the data of the current versions of datasets R1 and R2 is stored. The build service may then access the schema metadata service to obtain the current versions of the schema information for the file or files. The build service may then provide all of identifiers or paths to the file or files and the obtained schema information to the data transformation engine to execute the transformation A. The underlying data transformation engine interprets the schema information and applies it to the data in the file or files when executing the transformation A.

The various data assets (e.g., files, data items, datasets, portions of datasets, transformations, and/or the like) of the system may also be stored in the database(s) 172. According to various implementations, the database(s) 172 may be comprised in any or one or more of the data stores of the example computing environment 100 described above, or separately from those data stores.

The system can include various permissioning functionalities. For example, the system can implement access control lists and/or other permissioning functionality that can enable highly granular permissioning of data assets (e.g., files, data items, datasets, portions of datasets, transformations, and/or the like). The permissioning may include, for example, specific permissions for read/write/modify, and/or the like, which may be applicable to specific users, groups of users, roles, and/or the like.

Figure 4:
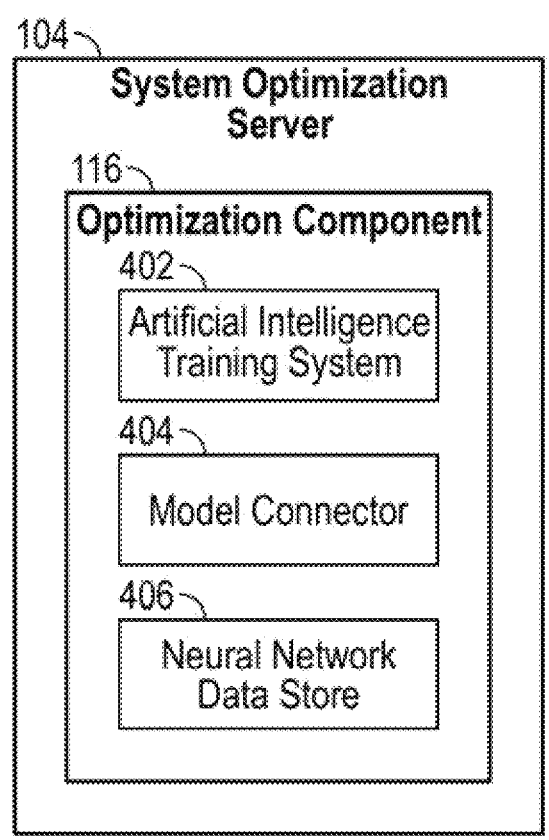
FIG. 4 shows a block diagram illustrating example optional aspects of the system optimization server, according to one or more embodiments.

FIG. 4 shows a block diagram illustrating example additional optional aspects of the system optimization server 104 related to simulations, according to one or more embodiments. The example simulation functionality of the system optimization server 104 can include additional components, which may optionally be aspects of the optimization component 116 (or in other implementations, may comprise separate components of the system optimization server 104), including an artificial intelligence training system 403, a model connector 404, and a neural network data store 406. In various implementations, these components, as with the other previously discussed components of the system optimization server 104, may be combined with and/or divided into other components to provide the functionality described herein. These components may each be implemented as executable code modules that are stored in the memory of, and executed by one or more processors of, the system optimization server 104. The artificial intelligence training system 402 and the model connector 404 may also be implemented partly or wholly in application-specific hardware.

The artificial intelligence training system 402 may execute one or more artificial intelligence algorithms to perform analysis on data items, such as parameter output nodes, parameter input nodes, and models. In some embodiments, the artificial intelligence training system 402 may execute artificial intelligence algorithms that may use machine learning such that the artificial intelligence training system 402 may iteratively learn from the data items (e.g., parameter output nodes, parameter input nodes, black box models (e.g., models in which the algorithm(s) function(s), propert(ies), value(s), etc. that are used to produce an output given an input may be unknown or inaccessible) and/or known models (e.g., models in which the algorithm(s) function(s), propert(ies), value(s), etc. that are used to produce an output given an input may be known, obtained, derived, or are otherwise accessible)) without being explicitly programmed. Thus, the system optimization server 104 may be configured to use machine learning techniques to perform an action and may learn how to perform the action without being explicitly programmed. Accordingly, the machine learning techniques may improve the functionality of the system optimization server 104 itself as the machine learning techniques allow the system optimization server 104 to learn, and thereby produce more accurate predictions of parameter output and input node linked relationships. This may further enable more accurate chaining of models, as the models may be chained by the links established from the parameter output and input node relationships, without being explicitly programmed.

In some embodiments, the artificial intelligence training system 402 may execute and/or train a recurrent neural network ("RNN"). The RNN may be a type of artificial neural network where connections are formed between nodes (e.g., parameter input nodes and parameter output nodes), constructing a digraph (e.g., a graph that is made up of a set of vertices connected by edges) in which the edges of the digraph may have an associated direction, along a time series. The RNN may chain a plurality of black box and/or known models by recurrently linking related parameter input nodes and parameter output nodes. Accordingly, the RNN may improve the functionality of the system optimization server 104 itself as the RNN may allow the system optimization server 104 to optimize the chaining of the plurality of black box and/or known models, and thereby produce more accurate model relationships, classifications, rankings, and health evaluations.

The model connector 404 may connect two or more models together via chaining, where the chaining occurs by linking predicted nodal relationships of parameter output nodes of one model with parameter input nodes of another model. In an embodiment, a link between a parameter output node of one model and parameter input node of another model may be established by the model connector 404 based on similar or matching parameter output nodes and parameter input nodes (e.g., the parameter output node of one model matches the parameter input node of another model), where the nodes may include model specific data comprised of subsystems, objects, and/or object properties (e.g., property types and/or property values). For example, the artificial intelligence training system 402 may use an RNN to accurately and recurrently classify the nodes by using the nodes as training examples. The nodes may then link and/or re-link based on which classified parameter input nodes and parameter output nodes are most similar. These are just some examples of the types of connections that may be represented by a link and other types of connections may be represented; embodiments are not limited to any particular types of connections between nodes. Each node may have multiple links with another node to form a link set. For example, two "Person" objects representing a husband and a wife could be linked through a "Spouse Of" relationship, a matching "Address" object property, and one or more matching "Event" object properties (e.g., a wedding).

The artificial intelligence training system 402 may use the error detection data as training examples. The artificial intelligence training system 402 may establish a set of learned relationship data that mathematically describes the physical relationships between the inputs and outputs of one or more logical computations, physical sensors, and/or measuring devices 114 and/or one or more technical real-world subsystems 112 that comprise the one or more technical real-world systems 102. The learned relationship data may be stored in the neural network data store 406. The model simulator 118 may transmit the various models and/or data from the time-series data store 121, neural network data store 406, and/or the simulated system data store 122 to the object simulator 120 to generate objects, and/or to the subsystem simulator 119 to generate subsystems, as described above.

V. Exemplary Model Chaining Process Overview

Figure 5:
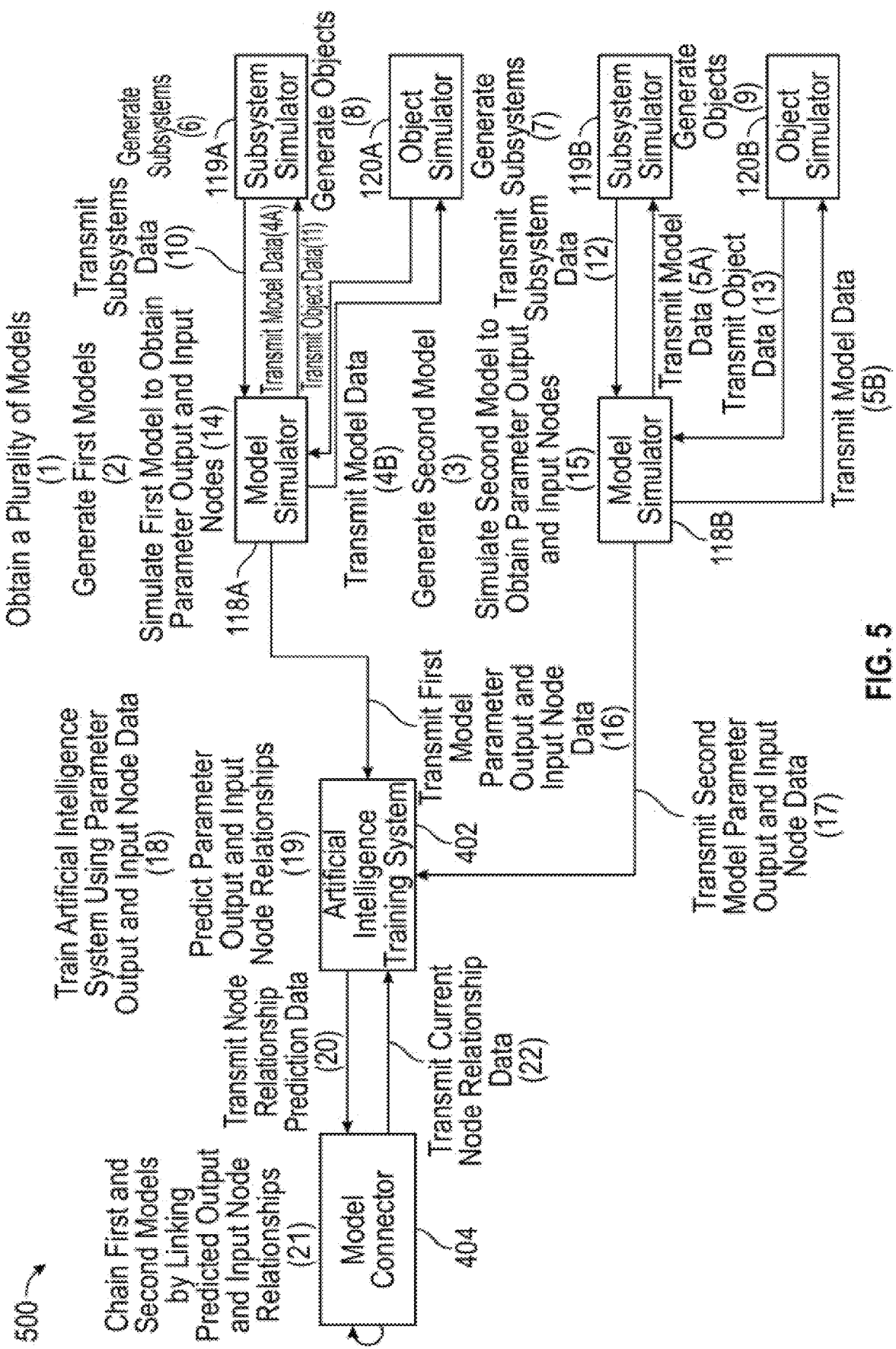
FIG. 5 is a state diagram illustrating example states for determining and chaining relationships between models, according to one or more embodiments.

FIG. 5 is an example state diagram 500 of the system which illustrates the states for determining relationships between one or more outputs of a first model and one or more inputs of a second model that collectively represent a technical real-world system, and chaining the models together. Embodiments of this example are not limited to determining relationships and chaining only two models. For example, this example state diagram 500 may include determining relationships and chaining more than two models. Only two models are show in example state diagram 500 for exemplary purposes and ease of understanding.

The initial three operations are directed to obtaining and generating a plurality of models (e.g., obtaining and generating water treatment models). At (1), a plurality of models may be obtained by the model simulator 118A. At (2), the model simulator 118A may generate a first model from the plurality of models. The model simulator 118B may generate a second model from the plurality of models at (3).

The next operations involve generating model specific subsystems and objects in order to simulate the plurality of models (e.g., generating a water filtration subsystem and a virtual water level sensor object for the first water treatment model, and a water disinfection subsystem and a virtual pH level sensor object for the second water treatment model; or generating a raw materials production subsystem and a virtual materials generation sensor object for the first production model, and an assembly subsystem and a production line sensor object for the second production model). The model simulator 118A may transmit model data (e.g., learned relationship data, error detection data etc.) from the first model to the subsystem simulator 119A at (4A) and to the object simulator 120A at (4B). The model simulator 118B may then transmit model data (e.g., learned relationship data, error detection data etc.) from the second model to the subsystem simulator 119B at (5A) and to the object simulator 120B at (5B).

At (6), the subsystem simulator 119A may generate technical subsystems (e.g., virtual subsystems) based on the data from the first model. At (7), the subsystem simulator 119B may generate subsystems (e.g., virtual subsystems) based on the data from the second model. At (8), the object simulator 120A may generate objects (e.g., virtual sensors, virtual measuring devices, etc.) based on the data from the first model. At (9), the object simulator 120B may generate objects (e.g., virtual sensors, virtual measuring devices, etc.) based on the data from the second model.

The subsystem simulator 119A may transmit the generated subsystem data based on the first model to the model simulator 118A at (10). At (11), the object simulator 120A may transmit the generated object data based on the first model to the model simulator 118A. Similarly, the subsystem simulator 119B may transmit the generated subsystem data based on the second model to the model simulator 118B at (12), and the object simulator 120B may transmit the generated object data based on the second model to the model simulator 118B at (13). In some embodiments, one or more models may not include subsystem specific data, and therefore operations (4A), (5A), (6), (7), (10), and/or (12) may be omitted. In some embodiments, one or more models may not include object specific data, and therefore operations (4B), (5B), (8), (9), (11), and/or (13) may be omitted.

Once the generated object data is transmitted, the model simulator 118 may simulate the plurality of models to obtain parameter output and input nodes based on the model specific generated subsystems and objects. For example, a parameter output node of the first water treatment model may be an output water level of the virtual water level sensor object, and a parameter input node of the second water treatment model may be an input water composition of the virtual pH level sensor object. Furthermore, the parameter output and input nodes may include error detection data, learned relationship data, etc. (e.g., the output water level of the virtual water level sensor object may include historical data parameters, max output water level parameters, minimum water level parameters, connection parameters etc. of the water level sensor object). At (14), the model simulator 118A simulates the first model to obtain parameter output and input nodes. At (15), the model simulator 118B simulates the second model to obtain parameter output and input nodes. The model simulator 118A can then transmit the first model parameter output and input nodes to the artificial intelligence training system 402 at (16), and the model simulator 118B can transmit the second model parameter output and input nodes to the artificial intelligence training system 402 at (17).

Figure 6:
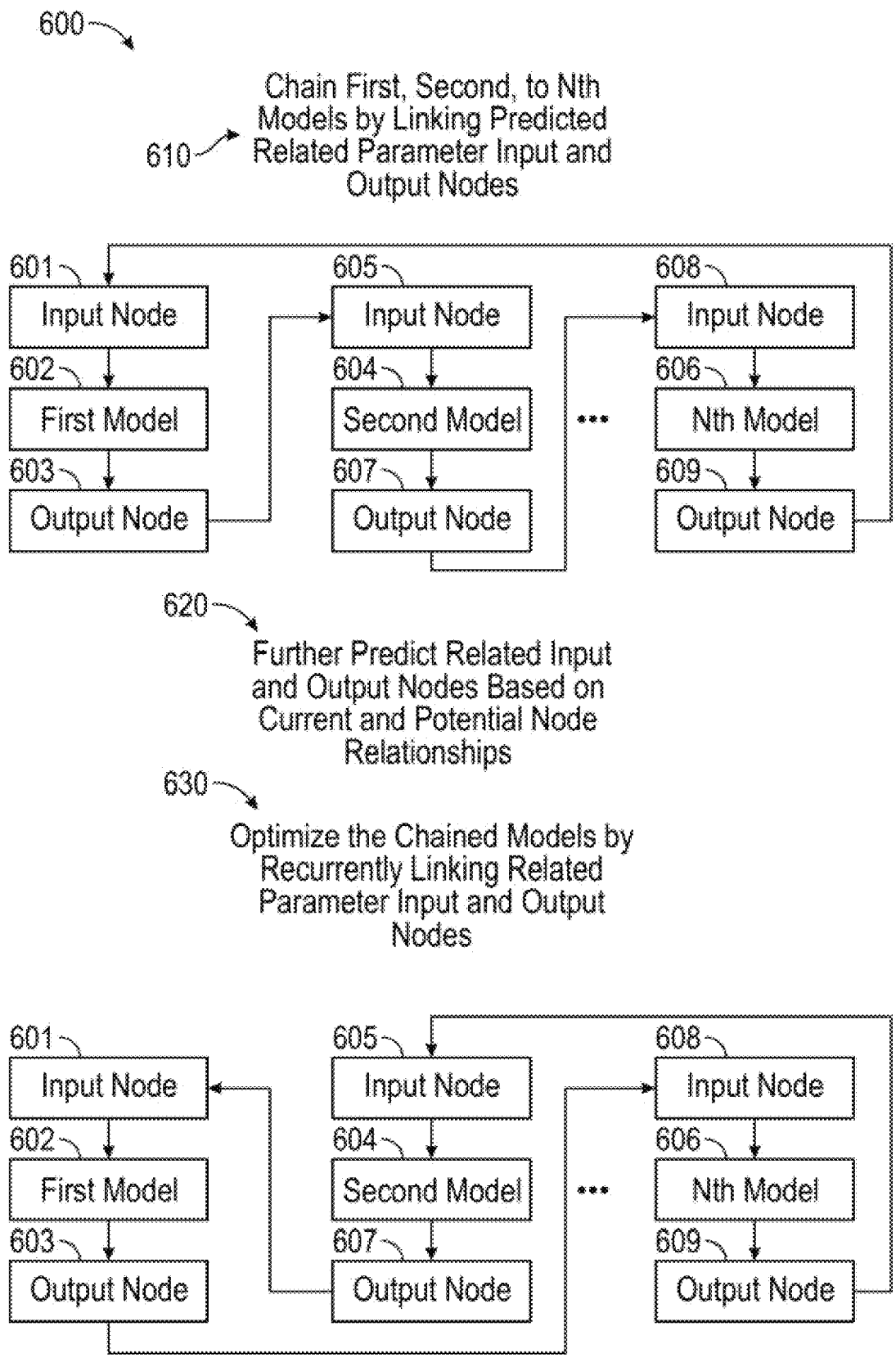
FIG. 6 is another state diagram illustrating the states for chaining a plurality of models together, according to one or more embodiments.
Figure 7:
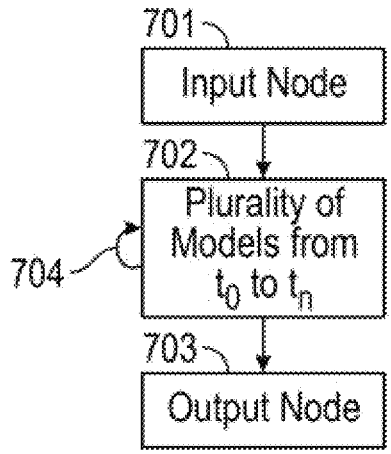
FIG. 7 is another state diagram illustrating the states for training an artificial intelligence training system, according to one or more embodiments.
Figure 7:
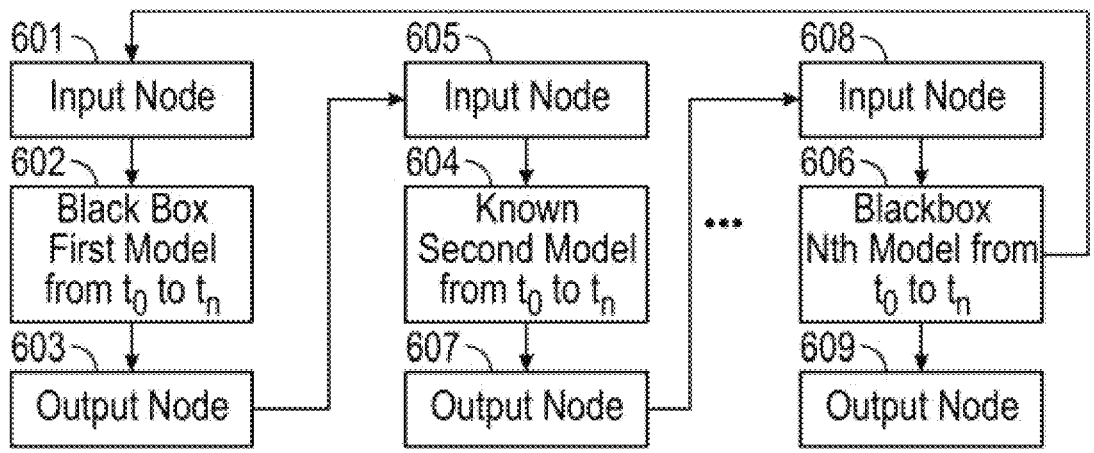

The remaining operations are directed to the parameter input and output node relationships and the chaining of the plurality of models, which are further discussed in FIGS. 6 and 7. For example, the artificial intelligence training system 402 can train an artificial intelligence system using the parameter input and output nodes of the plurality of models, where the artificial intelligence system may be a neural network like an RNN. At (19), the artificial intelligence training system 402 may predict nodal relationships between parameter output and input nodes based on the classifications made by the artificial intelligence training system 402. The artificial intelligence training system 402 can then transmit the predicted nodal relationship data to the model connector 404 at (20).

At (21), the model connector 404 chains the first and second models by linking and/or re-linking the predicted output and input node relationships. The model connector 404 then transmits the current node relationship data to the artificial intelligence training system 402 at (22) to further predict new node relationships based on the current relationships.

The artificial intelligence training system 402 and/or the model connector 404 may recurrently repeat operations (18) through (22) for individual time instants during a period of time, such as for individual time instants in a time-series. New parameter output and input nodes may be transmitted by the artificial intelligence training system 402 and/or model connector 404 with additional generation of new models during each repetition of operations (18) through (22) and/or with additional generation of new subsystems and/or new objects of the existing models during each repetition of operations (18) through (22).

FIG. 6 is another state diagram 600 illustrating the states for chaining a plurality of models together. Embodiments of this state diagram example 600 are not limited to determining relationships and linking only one parameter input node and one parameter output node per model. For example, this example may be used to determine relationships and link a plurality of parameter input nodes and parameter output nodes per model. Only one parameter input node and one parameter output node per model is shown in example state diagram 500 for exemplary purposes and ease of understanding, but is not meant to be limiting.

At operation (610), the first model, second model, to an Nth model may be chained by the model connector 404 initially linking parameter output and input nodes based on the classifications and predicted relationships made by the artificial intelligence training system 402. In some embodiments, the model connector 404 and/or the artificial intelligence training system 402 may determine the initial linking between parameter output and input nodes by an ontology that may classify parameter output and input nodes. In further embodiments, the model connector 404 and/or artificial intelligence training system 402 may also use an ontological layer with a predefined mapping to further determine initial output and input node relationships.

Referring back to the initial linking of operation (610) of the state diagram 600, the first model 602 may have a parameter input node 601 and a parameter output node 603. The parameter output node 603 of the first model 602 may initially link to the parameter input node 605 of the second model 604 based on a nodal relationship that may be determined by the artificial intelligence training system 402 and/or the ontological layer. The parameter output node 607 of the second model 604 may initially link to the parameter input node 608 of the Nth model 606 based on a nodal relationship that may be determined by the artificial intelligence training system 402 and/or the ontological layer. The parameter output node 609 of the Nth model 606 may initially link to the parameter input node 601 of the first model 602 based on a nodal relationship that may be determined by the artificial intelligence training system 402 and/or the ontological layer.

Moving to operation (620), after the initial linking of the nodes, the artificial intelligence training system 402 may use the current parameter output and input nodes and/or nodal relationships to additionally train the artificial intelligence system to further predict new potential nodal relationships. In some embodiments, new parameter output and input nodes of the existing models (e.g., first model, second model to Nth model) may be simulated by the model simulator 118 during operation (620) if new subsystems and/or objects are generated by the subsystem simulator 119 and/or object simulator 120. Thus, the artificial intelligence training system 402 can additionally train the artificial intelligence system to further predict new potential nodal relationships. For example, a new virtual water flow rate sensor may be generated by the object simulator 120 after the initial linking has occurred. Thus, there may be a new parameter output or input node for the existing water treatment model that may then be used by the artificial intelligence training system 402 to further predict new potential nodal relationships.

In some embodiments, new parameter output and input nodes may be simulated by the model simulator 118 during operation (620) if new models are generated and/or simulated from the obtained plurality of models. The new parameter output and input nodes may further include new subsystems and/or objects generated by the subsystem simulator 119 and/or object simulator 120. Thus, the artificial intelligence training system 402 can additionally train the artificial intelligence system to further predict new potential nodal relationships. For example, a new wastewater facility model may be simulated that may include a new virtual treatment comminutor sensor, where the new virtual treatment comminutor sensor may be generated by the object simulator 120 after the initial linking has occurred. Thus, there may be a new parameter output or input node for the new wastewater facility model that may then be used by the artificial intelligence training system 402 to further predict new potential nodal relationships.

At operation (630), the model connector 404 may re-link the initially chained models by recurrently linking related parameter input and output nodes based on the current node relationships and predicted new potential nodal relationships of operation (620). This may be further illustrated in the example state diagram 600, where the model connector 404 may re-link the parameter output node 603 of the first model 602 to the parameter input node 608 of the Nth model 606 based on the predicted new nodal relationships and/or observed current nodal relationships that may be determined by the artificial intelligence training system 402 and/or the ontological layer. The model connector 404 may re-link the parameter output node 607 of the second model 604 to the parameter input node 601 of the first model 602 based on the predicted new nodal relationships and/or observed current nodal relationships that may be determined by the artificial intelligence training system 402 and/or the ontological layer. The model connector 404 may re-link the parameter output node 609 of the Nth model 606 to the parameter input node 605 of the second model 604 based on the predicted new nodal relationship and/or observed current nodal relationship that may be determined by the artificial intelligence training system 402 and/or the ontological layer. The use of the artificial intelligence training system 402 in FIG. 6, as well as model type chaining (e.g., whether the models are black box or known), may be further detailed in FIG. 7.

FIG. 7 is another state diagram illustrating the states for training the artificial intelligence training system 402 (e.g., a neural network, such as an RNN 705). In order to optimally chain the models together, each model's parameter input nodes and parameter output nodes may be classified by the artificial intelligence training system 402. For example, a RNN 705 may be used to accurately classify each node, which may use artificial intelligence algorithms such as backpropagation of error and gradient descent. Based on the classifications, predicted relationships between parameter input nodes and output nodes may be formed, which may be used to chain the models.

In an embodiment, a plurality of black box and/or known models may be optimally chained together through use of a backpropagation through time (BPTT) algorithm and a RNN 705. A RNN 705 (e.g., a neural network with one or more loops 704) may include the plurality of black box and/or known models 702 in which each model may further include parameter output nodes 703 and parameter input nodes 701. The BPTT may be applied by the artificial intelligence training system 402 to train the RNN 705. The training operations performed by the artificial intelligence training system 402 may include:

Operation (710): Determining the time steps (e.g., total time series from t0 to tn, where t0 is first time step of the time series) of the black box and/or known models with parameter input node and parameter output node pairs (e.g., links) in the RNN 705.

Operation (720): Unrolling the RNN 725 (e.g., unroll the one or more loops of the RNN 725) such that the RNN 725 may become a linear series chain (e.g., time series sequence) of black box (e.g., blocks 602 and 606), and/or known models (e.g., block 604), with parameter output node and parameter input node pairs (e.g., blocks 603 and 605, blocks 607 and 608, and blocks 609 and 601) that iterate out for N time step iterations (e.g., optimizing the converging series of the chain).

Operation (730): Applying backpropagation based on automatic differentiation (e.g., chain rule of differentiation) to calculate and accumulate the gradients of the error across each time step for the linear series chain.

The gradient at each time step for the RNN 705 or 725 may depend on the calculation of the current and previous time steps of each model. Further in the RNN 705 or 725, the parameter nodes may be shared by all time steps in the RNN 705 or 725. By unrolling the RNN 725 for each time step, the dependencies between the black box and/or known models objects and object parameters may be obtained. These dependencies may be further classified by the artificial intelligence training system 402 during the backpropagation training operation 730 so that the models may be re-chained based on the most similar classifiers (e.g., re-linking nodes based on which classified parameter input nodes and parameter output nodes are most similar (e.g., re-linking depicted in operation (630) of FIG. 6)). The model chaining may be optimized when the gradient converges so that as optimization occurs, the gradient is converging towards the optima.

Embodiments of this state diagram example 700 are not limited to determining relationships and linking only one parameter input node and one parameter output node per model. For example, this example may be used to determine relationships and link a plurality of parameter input nodes and parameter output nodes per model for a time series of t to $t_n$. Only one parameter input node and one parameter output node per model for a time series of $t_0$ to $t_n$ is shown in example state diagram 700 for exemplary purposes and ease of understanding, but this is not meant to be limiting.

In various implementations, the system can perform an optimization including many simulations evaluating tens, hundreds, or thousands (or more) of scenarios, with each scenario representing a different set of possible actions. For every scenario, a simulation can chain together several models and calculate metrics, as described above and herein, such as one or more key metrics that are being optimized. One output of the optimization engine may be a set of actions associated with the optimal scenario, which may be presented as a recommendation to the user. For example, the actions may include the same types of simulated changes that a user may manually simulate, and may be accepted by the user in a similar manner as other simulated changes. Additional details related to such scenarios and simulations are provided herein.

VI. Example Interactive Graphical User Interfaces and Functionality

FIGS. 8A-8O, 9A-9H, 10A-10B, 13A-13E, and 14A-14D illustrate example interactive graphical user interfaces of the system, according to various embodiments. The examples user interfaces are provided for illustrative purposes to show various functionalities of the system. In other implementations, the interactive graphical user interfaces may include more or fewer elements, may be arranged differently, and/or may be combined or divided. As mentioned above, the various example interactive graphical user interfaces may be implemented, for example, via the system optimization server 104 (including one or more components of the system optimization server 104, such as optimization component 116, user interface generator 117, model simulator 118, etc.) described above, and the various processes described throughout the present disclosure.

Herein are provided descriptions of example implementations, features, and advantages associated with various graph-based, map-based, alert-based, panel-based, and optimization interactive GUIs. While certain features and functionality may be described in reference to one or more, but not all, of the example GUIs in the interest of conciseness, it is to be understood that the various features and functionality may be implemented across some or all of the various example GUIs.

Advantageously, the GUIs of the system can provide visualizations of otherwise obscure relationships and patterns between different data objects, subsystems, and models. Further, data models may be constructed and used by different teams or organizations, use different objects and object properties, and contain known and/or black box components. Previously, though a user may have multiple data models to work with and analyze, visualizing and interacting with the data models that model or simulate the desired real-world system can be difficult. Absent the techniques, operations, and functionality disclosed herein, it may be impossible to identify and/or use relationships and patterns between different data objects, subsystems, and/or models given the size and diversity of the different types of models (e.g., black box models, known or transparent models (e.g., simulation engines), models with specific components (e.g., subsystems and data objects), etc.).

For illustrative purposes, the GUIs described herein correspond to physical systems. This is not meant to be limiting, however. For example, the content and/or features of the GUIs described herein may be provided and/or depicted in GUIs corresponding to logical systems as well.

a. Example Graph-Based GUIs and Functionality

Figure 8A:
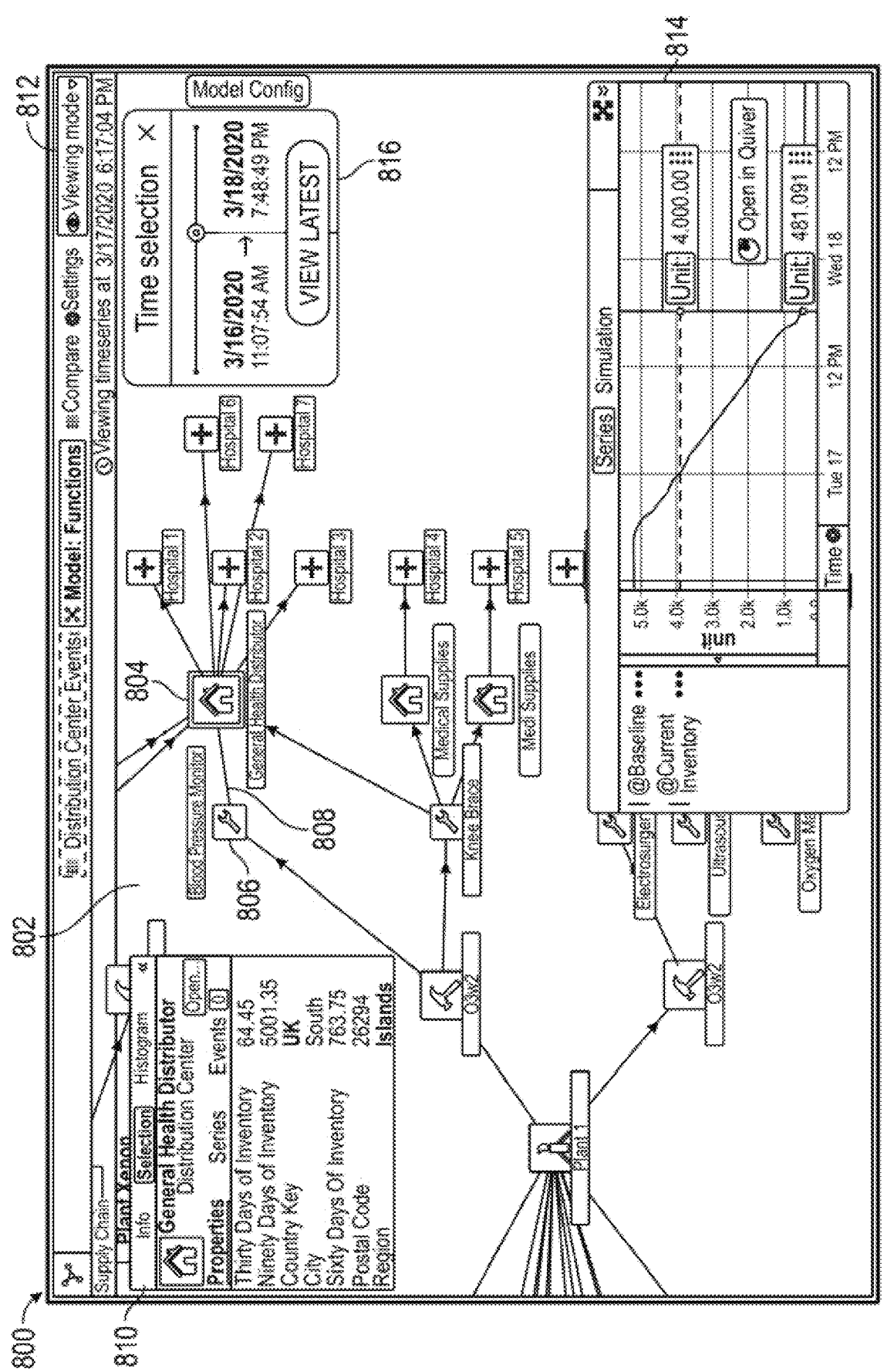
FIGS. 8A-8O illustrate example graph-based interactive graphical user interfaces, according to one or more embodiments.
Figure 8B:
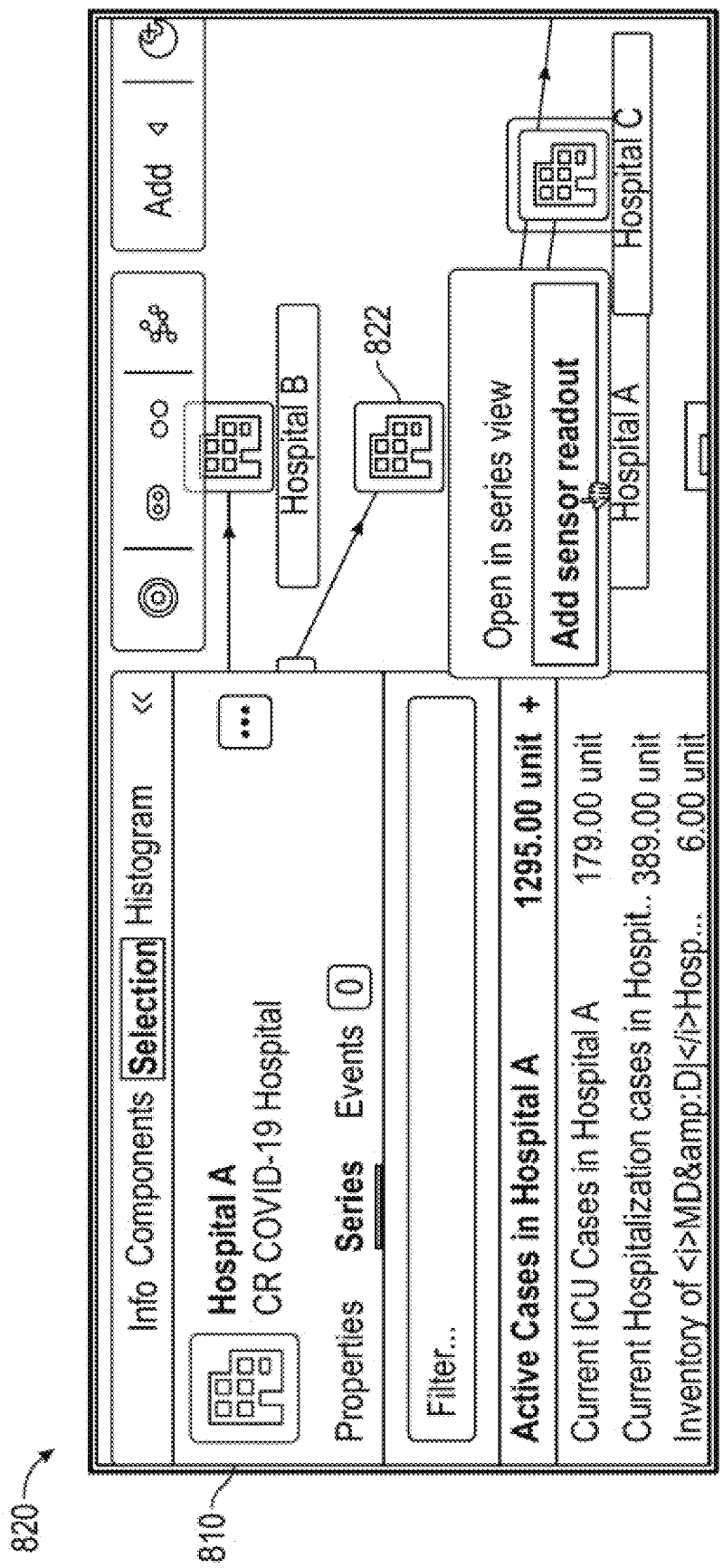
Figure 8C:
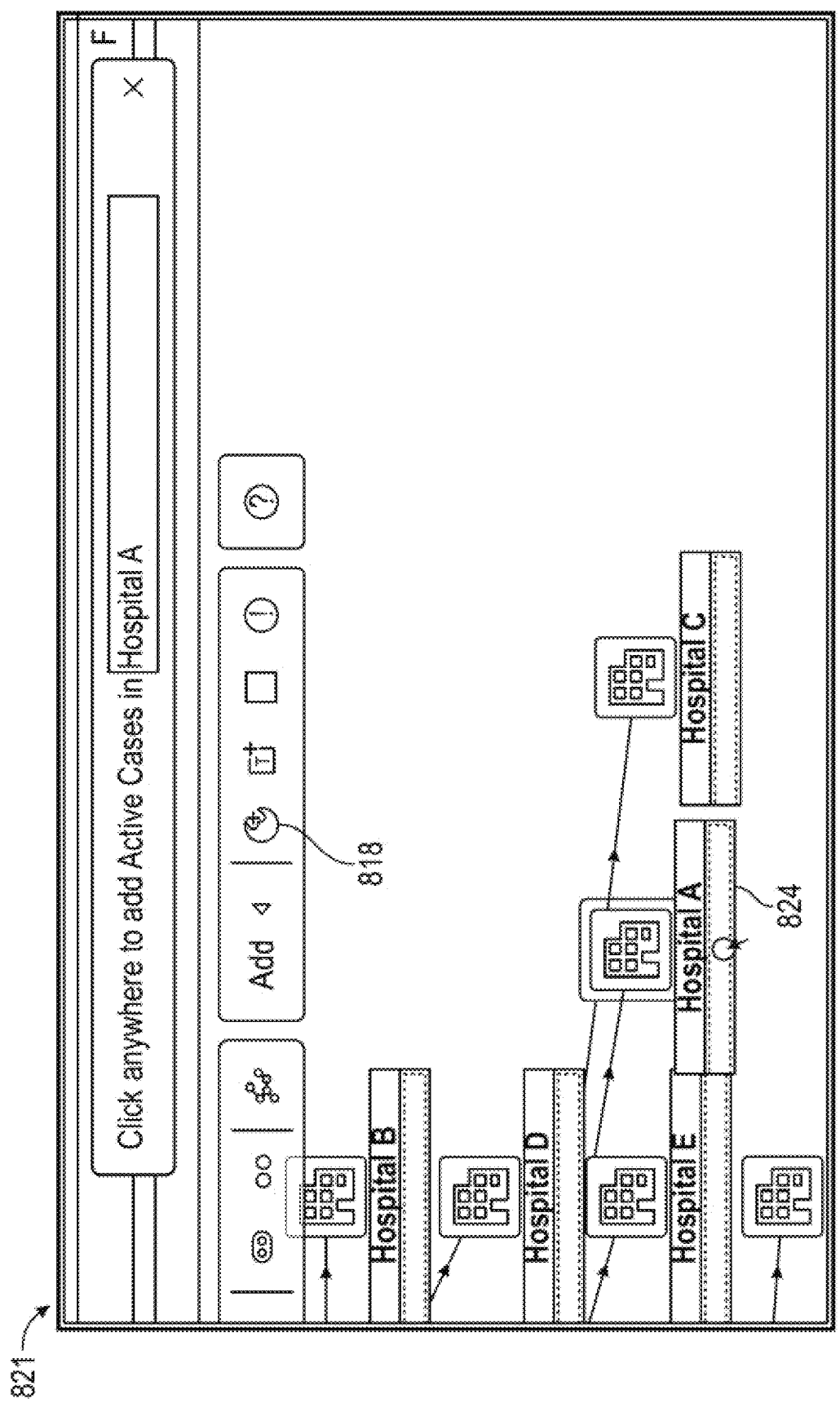
Figure 8D:
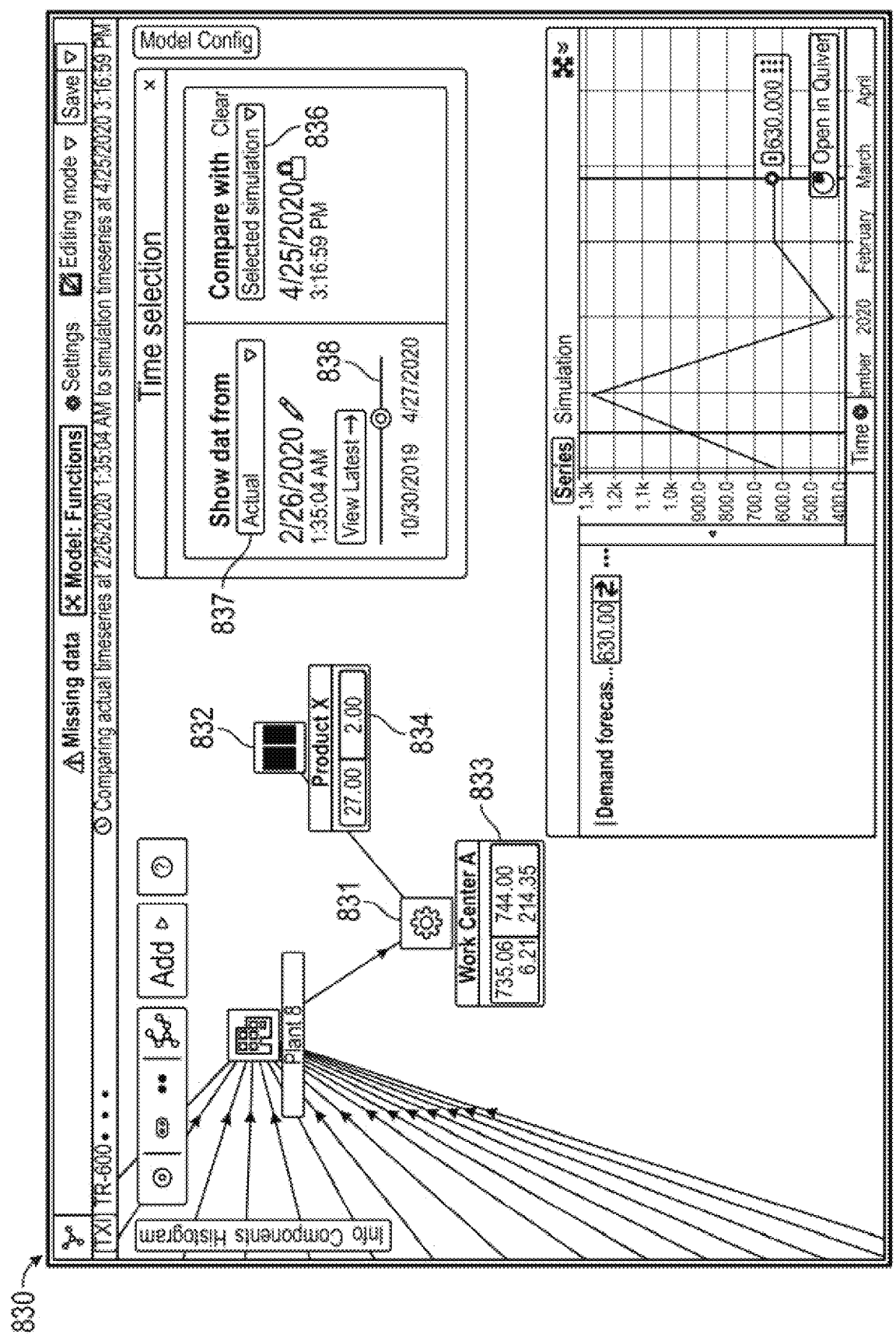
Figure 8E:
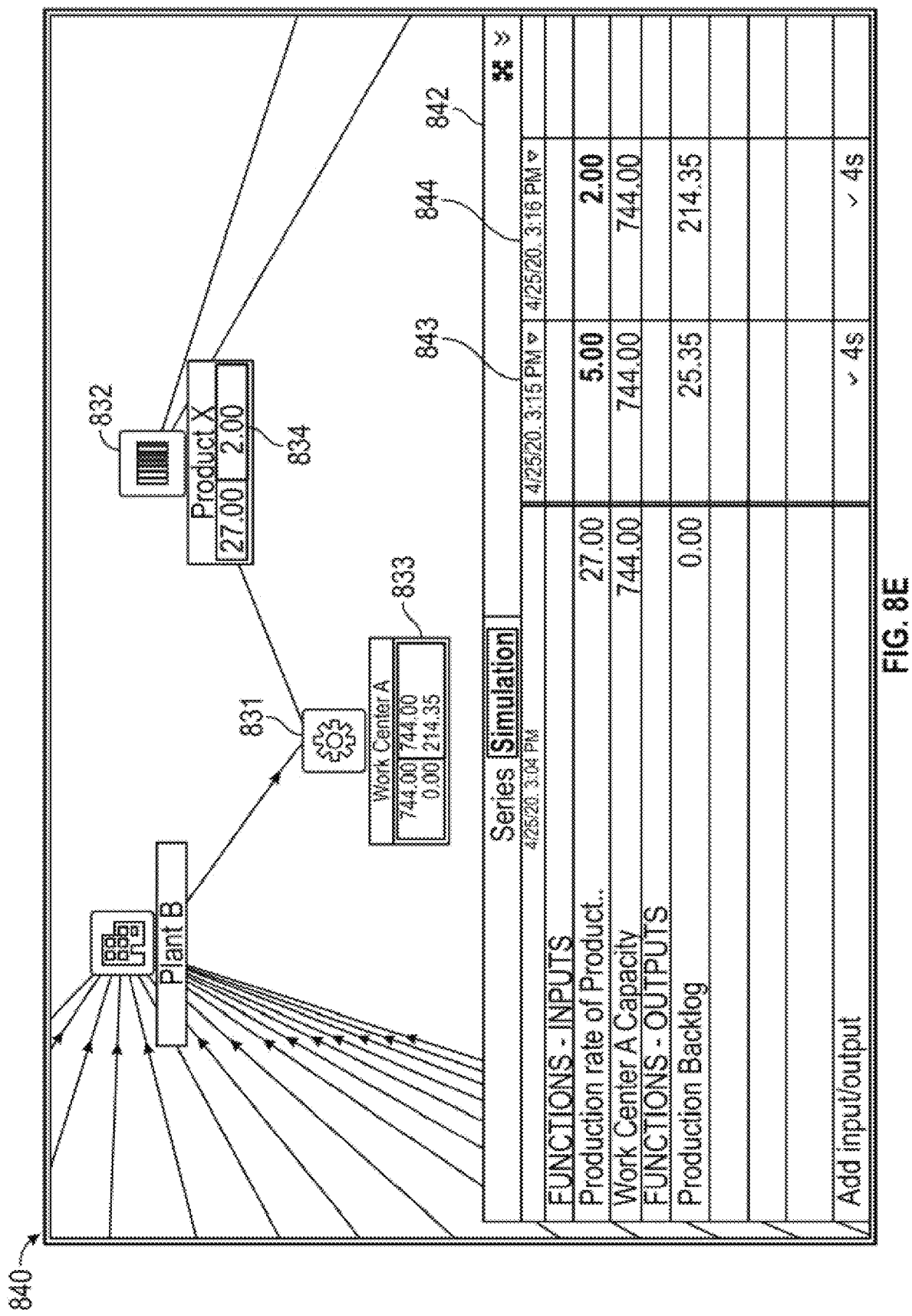
Figure 8F:
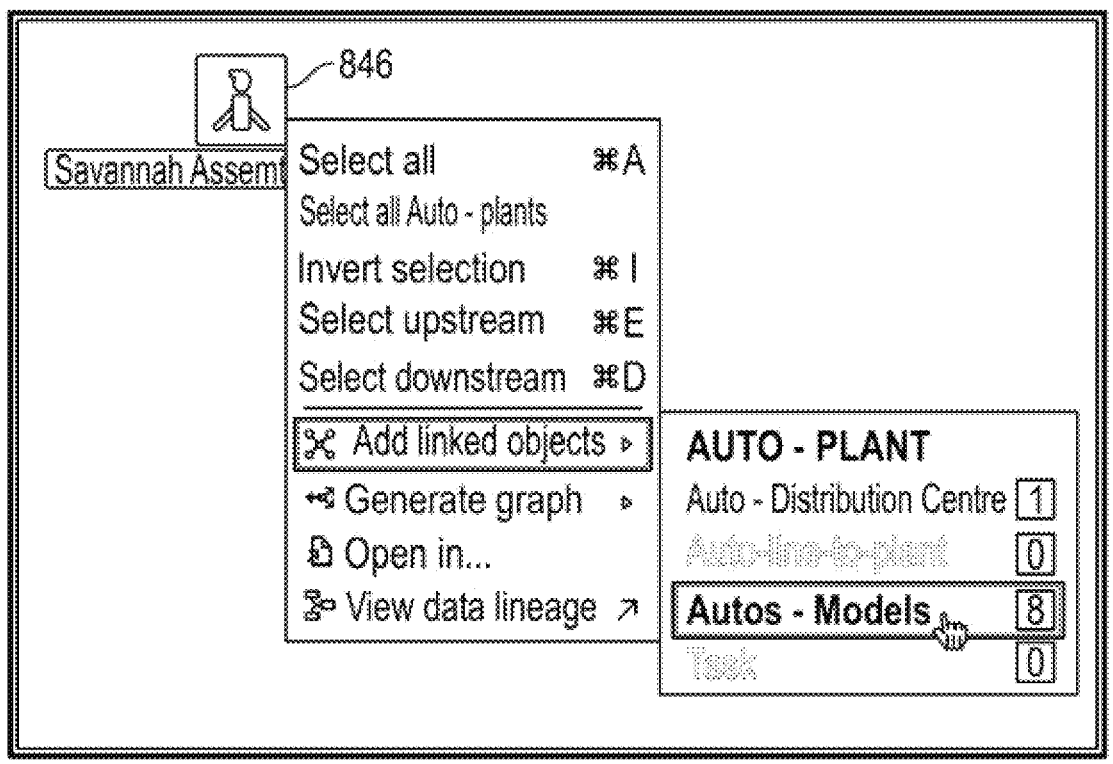
Figure 8G:
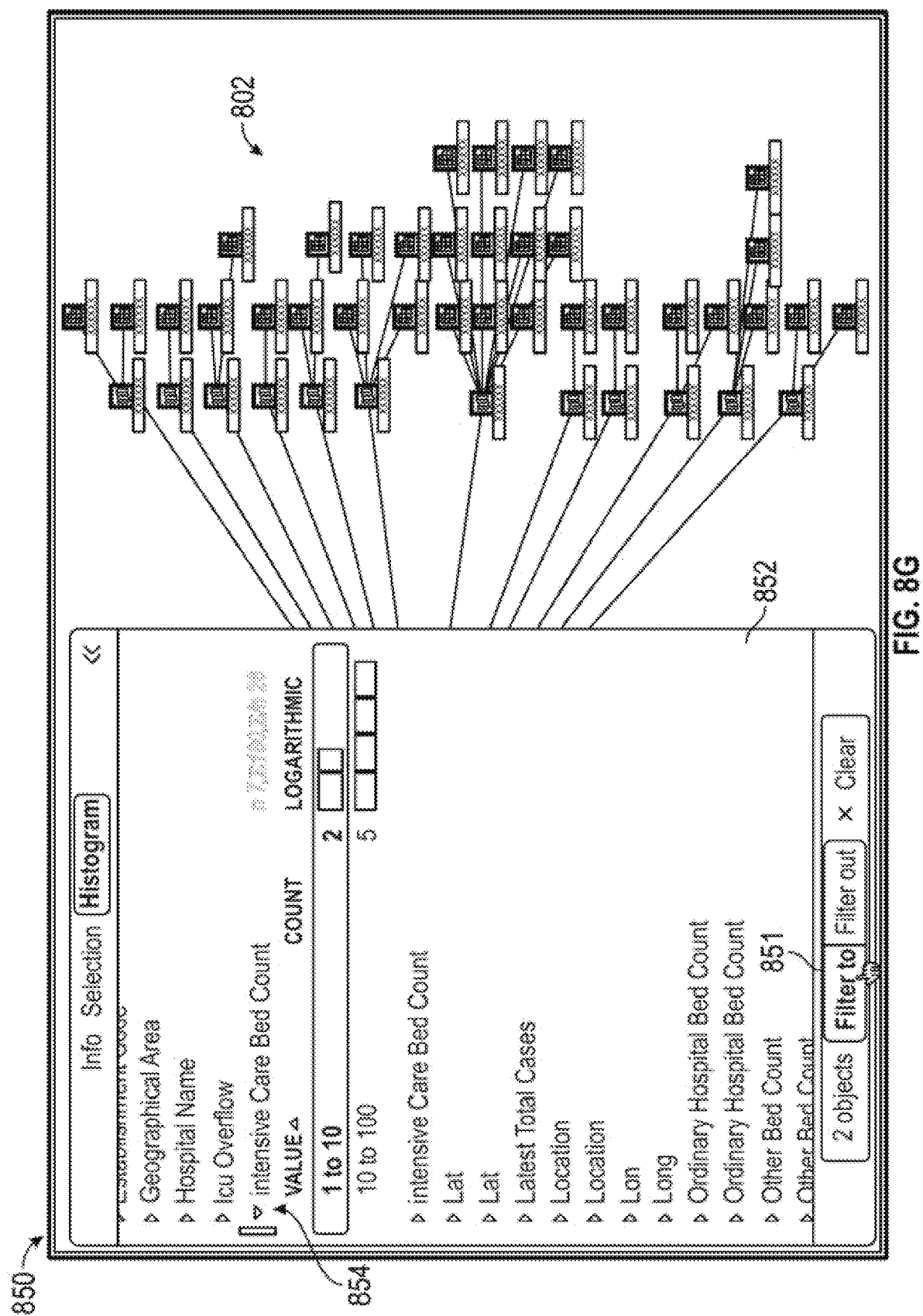
Figure 8H:
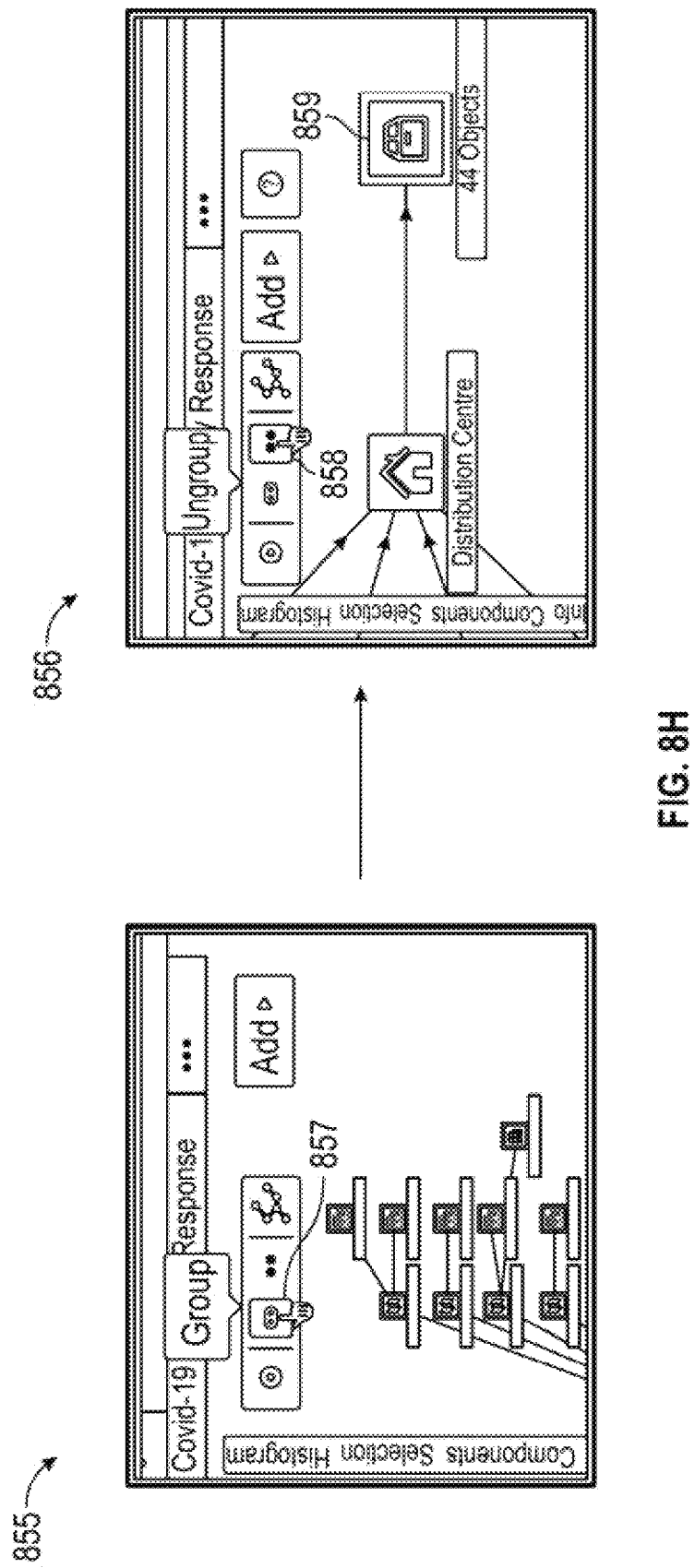
Figure 8I:
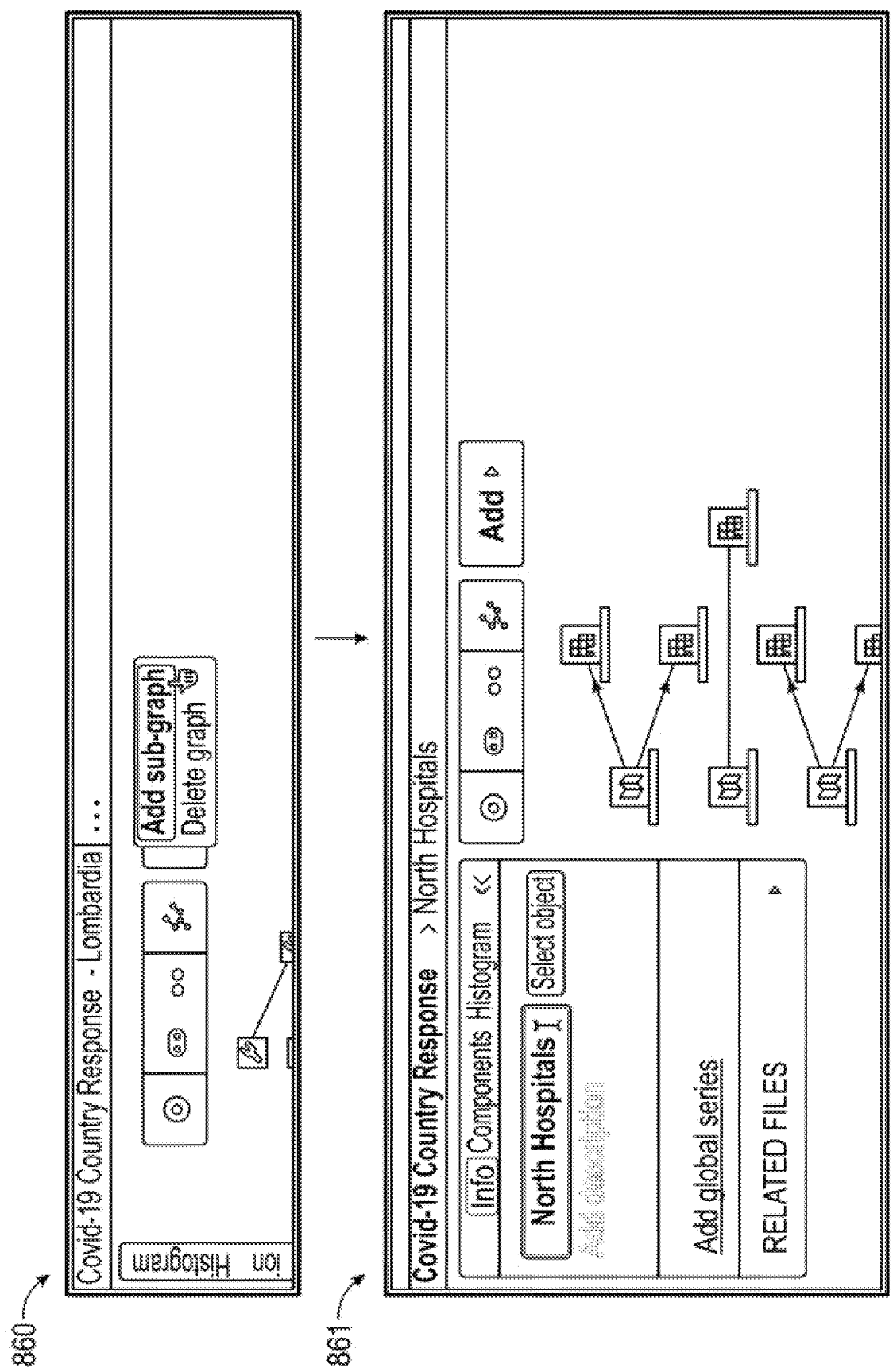
Figure 8J:
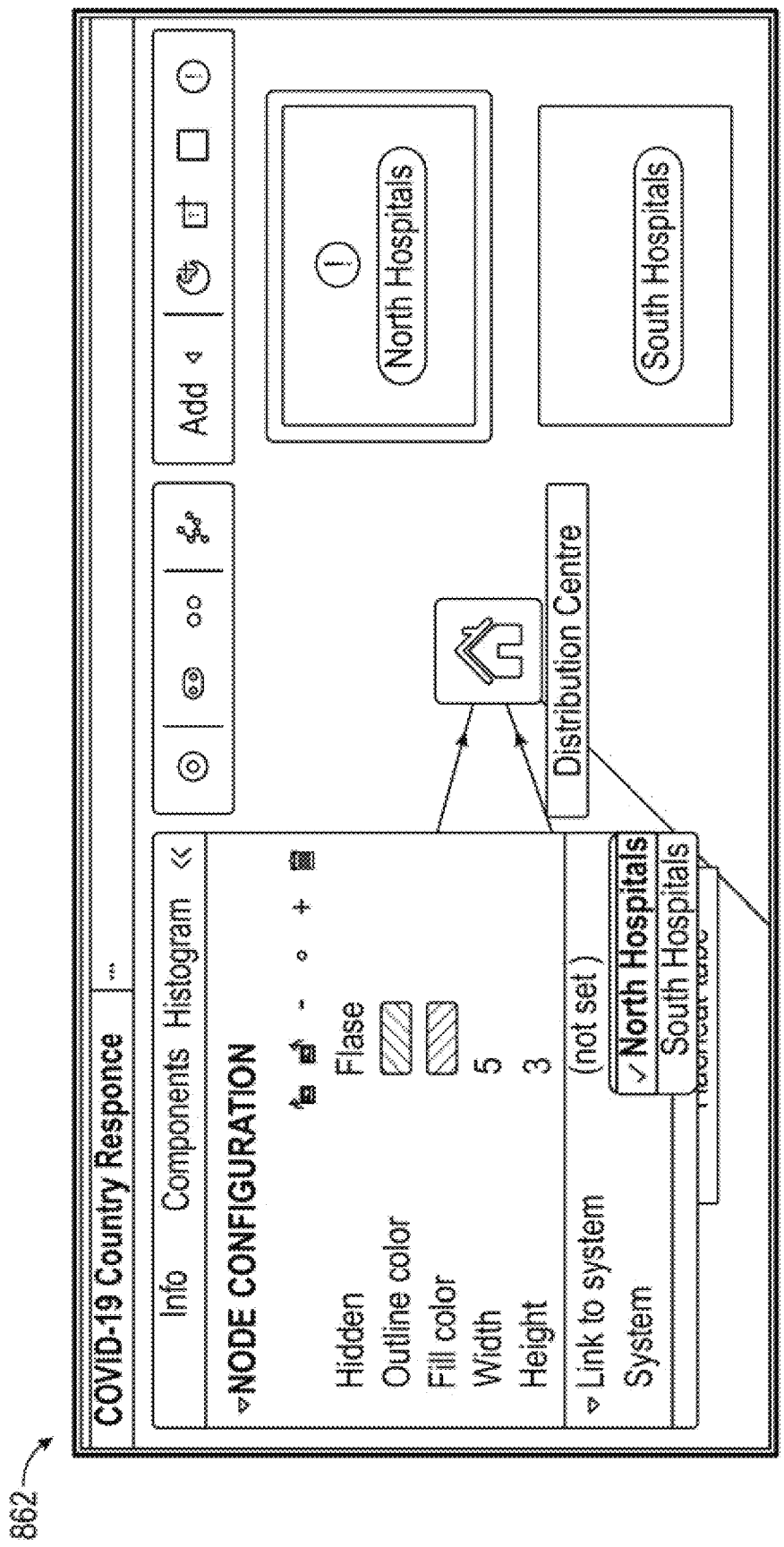
Figure 8K:
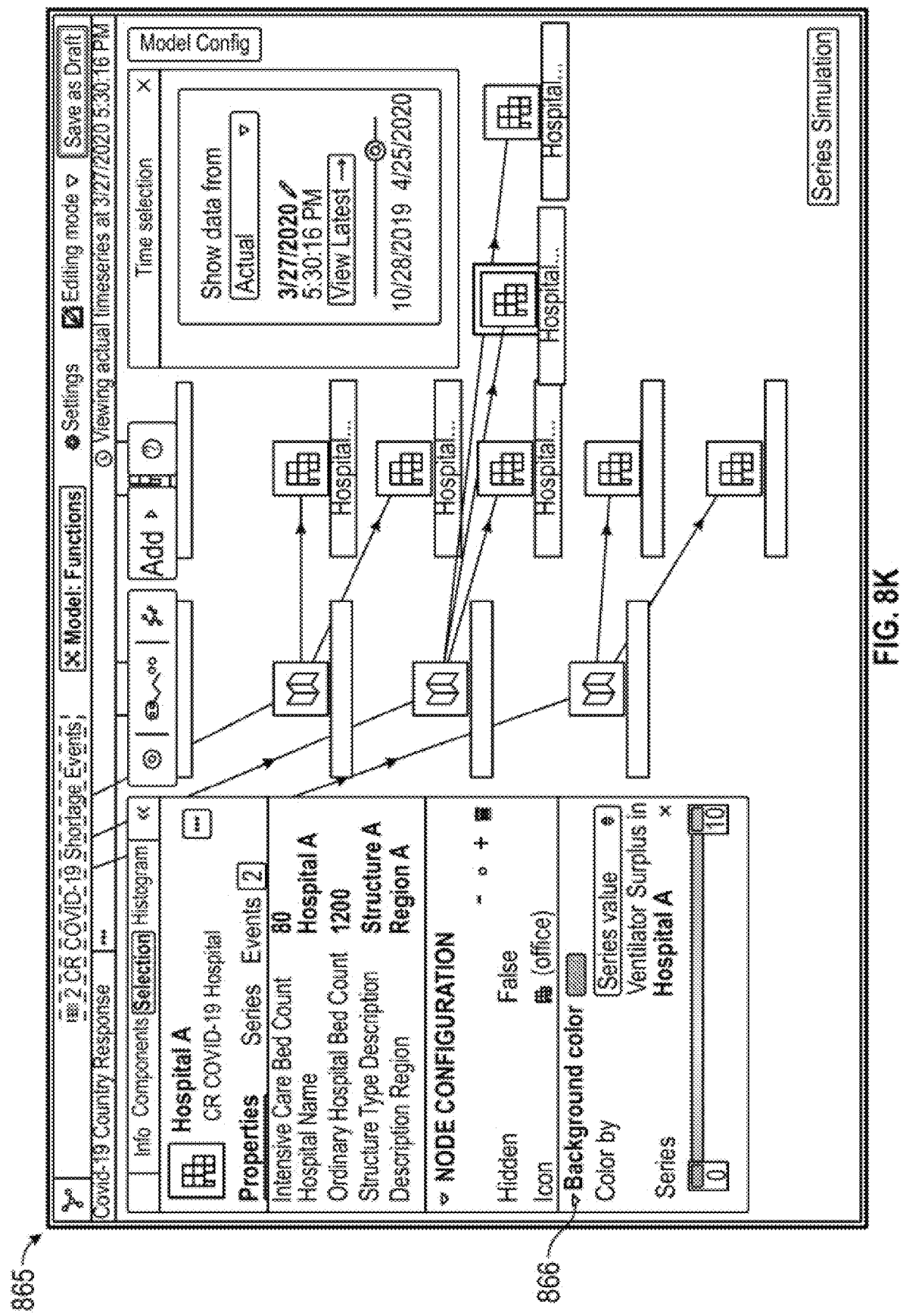
Figure 8L:
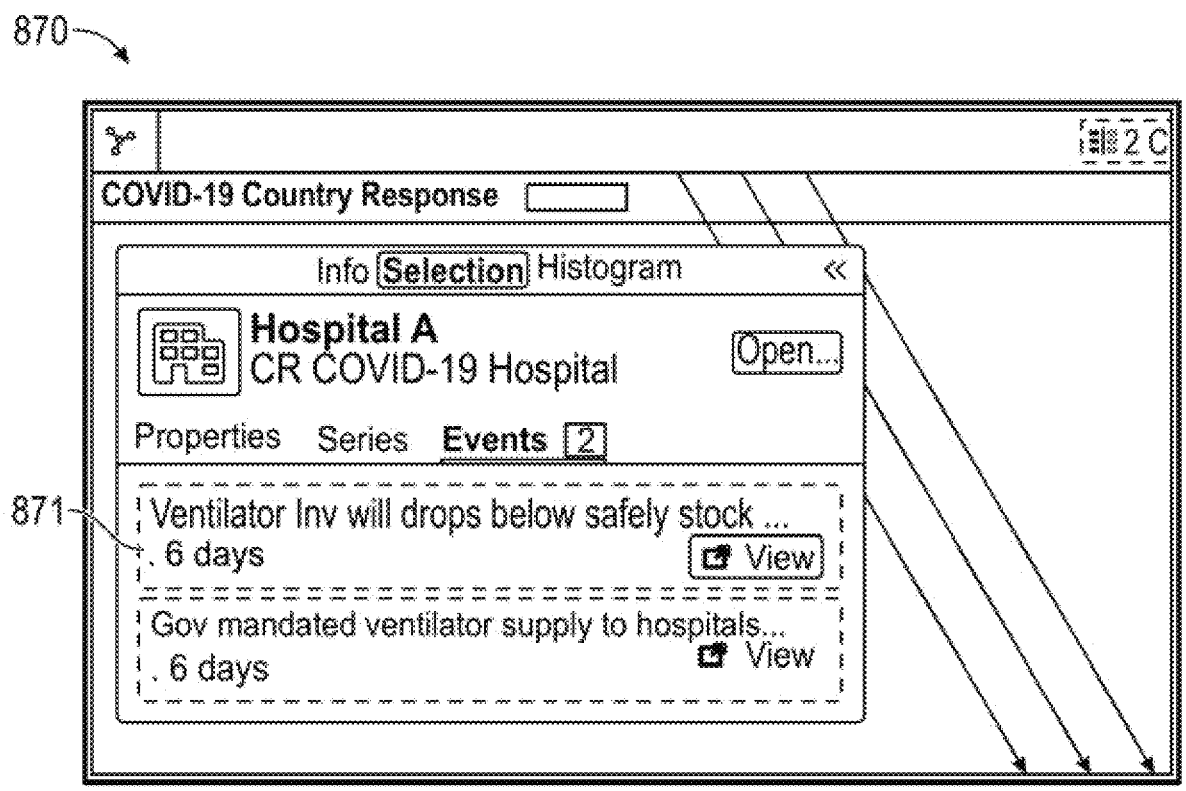
Figure 8M:
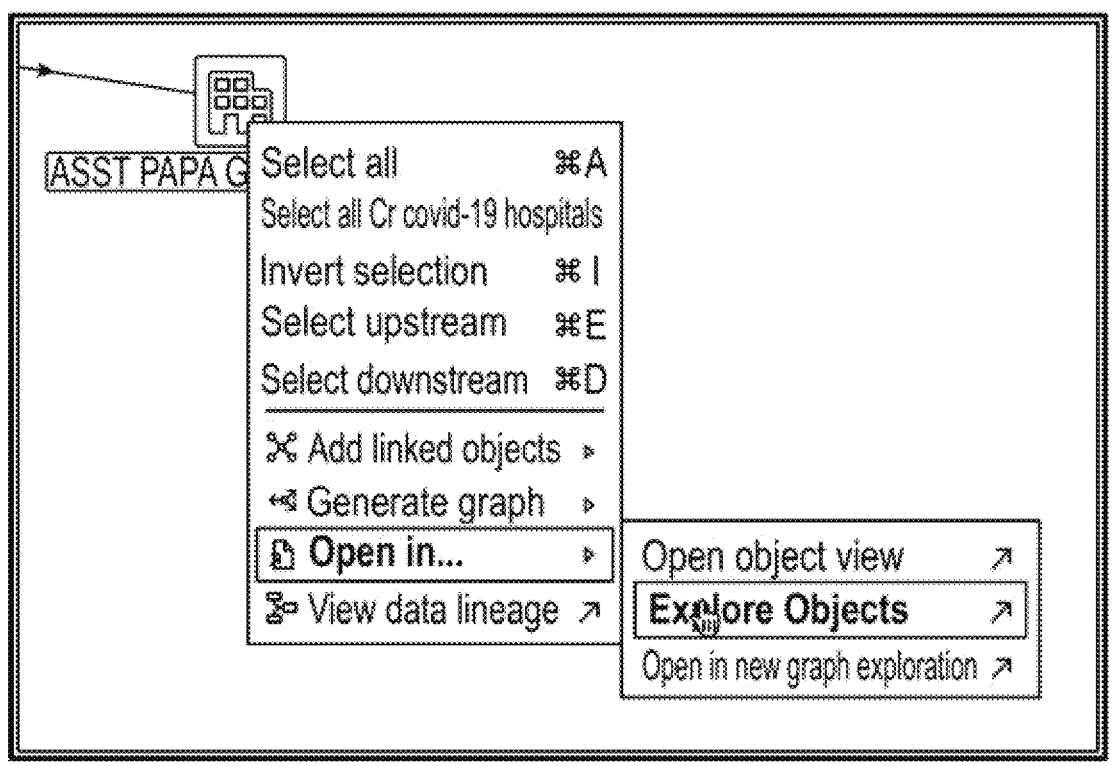
Figure 8N:
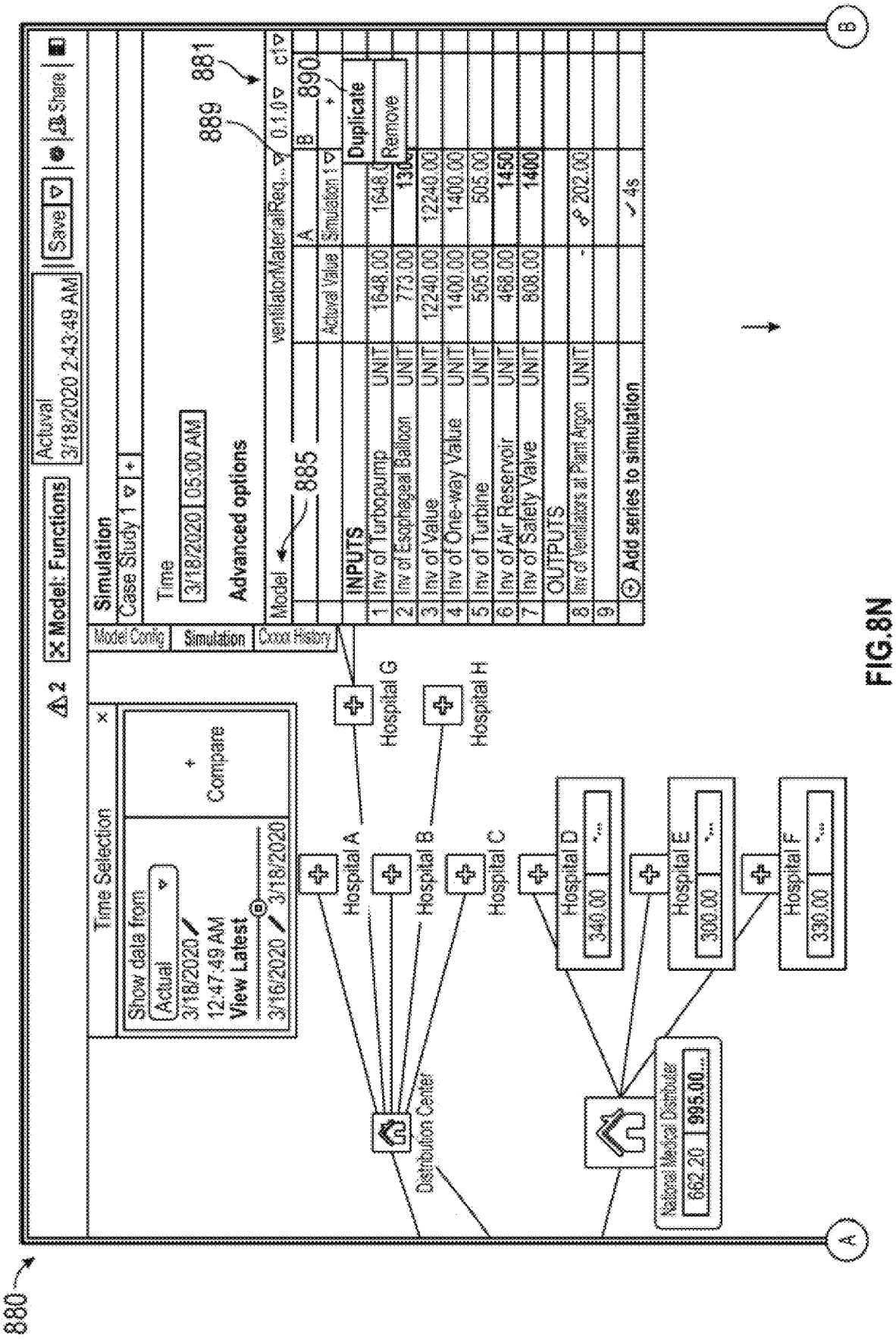
Figure 8N:
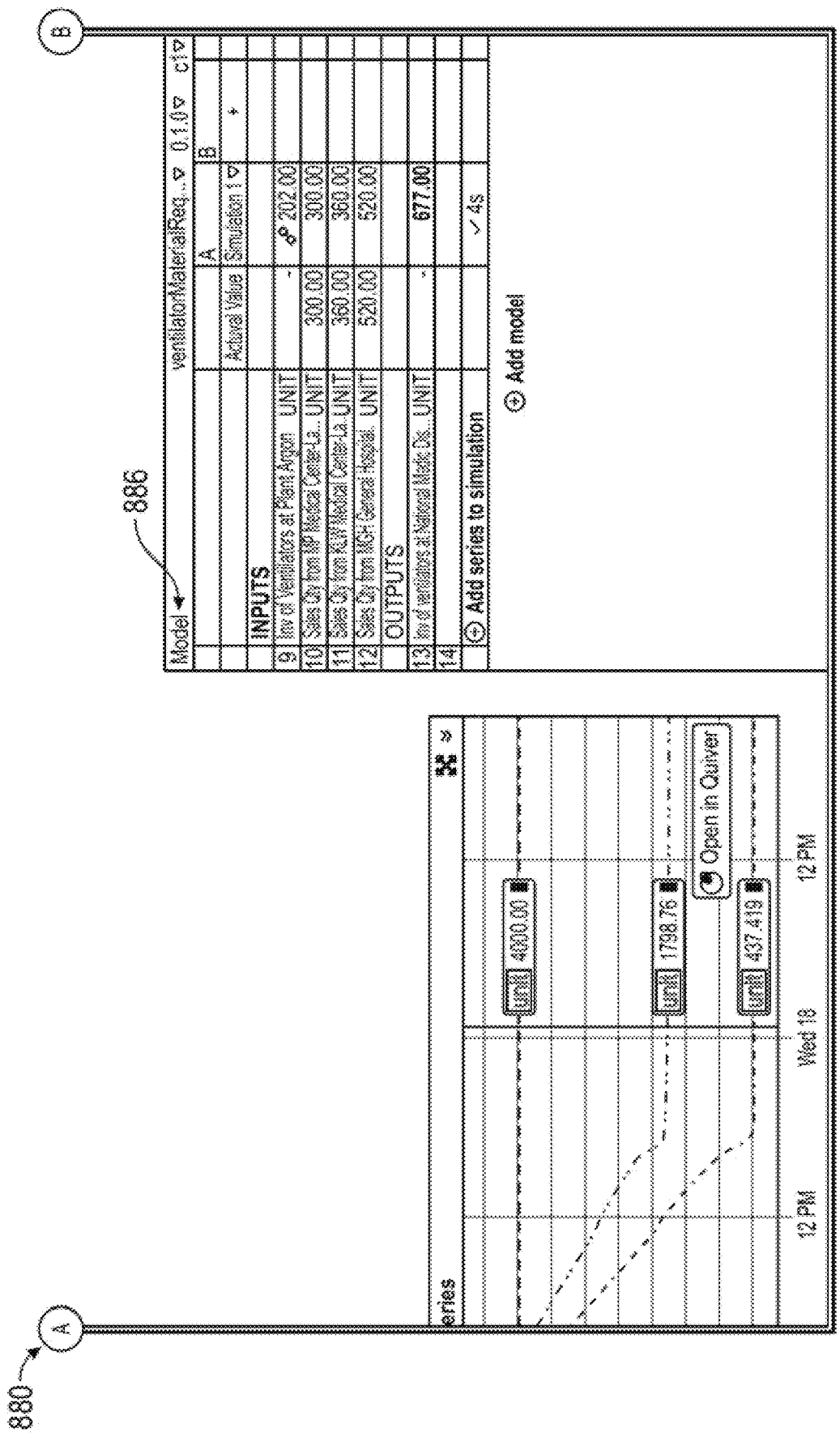
Figure 8O:
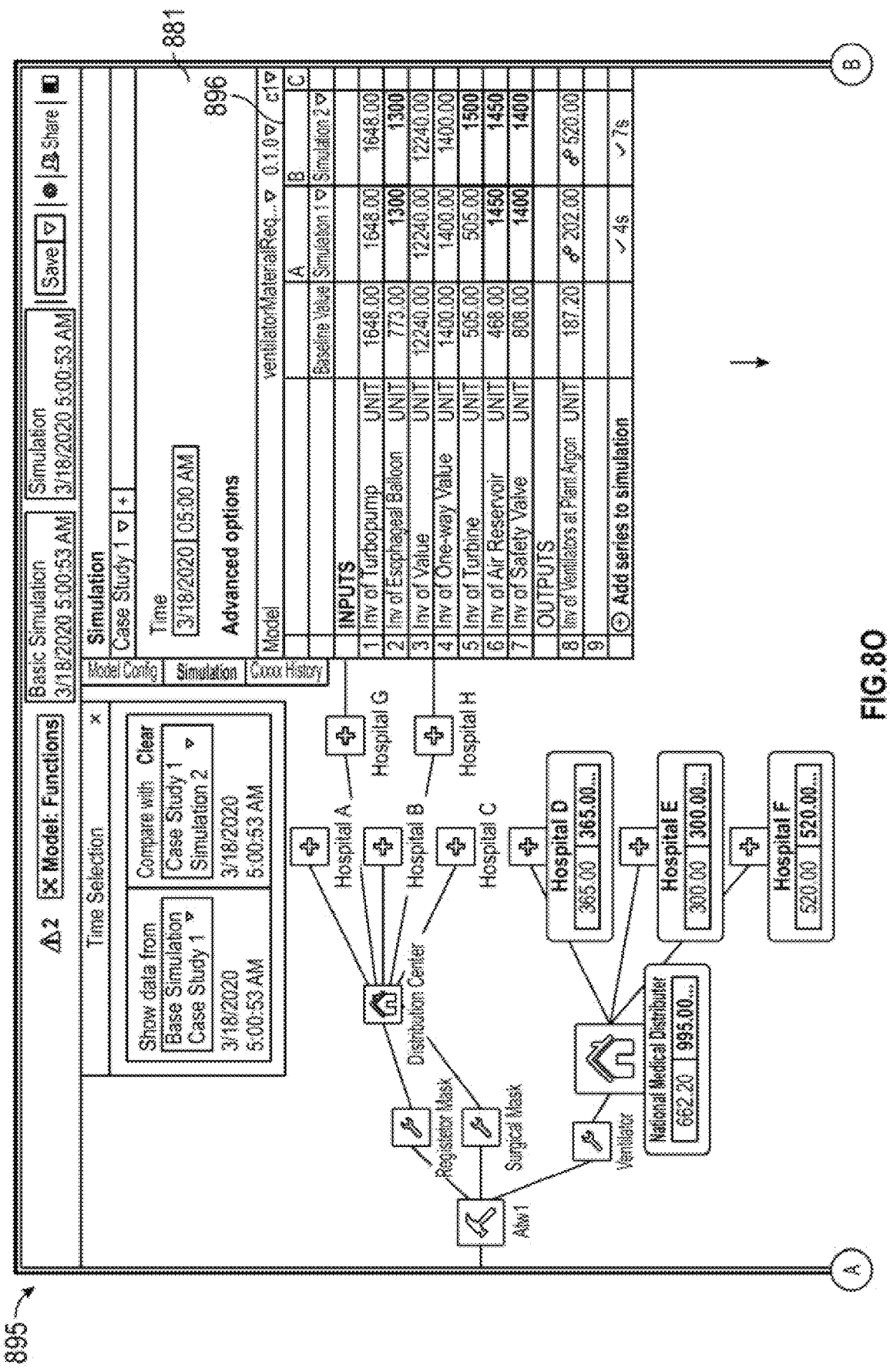
Figure 8O:
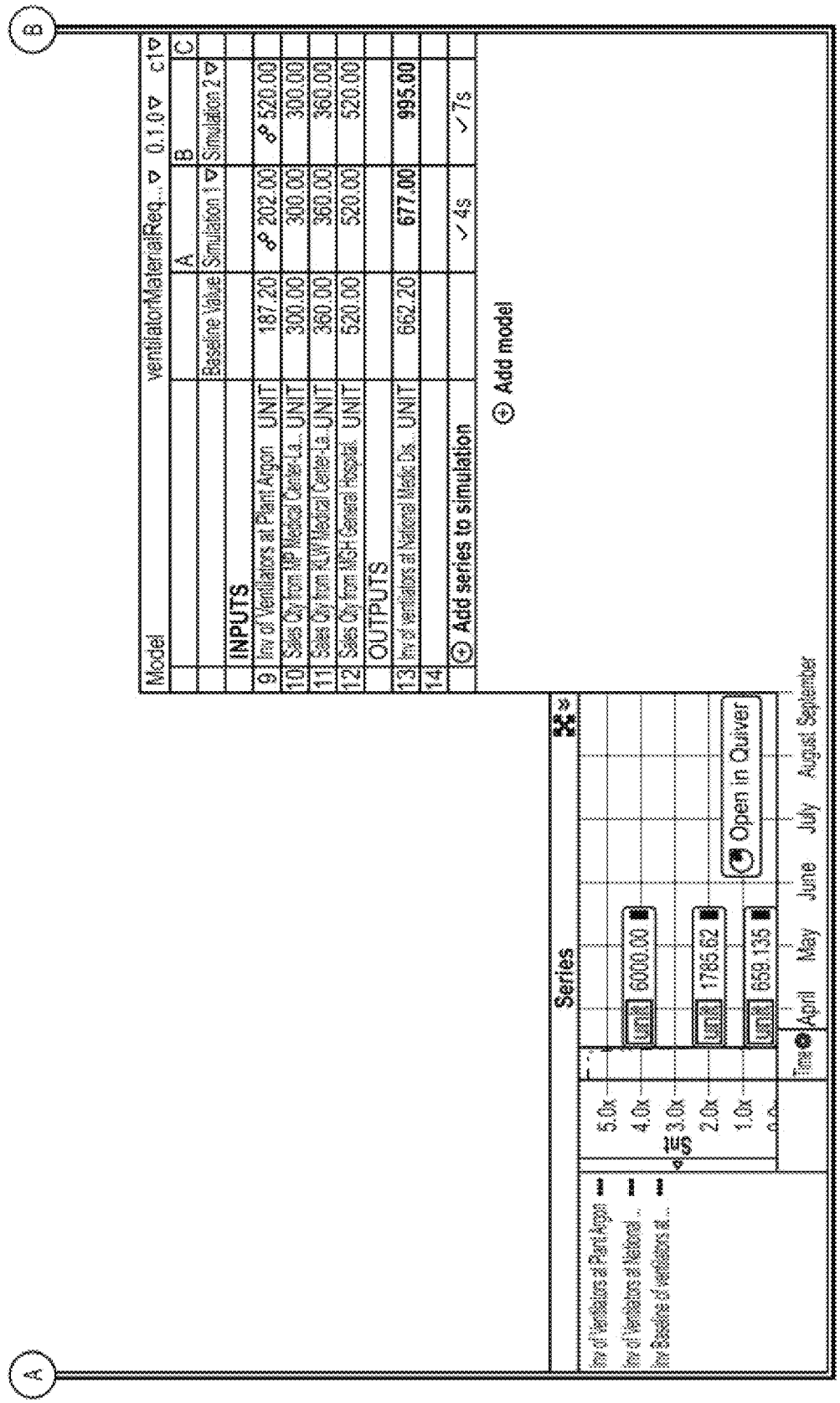

FIGS. 8A-8O illustrate various example implementations, features, and advantages associated with graph-based GUIs of the system, according to one or more embodiments. The graph-based GUIs of the system can, for example, enable exploring entities, events, and connections in a complex enterprise system; monitoring the current or historical state of any part of such a system; setting up visual warnings or actionable alerts to target risks and opportunities; and/or simulating scenarios to find the local decisions for the best global outcomes.

Referring to FIG. 8A, an example user interface 800 includes an interactive graph section 802 in which various systems, subsystems, and data objects can be represented by nodes or indicators, such as icons 804 and 806. For ease of description, the information shown in the GUIs of the present disclosure is generally referred to as objects, but as noted various systems and subsystems may similarly be represented. As described throughout the present disclosure, the systems, subsystems, and objects may represent various things, such as people, locations, facilities, and the like. Relationships among the various systems, subsystems, and objects are represented by edges, such as edge 808, which may optionally be directional (or bi-directional) to indicate, e.g., flows of information or items. In the example user interface 800, a supply chain is represented, including node representing parts and goods suppliers, manufacturing plants, distributors, consumers (e.g., hospitals), and the like. The graph section 802 is interactive, and a user may adjust the view of the objects via zooming in and out, or moving nodes around. The system may also automatically adjust the positioning of the nodes to provide an organized view and/or alignment of related objects. Additionally, the system allows the user to interact with (e.g., view, edit, move, add, delete, etc.) model specific subsystems, objects, object properties, error detection data, and/or events of the system. For example, the user may add additional related objects/nodes to the graph section 802 in various ways, including by searching the system for objects related to already displayed objects/nodes. FIG. 8C illustrates a toolbar by which the user may select to add objects to the graph via button 818.

The example user interface 800 provides a view of a simulated technical system representing a real-world system. The view may include various technical systems, subsystems, objects, and the like. Although not shown in the user interface, the system can associate various data, including time-based data, and models with the systems, subsystems, and objects, such that simulations can be run. The user interface, based on simulations, can provide a view of how the real-world system has performed in the past, is performing, and can be expected to perform in the future. As an example, by simulating movements of materials and goods, the system may determine a current inventory of goods, a bottleneck in production, an expected lack of supply or inventory to meet demand, and/or the like.

As noted, edges in the graph section 802 may represent relationships, such as inputs or outputs, or movements of information or items, between the model specific subsystems and/or objects of the system. An ontology may be created or updated by the model simulator 118 in various ways, including using manual and/or automatic processes as described herein. The model simulator 118 and/or the user interface generator 117 may further convert the ontology into a low-level (e.g., node list) representation. In some implementations, the user interface 800 may allow a user to create (e.g., instruct, via a user device 108, the model simulator 118 to create) and/or interact with the ontology, models, subsystems, and/or objects of the modeled system. For example, a user can interact with the objects of the modeled system by placing, dragging, linking, and/or deleting visual entities (e.g., graphical representations of the objects) via the user interface 800. Thus, the user interface 800 can depict model specific object properties, objects, subsystems, and/or links (e.g., relationships) between modeled system components. Relationships between data objects, subsystems, and/or models may be stored as links, or in some embodiments, as properties in the simulated system data store 122, where a relationship may be detected between the properties.

In various implementations, the nodes can be labeled and sized based on properties associated with the nodes. As described below, nodes can be colored according to data associated with the nodes. For example, time-based information/properties associated with the nodes can be used to color the nodes, enabling a user to quick grasp a status of the various nodes/objects represented by the graph.

The user interface 800 may include an information panel 810 comprising various properties and other information associated with a selected object (e.g., selected object 804). Via the information panel 810, a user may also, for example, view time-based data associated with objects.

The user interface 800 may include a mode toggle button 812, which allows a user to switch between an editing mode and a viewing mode. By toggling the mode toggle button 812 to the viewing mode, the user may view the information, graph, map, schematic, trend, simulation, time, equipment, and/or toolbar panels, and/or the like. While in view mode, the user may freely browse and explore the graph as saved, but cannot make changes. Whether or not the user has permissions to edit, the user many optionally duplicate the graph to create their own copy. By toggling the mode toggle button 812 to the editing mode, the user may edit the information, schematic, trend, simulation, time, equipment, toolbar, and/or mapping panels. In edit mode, the user is free to make any changes to contents of the graph, can save a copy for future reference, or even select a base object to publish as the canonical graph. In either mode the user can select nodes/objects via various methods, and can select multiple nodes/objects in the graph by holding the 'shift' key and/or making a box selection. Additional optional functionality of viewing and edit modes can include one or more of the following: clicking on the background will deselect all, clicking on a node or edge will select it, holding control or command while clicking will add to selection, holding shift while dragging will do a box selection, holding alt while clicking will only allow selection of edges, dragging anywhere will pan. Additional optional functionality of edit mode can include one or more of the following: dragging on a node will move all selected nodes (or the node in question if not already selected), dragging on an edge will move the edge, holding and dragging anywhere will pan.

The user interface 800 may further include a time-visualization panel 814, which allows a user to view the trends, simulations, mappings, and/or the like, and which may depict the results of the simulation of one or more models by the model simulator 118, the optimization component 116, and/or the like. For example, the time-visualization panel 814 may display an interactive line graph, simulation table, mapping chart, and/or the like that corresponds to the model specific technical subsystems, technical objects, technical object properties, error detection data, and/or events of the modeled technical system, as illustrated in the example user interface 800. In some embodiments, the time-visualization panel 814 may be a singular time-series visualization panel that display the results of the simulation of one or more models by the model simulator 118, the optimization component 116, and/or the like. The user may add additional time-series to, or remove time-series from, the visualization panel 814.

The user interface 800 may further include a time slider 816 that may include a time axis and which may be used to select a particular point in time, or scrub over a time span (e.g., seconds, minutes, hours, days, weeks, years, etc.). In various implementations the time slider 816 may include a user input element for selecting a specific point in time via inputs other than a slider. The time span represented by the time slider 816 may include both past and future times. User interactions with the time slider 816 may result in updates to information displayed in various other portions of the user interface 800. For example, time-based data and/or outputs of models associated with the various objects may be used to determine status of the various objects, which statuses may be depicted in the graph section 802 and/or information panel 810. Similarly, the time-visualization panel 814 may be a line graph composed of time-series data (e.g., historical measuring device data, live measuring device data, derived values, simulation results, etc.) stored in the time-series data store 121. Accordingly, as the user moves or slides the time slider 816 bi-directionally, the time indicator in the visualization panel 814 may move similarly to indicate a relevant portion or point in the time-series data shown in the visualization panel 814. In various implementations, the user can use the slider to scrub to various points in time, and the graph is updated in real-time as the user scrubs. The changes over time can be shown in an animated way. Optionally the user can press a play button to animatedly show changes over time. Similarly, an indicator in the time-series data chart indicates the currently selected date/time and associated time-series data values.

Based on the time selected (e.g., via the time slider 816), objects in the graph section 802 may be colored and/or highlighted based on a status of those objects, where the status may be determined based on time-based data, models, and/or simulations. For example, a color of node 804 may be green at one point in time, indicating a sufficient supply of goods, but it may be red at another time indicating a lack of inventory. Such statuses may be predictive based on other objects and their associated models. For example, if a supplier is modeled as having a reduced supply in the future, the manufacturer may model a reduced output, and a supplier may model a shortage of inventory, assuming a modeled constant or increasing demand for goods. In some embodiments the colors that represent an object and/or subsystem may change based on the time-series data specific times within the time-series. Thus, the styling of items shown in the user interface 800 may depend on the time-series data, models, simulations, and/or the ontology upon which the modeled system is based.

Referring to FIGS. 8B-8C, an example user interface portions 820 and 821 are shown which may comprise portions of, or updates to, user interface 800. As shown in user interface portion 820, the user has selected object "Hospital A" 822, and as a result information related to the selected object is shown in the information panel 810. In the information panel 810, the user may select a "series" tab, which allows the user to access time-based data associated with the selected object. As mentioned above, such data may be based on models or simulations. The user may filter through the related data, and select a particular set of data to display in the graph section 802, optionally adjacent to the node representing the object. The user may do so by selecting "Add sensor readout" for a particular data set, and then clicking in a section adjacent to a node where the user would like to display the related data, as shown at indicator 824 in user interface portion 821. When a point in time is chosen, or a simulation is run, the system will then display values in readouts on the graph (which may be positioned adjacent to nodes of the graph) based on the time chosen and the values from the selected time-based data. For example, referring to FIG. 8D, an example user interface 830 is shown which may comprise an update to user interface 800. As shown, nodes 831 and 832 each have associated readouts 833 and 834, respectively. Readouts 833 include two different selected data sets (e.g., there are two rows of data shown). Additionally, optionally the system may display multiple columns for each readout. A first column may show a data value before a simulation, and the second column may show a data value (for a same data set) after a simulation. Accordingly, a user may be able to rapidly visually evaluate effects of changes made in simulations on values of time-based data and/or statuses associated with nodes of the graph. In various implementations, as mentioned above, the time-based data may include data from sensors (e.g., measuring devices 114), which may be displayed in the readouts.

Still referring to FIG. 8D, via selection box 836, the user may select a particular simulation result to compare to (e.g., a simulation based on which values are displayed in the right column of readouts 833, 834). Similarly, via selection box 837 and/or the time slider 838, the user may select an initial data set to compare to (e.g., an initial data set to display in the left column of readouts 833, 834).

Referring to FIG. 8E, an example user interface portion 840 is shown which may comprise a portion of, or an update to, user interface 800. As shown, the example user interface portion 840 can include a simulation panel 842 that can display simulation parameters and results. Via the simulation panel 842, the user can specify inputs, outputs, and models. Further, the user can run multiple simulations, as represented by columns 843 and 844. As described above, the user can specify which simulations are used to display values in the readouts 833 and 834. Additional details of GUI functionality related to simulations are provided herein, including in reference FIGS. 8N-8O and 9C-9F.

Referring to FIG. 8F, an example user interface portion 845 is shown which may comprise a portion of, or an update to, user interface 800. The user interface portion 845 illustrates system functionality related to adding related objects to a GUI of the system. For example, the user may "add linked objects" using the buttons at top or the right click menu. This functionality allows the user to browse all objects that are directly connected to a currently selected object, and bring any into the graph. In another example, the user may "generate graph" around a selected object if any graph generation functions are defined for that object type. This functionality allows the user to bring a custom set of connected objects around the selected object. In the example, the user has selected object 846, and opened up a menu via a right click action, and selected "add linked objects". A submenu of the system allowed the user to optionally select particular types of objects linked to the selected object to add to the graph. The submenu also indicates numbers of the respective types of related objects that are linked to the selected object.

The system allows a user to select multiple nodes in the graph by pressing the shift key on their keyboard, and/or making a selection box. The system can provide a histogram pane on the left bar (see example user interface below), which provides histograms of all common properties of the selected objects. In the histogram pane the user can expand any section, click on headers to change sorting or units, and filter the selection (or filter out from the selection).

Referring to FIG. 8G, an example user interface portion 850 is shown which may comprise a portion of, or an update to, user interface 800. The user interface portion 850 illustrates system functionality related to displaying a histogram of objects on the graph, or displaying a histogram for selected objects on the graph, and filtering the selection of objects. A user may select objects in the graph section 802 by clicking, shift- or control-clicking to select multiple, dragging a selection box, and/or the like. A histogram panel 852 provides histograms of all common properties of the selected objects (or, alternatively, all objects in the graph). In the histogram panel 852 the user can expand any section (see, e.g., expanded section 854), click on headers to change sorting or units, and filter the selection (or filter out from the selection) via buttons 851.

Referring to FIG. 8H, example user interface portions 855, 856 are shown which may comprise portions of, or updates to, user interface 800. The user interface portions 855, 856 illustrate system functionality related to grouping nodes/objects. User interface portion 855 illustrates that the user can select any number of nodes of same or different object types, and then select to group those selected nodes via button 857. User interface portion 856 illustrates that, in response, the system groups the selected nodes into a single node 859. And vice versa, the user can select any grouped nodes and ungroup them to expand the contents via button 858. Advantageously, grouping nodes enables abstracting away parts of a larger, more complicated graph.

Referring to FIGS. 8I-8J, example user interface portions 860-862 are shown which may comprise portions of, or updates to, user interface 800. The user interface portions 860-862 illustrate system functionality related to subgraphs. Subgraphs provide another way to abstract away parts of a larger, more complicated graph. User interface portion 860 illustrates that the user can select to create a subgraph from the ' . . . ' menu on the top navigation bar breadcrumbs. In other implementations other buttons or GUI functionality may be provided for the user to create a subgraph. In response, in user interface portion 861, which can comprise an overlaid GUI portion, or a separate GUI portion, the user can fill in details of the subgraph just like a regular graph, can name the subgraph, and can then link the subgraph back to the parent graph. User interface portion 862 (of FIG. 8J) illustrates that, back in the parent graph, the user can link the created subgraph to the parent graph (e.g., the user can add a 'Region' to link to the subgraph on click). The user can also add any number of 'Text' or 'Note' items to achieve the desired view. In various implementations, the user may also link the subgraph to related objects of the parent graph.

Referring to FIG. 8K, an example user interface portion 865 is shown which may comprise a portion of, or an update to, user interface 800. The user interface portion 865 illustrates system functionality related to alerting, and coloring or highlighting nodes based on status and/or other data related to the nodes and associated objects (e.g., based on time-based data, models, and/or simulations). For example, as mentioned above, node coloring or highlighting may be green at one point in time, indicating a sufficient supply of goods, but it may be red at another time indicating a lack of inventory. Such statuses may be predictive based on other objects and their associated models. Via a node configuration panel 866, the user can configure nodes in the graph to show up in a certain color depending on their status. The configuration can be based on, for example, a value of a property, or a comparison of a property to another property or a threshold. In various implementations, graph nodes may be colored based on any property of the objects, and coloring may be based on a gradient.

Referring to FIG. 8L, an example user interface portion 870 is shown which may comprise a portion of, or an update to, user interface 800. The user interface portion 870 illustrates additional system functionality related to alerting, in which alerts 871 associated with a selected object are displayed in an event panel of the GUI. In various implementations, the GUI can include a panel that displays any alerts associated with any objects in the graph. In either case these alerts can then be opened in other applications for more details or workflows, as described herein. Alerts may be generated when models indicate an undesirable status, such as an insufficient inventory, or the like.

Referring to FIG. 8M, an example user interface portion 875 is shown which may comprise a portion of, or an update to, user interface 800. The user interface portion 875 illustrates additional system functionality related to linking to other applications. For example, as shown the user can right click on any node in the graph, and navigate to the 'Open in . . . ' submenu to see a list of other applications that in which the selected object can be opened. In response to selection of one of the other applications by the user, the system can navigate to the selected application and display data associated with the selected object in that selected application. Similarly, from the same menu the user can open the object in the 'Data Lineage' application to see the data pipeline that produces the object.

Referring to FIGS. 8N-8O, example user interface portions 880, 895 are shown which comprise portions of, or updates to, user interface 800. The user interface portions 880, 895 illustrate additional system functionality related to running simulations. As shown, a simulation panel 881 can display simulation parameters and results. Via the simulation panel 881, the user can specify inputs, outputs, and models (e.g., models 885 and 886). Further, the user can run multiple simulations, as represented by column 889 and additional columns that may be added. For example, the user may select the "duplicate" button 890 to duplicate the parameters of an existing simulation, such that the user can then make modifications to the parameters to run a different simulation. User interface portion 895 illustrates an updated simulation panel 881 after the user has duplicated the existing simulation in a new column, and run a new simulation. Additional details of GUI functionality related to simulations are provided herein, including in reference FIGS. 8N-8O and 9C-9F.

In various implementations, the system may optionally include one or more of the following additional GUI-related functionalities: any object from the ontology can be searched and added to the graph; grouping and ungrouping of networks of edges onto a single edge; tab showing the history of a graph pointer; lower opacity on all edges when editing nodes, other edges and nodes when editing an edge; when editing a node, make clearer which node is being edited by dropping opacity of other nodes on the screen; dialog for adding parameters to model configurations, with support for filtering and bulk adding (input parameters that are not subsequently configured may still not persist in the configuration, as no value can be provided for these unmapped inputs when running simulations using this configuration); auto-layout to prevent overlapping nodes; hotkey (c) to copy styles from selected node and paste styles (v) onto selected nodes; allow users to apply advanced bulk selection options—select all of a given type, upstream, downstream, or inverted; error message to display when a user tries to add a node to the graph that is already present; users can add multiple objects at once from "add object"; search results can be optionally restricted to relations of base object (if one exists); show results for simulations as they become available, instead of waiting for entire chained simulation to finish; hover over series to highlight on graph; users can pin (multiple) series to the simulation panel using the series search; link objects in simulation to select object on graph; group inputs/outputs in the equipment series list by model; group inputs/outputs in the simulation panel by model.

b. Example Map-Based GUIs and Functionality

FIGS. 9A-9H illustrate various example implementations, features, and advantages associated with map-based GUIs of the system, according to one or more embodiments. The map-based GUIs of the system can allow a user to, e.g., generate visualizations of properties, links, and/or time-based data associated with objects; interact with properties associated with one or more objects; interact with a histogram of objects; interact with time-based data associated with objects; and/or the like. In various implementations, the map-based GUIs may be 2-dimensional or 3-dimensional, and interactive such that the user may move around the map, zoom in and out, change the angle of view, and the like. As mentioned above, the functionality of the map-based GUIs can be similar to the graph-based GUI. However, in addition the map-based GUIs can include a geographical map, and indicate geographical locations of objects representing objects on the map as nodes or indicators, such as icons.

Figure 9A:
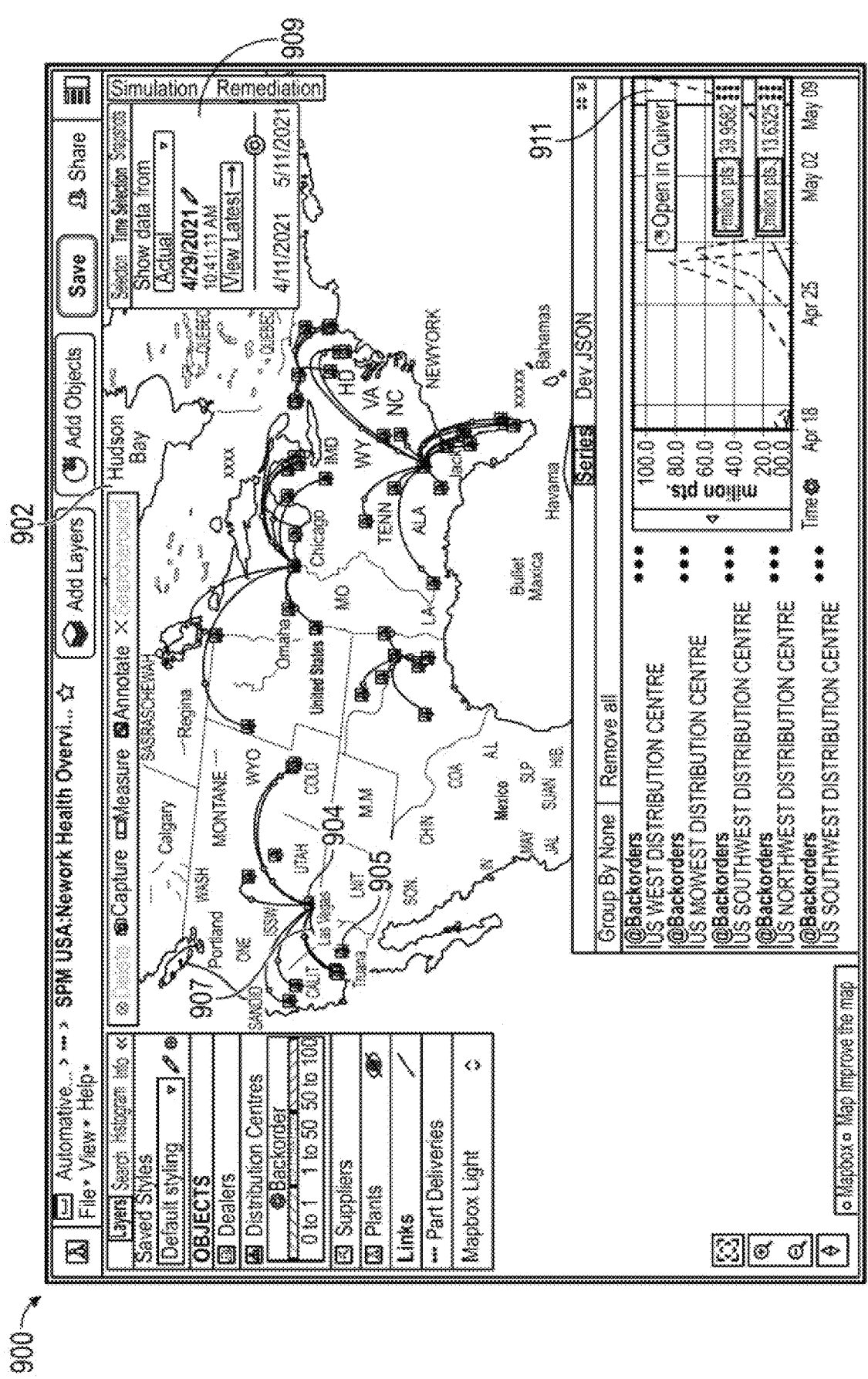

Referring to FIG. 9A, an example user interface 900 includes an interactive map section 902 in which various systems, subsystems, and data objects can be represented by nodes or indicators, such as icons 904 and 905. As described above, the nodes may be colored or highlighted based on related statuses, and/or the like. Relationships among the objects are represented by edges, such as edge 907, which may optionally be directional (or bi-directional) to indicate, e.g., flows of information or items.

Dots or nodules may be represented on the edges to indicate movement events, or quantities of items moved from one location to another. The nodules can be time-based, meaning that they can accurately represent the points in time that items move from one location to another, based on the point in time selected by the user via time slider 909. Thus, the nodules may be determined based on time-based data associated with the related objects. As the user adjusts the date/time, the time-based data associated with the objects and/or links, and movement of data and/or items among the objects, can be displayed. Optionally the movements can be displayed in an animated fashion as the user slides the slider across the shown time span. Similar animated dots or nodules may be displayed along edges of the graph-based GUIs of the present disclosure to indicate movements of data/goods/etc. from one object to another.

Changes in the various displayed objects may be indicated, for example, by changes in color (similar to the indications provided in the graph-based GUIs described above). For example, if one or more alerts are or become associated with a displayed object, the object may change from, e.g., green to red. Thus, the user may slide the time slider, viewing movements of items, and may observe then certain object/locations in the map turn red. The user may then select the object, and may view the alerts associated with the object (e.g., which may indicate the reasons that the object changed color). The user may optionally view the alerts via a panel-based GUI, as further described below. Alerts/coloring of objects may be based on one or more predictive models of the system that model/predict, e.g., flows of goods, supplies, orders, delays, inventory, and the like. Thus, the system may predict, e.g., likely shortages in certain supplies, and/or the like (and may indicate the same in the map-based GUI).

In various implementations, the map-based GUI may include and show time series data 911, which may include a sliding indicator as the user moves the time slider, similar to the time series data shown in the graph-based GUI described above. Thus, the map-based GUI may simultaneously show animated movements of items among objects/locations as the user interacts with the time-based slider, and movement of an indicator along the time series chart.

Figure 9B:
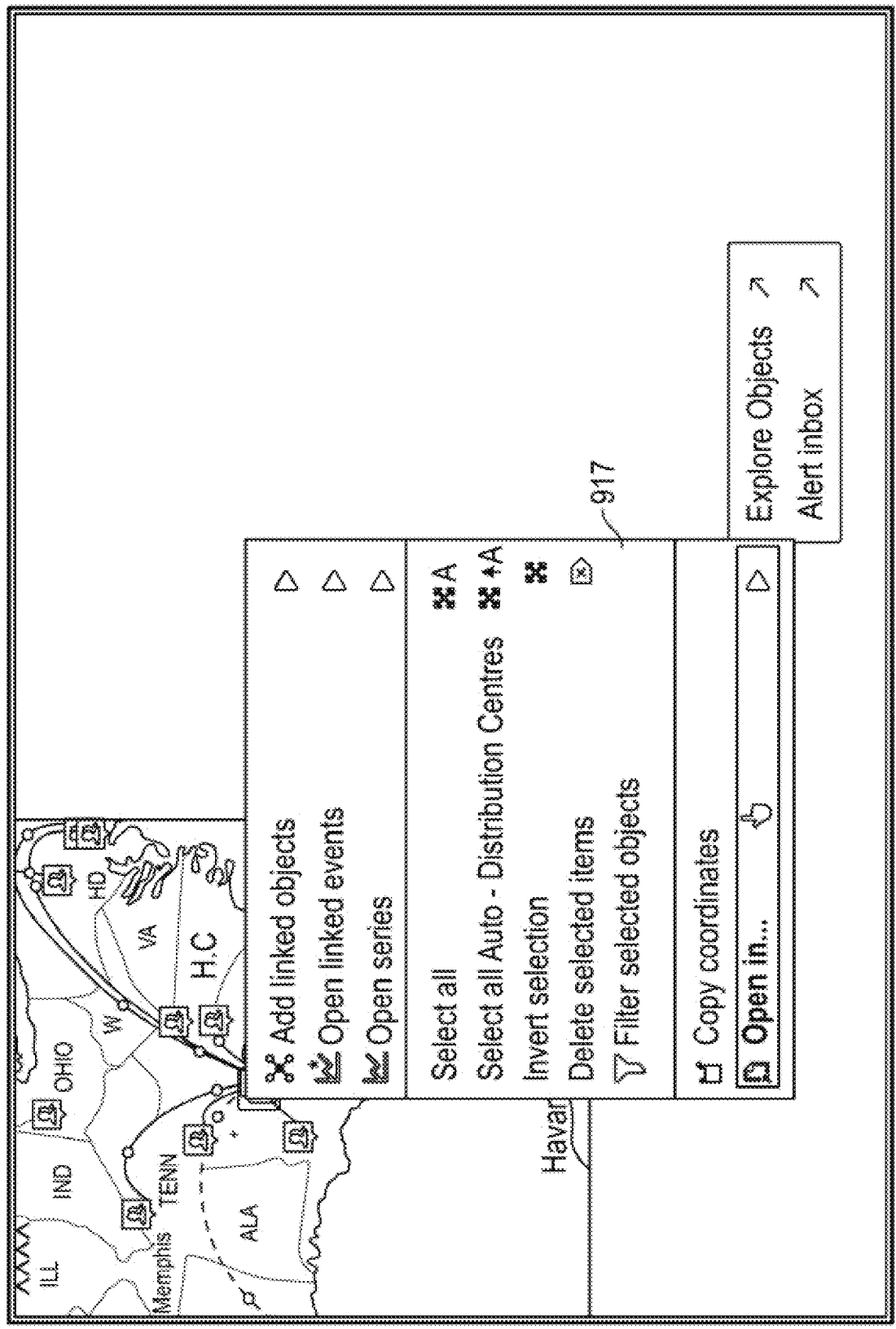
Figure 9C:
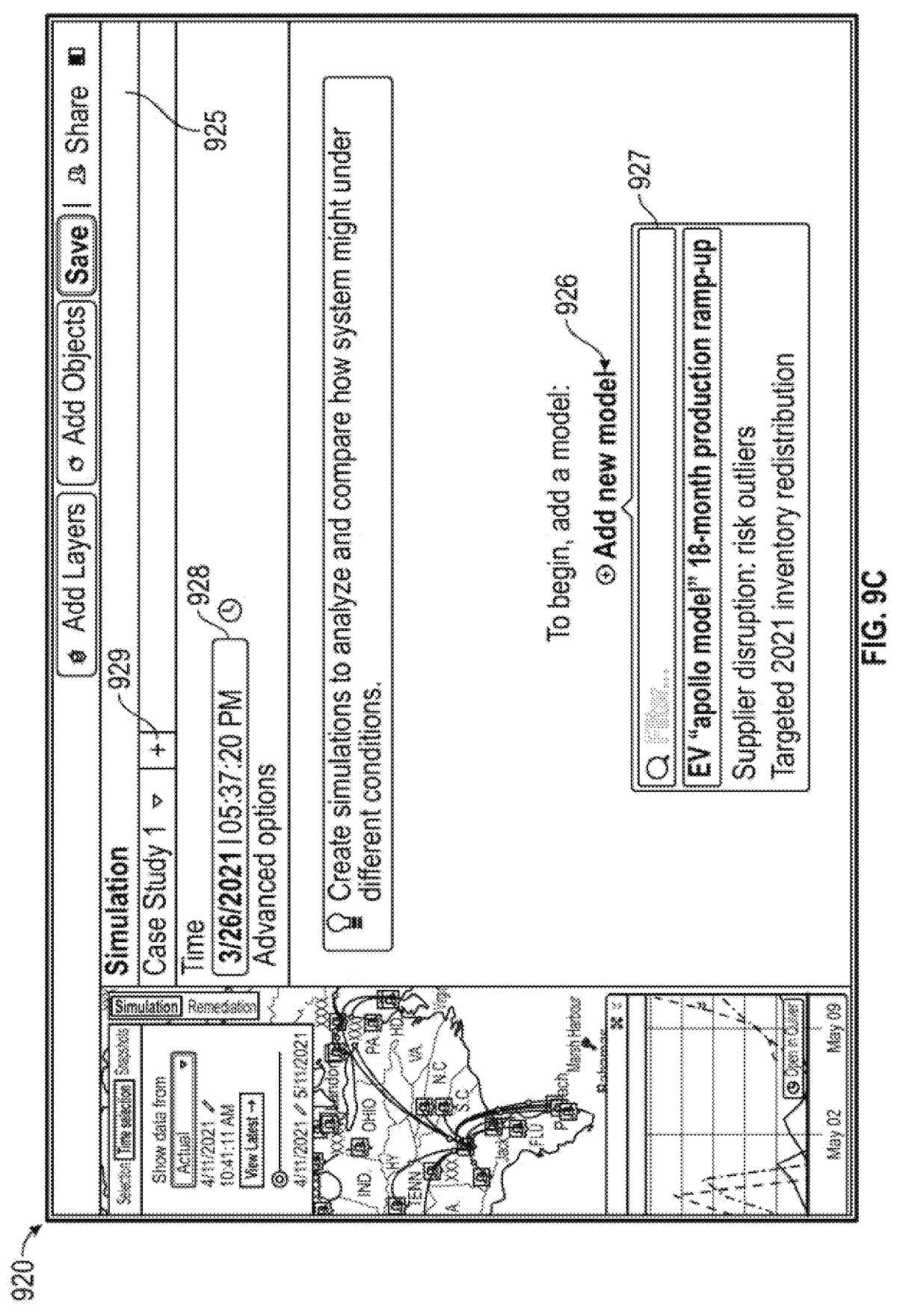
Figure 9D:
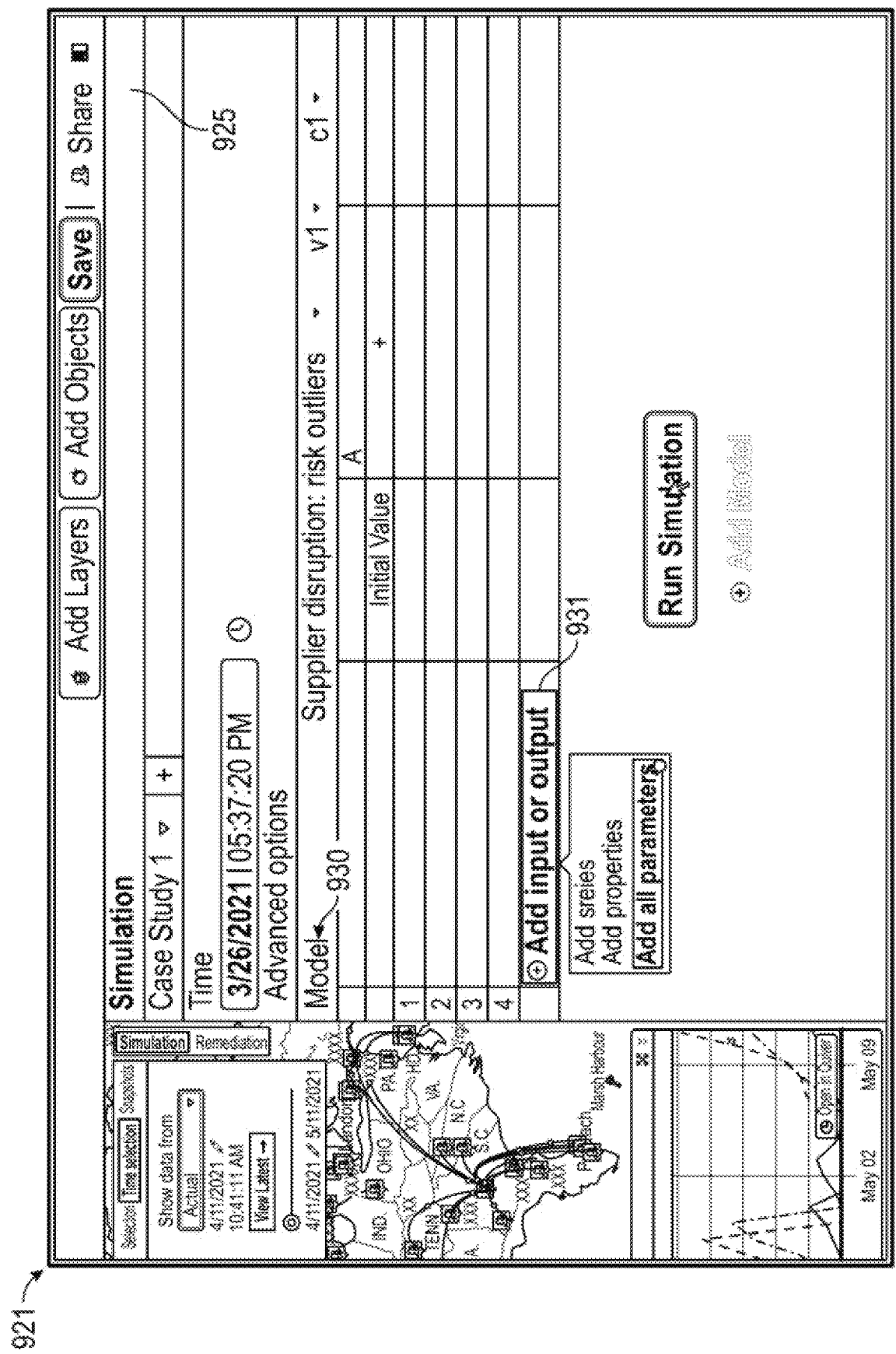
Figure 9E:
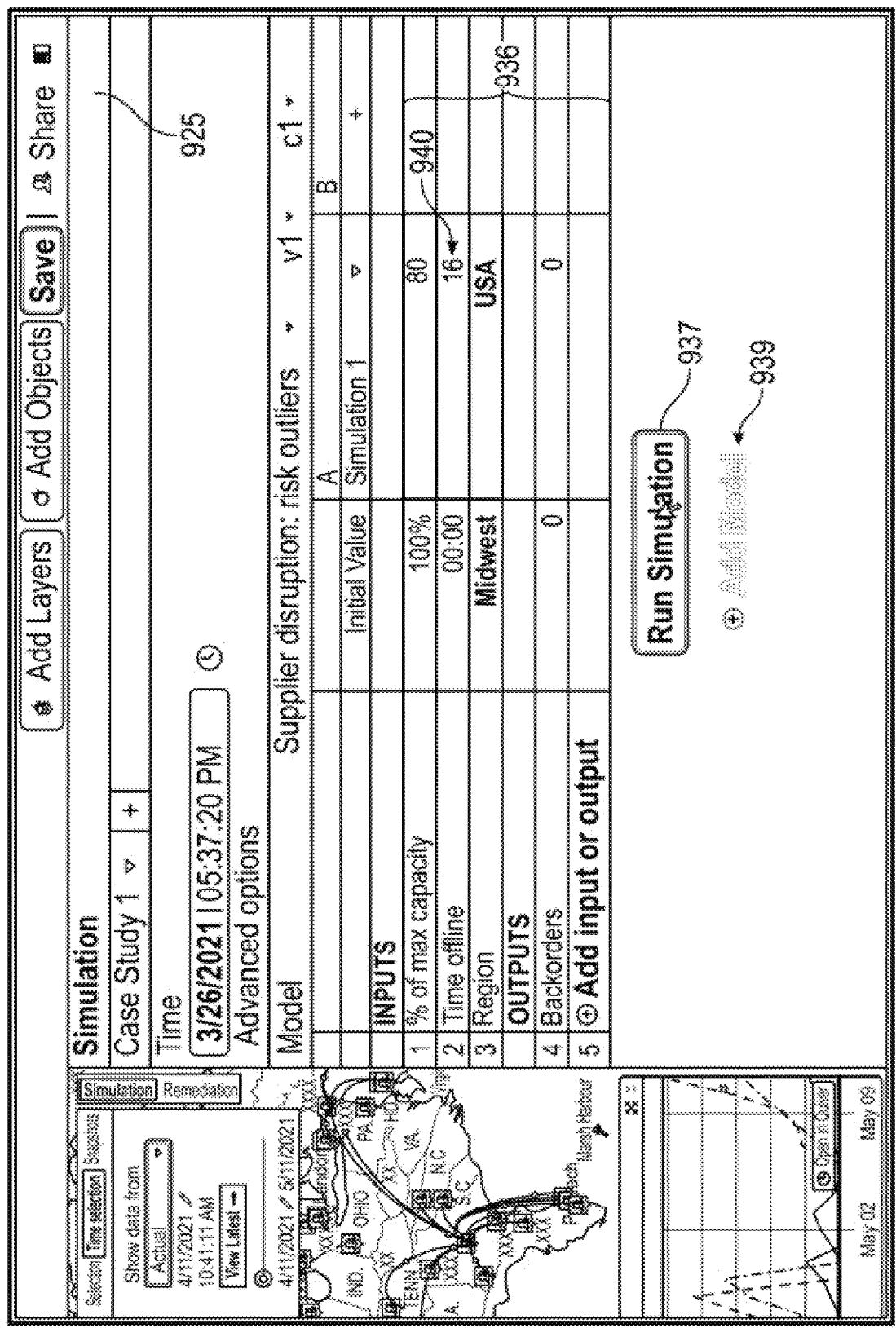
Figure 9F:
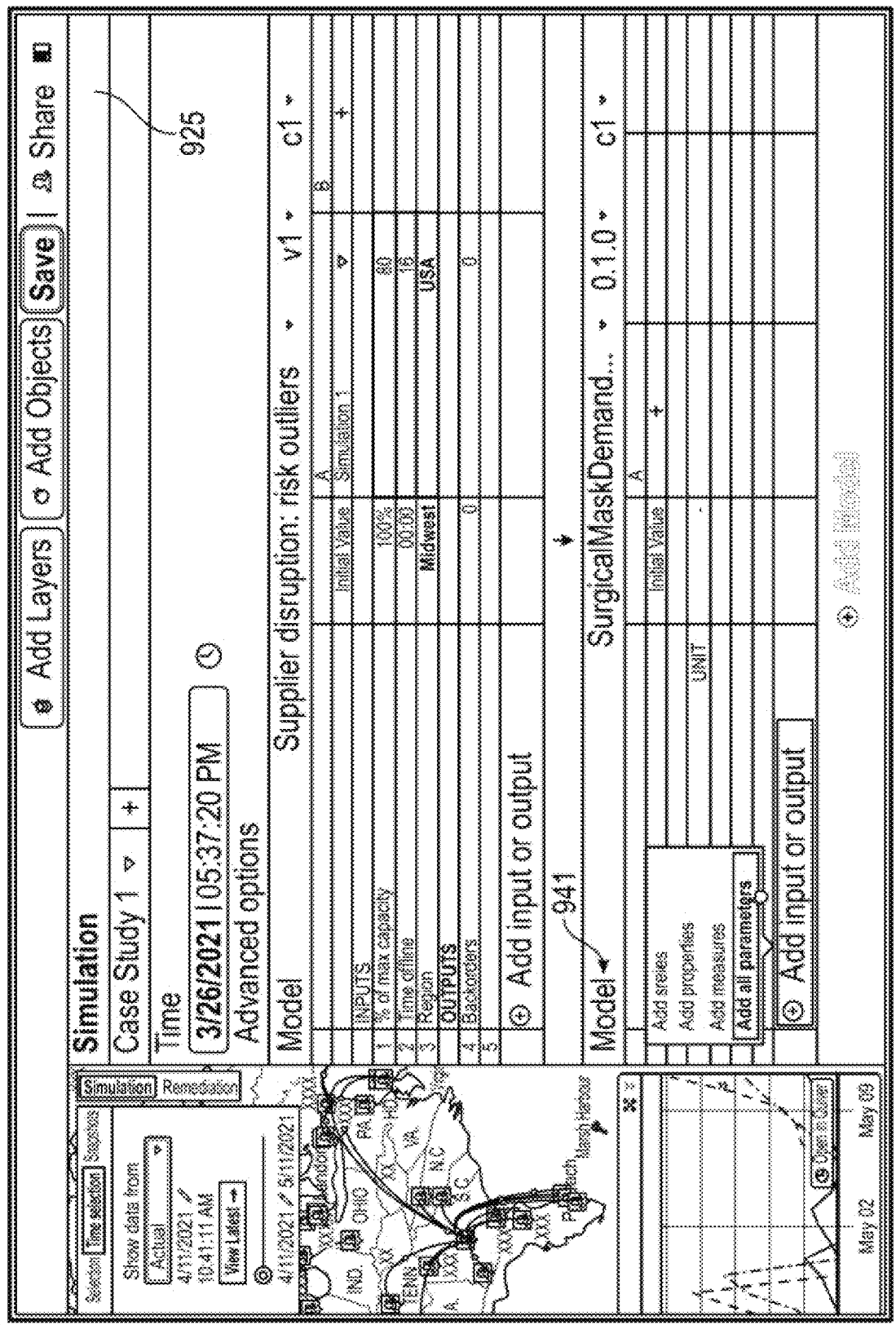

Referring to FIG. 9B, an example user interface portion 915 is shown which may comprise a portion of, or an update to, user interface 900. In various implementations, the map-based GUI may enable the user to select one or more objects, and then view a popup menu 917, select to view the objects in another application/GUI of the system. In the example shown in the example GUI below, the user may select to view the objects in the "explore objects" application and/or the "alert inbox" application. An example of the "alert inbox" application and its associated functionality is described below. For example, alerts associated with the selected object(s) may be shown in the "alerts inbox" GUI in response to the user selecting the link.

Referring to FIGS. 9C-9F, example user interface portions 920-923 are shown which may comprise portions of, or updates to, user interface 900. The user interface portions 920-923 illustrate system functionality related to running simulations, e.g., via a simulation panel 925. For example, the user may access simulations via the "simulation" button on the upper right side of the GUI. Selection of the button may cause display of the simulation panel 925, in which the user may select one or more models via button 926 and/or search/filter box 927. The user may additionally specify a point in time as a basis for running the simulation via selector 928, and may create multiple "tabs" each with different simulation parameters buttons 929.

User interface portion 921 shows that a first model 930 has been added to the simulation. Via button 931, the user may add one or more time-based data sets, properties, measures, and/or parameters to the model. Such items may include inputs and output of the model. User interface portion 922 shows that multiple inputs and outputs have been added to the model, and that the user may now optionally run the simulation by selecting the "run simulation" button 937. Details of actions taken by the system when a simulation is executed are provided elsewhere in the present disclosure. The user may edit one or more values in the input rows of the model (e.g., item 940) to modify the parameters of the simulation before it is run. Results of the simulation are shown as the values in the model outputs in the simulation column of the table. As discussed above, the user may run multiple simulations with the same set of inputs and outputs by adding another column to the table, modifying one or more of the input values, and again running the simulation.

In various implementations, in response to adding the parameters, the system may automatically populate various initial values or "base-case" or "best-case" values for those parameters. The user may then, as described herein, adjust the various values to run various simulations on the parameters. In various implementations, the system may also or alternatively select or recommend models based on various factors or characteristics of the use case.

The user may also optionally add/chain one or more additional models by selecting button 939. User interface portion 923 shows that a second chained model 941 has been added to the simulation. The user may similarly add additional inputs and/or outputs to the model, and execute the simulation.

After running a simulation, the user may view and evaluate the results, including via the graph- or map-based GUIs, time series charts, and time-based slider. Based on the results of the simulation, for example, certain alerts may be removed from the GUI as the user evaluates (e.g., by sliding the time slider and viewing movements of goods and coloring of objects). Advantageously, the user may run multiple simulations to determine mitigations for alerts that are present in the objects represented in the GUI, and may easily evaluate the effectiveness of those mitigations by viewing if the alerts have been removed or reduced.

Figure 9G:
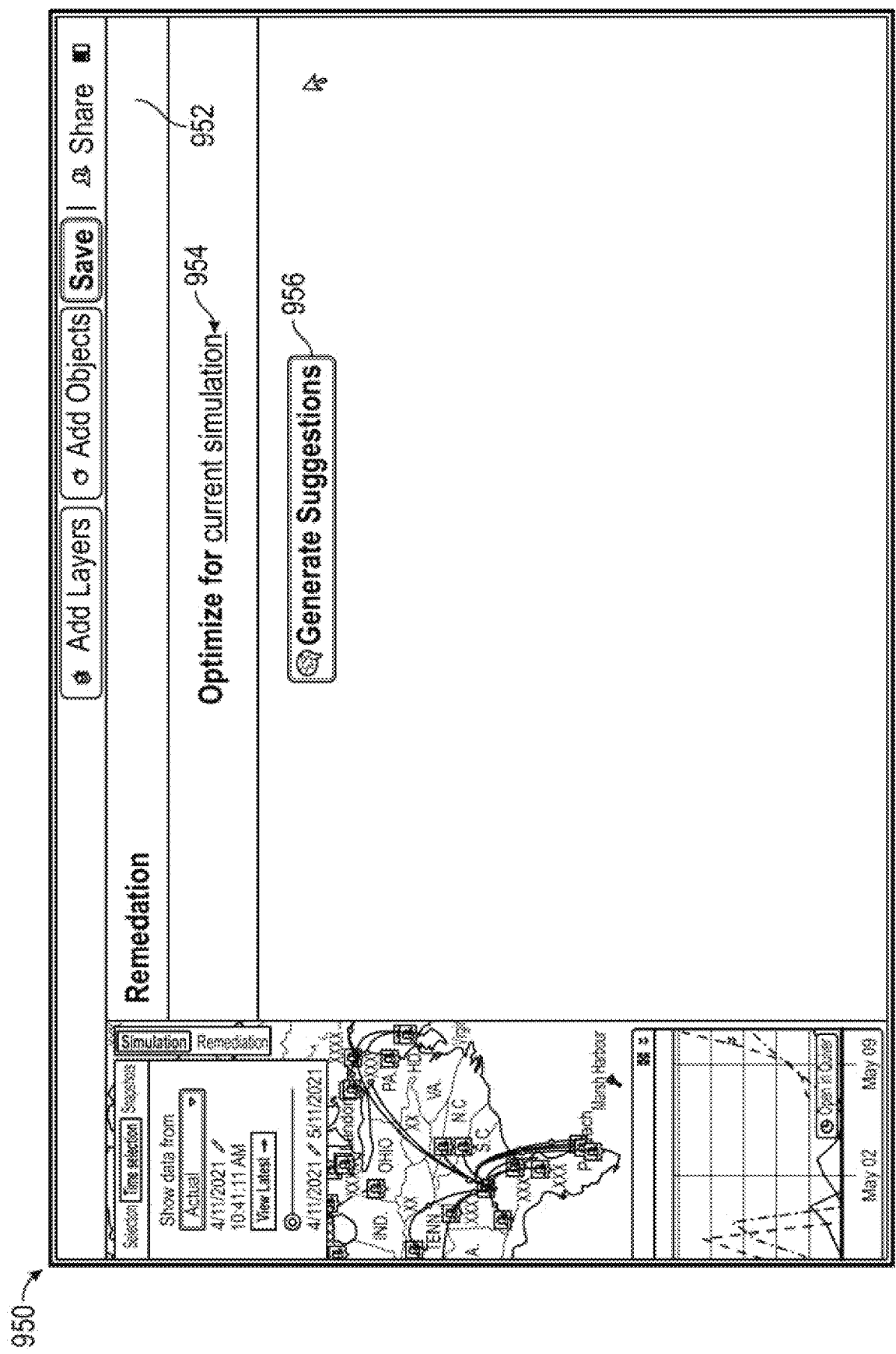
Figure 9H:
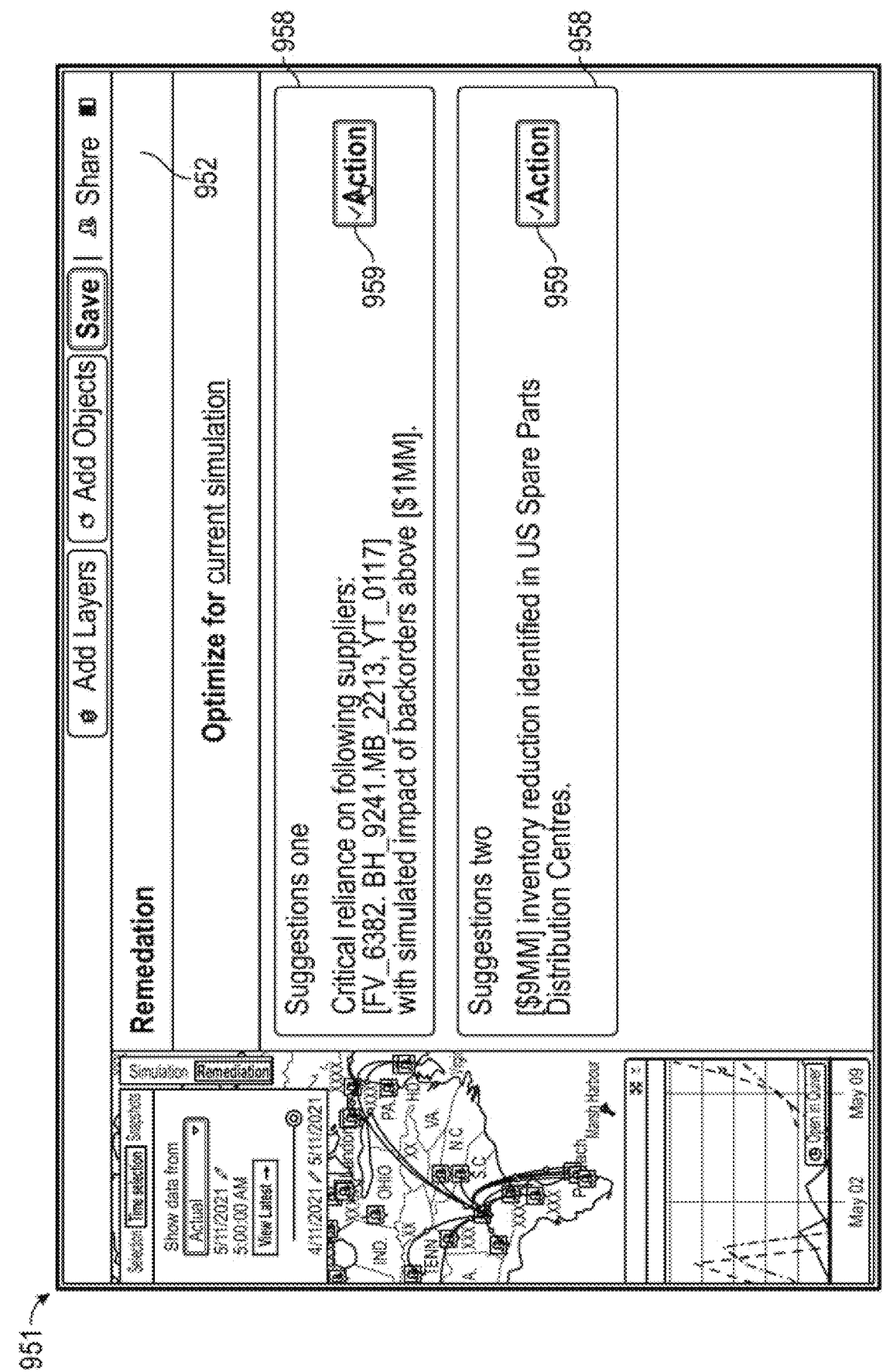

Referring to FIGS. 9G-9H, example user interface portions 950-951 are shown which may comprise portions of, or updates to, user interface 900. The user interface portions 950-951 illustrate system functionality related to optimizations, e.g., via a remediation panel 952. For example, the user may access optimizations/remediations via a "remediation" button on the upper right side of the GUI. As shown in user interface portion 950, the user may select to optimize for a particular simulation (e.g., via button 954), or based on current data via "generate suggestions" button 956. User interface portion 951 shows that the user has selected button 956, in response to which the system has generated a list of suggested optimizations/remediations 958. The system generates the list of suggested optimizations/remediations by running a number of scenarios and simulations, targeting to remove or reduce the severity of any alerts (e.g., any object statuses that are undesirable), as described elsewhere herein. Examples of remediations may include, for example, ordering more supplies, moving inventory, rushing existing orders, and/or the like. Via buttons 959 the user may select one or more of the suggested remediation actions, in response to which the system may automatically take action to make the suggested changes. Further examples of suggestions/recommendation for remediations and related functionality are described below in reference to various GUIs/applications/use cases.

Another example use case for the graph-based GUI includes monitoring and analyzing a power grid. Operation of various objects in a power grid may be monitored and colored (e.g., a transformer may be colored based on an output voltage), and alerts may be generated.

c. Example Alert-Based GUIs and Functionality

Figure 10A:
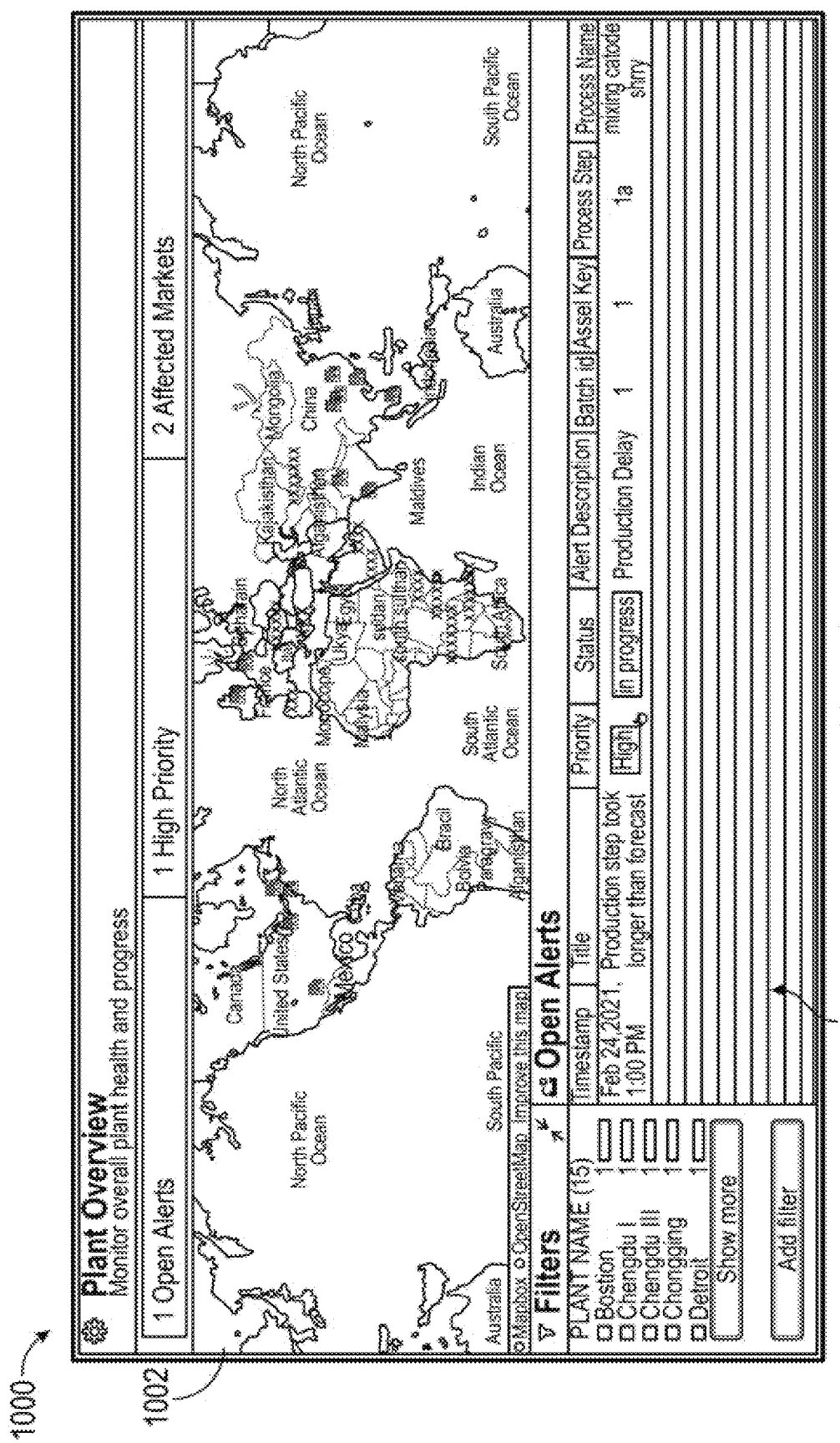

FIGS. 10A-10B illustrate various example implementations, features, and advantages associated with alert-based GUIs of the system, according to one or more embodiments. Referring to FIG. 10A, an example user interface 1000 includes both an interactive map-based section 1002, and an interactive alert-based section 1004. As noted above, various different GUIs of the present system can have similar functionality, and can be combined in various ways. For example, an alert-based section could also similarly be combined with a graph-based section.

The alert-based section 1004 of the user interface 1000 may include a listing of alerts associated with the objects shown in the map-based section 1002, and/or any selected objects. The list may be filterable, and as shown may include various details regarding the listed alerts. In the example user interface 1000, one alert is shown, and the associated object on the map is shown in red. The user may select the alert, in response to which the system updates the GUI to show details associated with the selected alert, as shown in the example user interface 1010 of FIG. 10B.

The detailed view of information associated with the alert in the example user interface 1010 can include, for example, a title, priority, status, and various other information associated with the alerts such as affected components and affected batches. As described herein, alerts may be predictive. For example, the system may employ various models to determine, e.g., the movements of parts/goods, so as to predict events and generate associated alerts, if applicable. The user may scroll down in the example GUI below to view additional information associated with the alert.

For example, the detailed information associated with the alert may include a chart-based GUI portion and/or a sequential analysis-based GUI portion (e.g., in the style of a programming notebook, combined with time series chart-based data analysis) that the user may interact with to analyze the data associated with the alert. The user may also select an "analyze sensor data" button, in response to which the system may present the user with a GUI associated with a chart-based GUI/application and/or a sequential analysis-based GUI/application for further analysis of the data.

VII. Example Processes for Running Simulations, Determining Model Relationships, and Visualizing and Interacting with Models and Simulation Results FIGS. 11A-11B provide additional description of example systems and methods for running simulations and/or chaining models together, such that the models may be used in simulating values of parameters at various nodes of a graph, such as a supply chain graph.

Figure 11A:
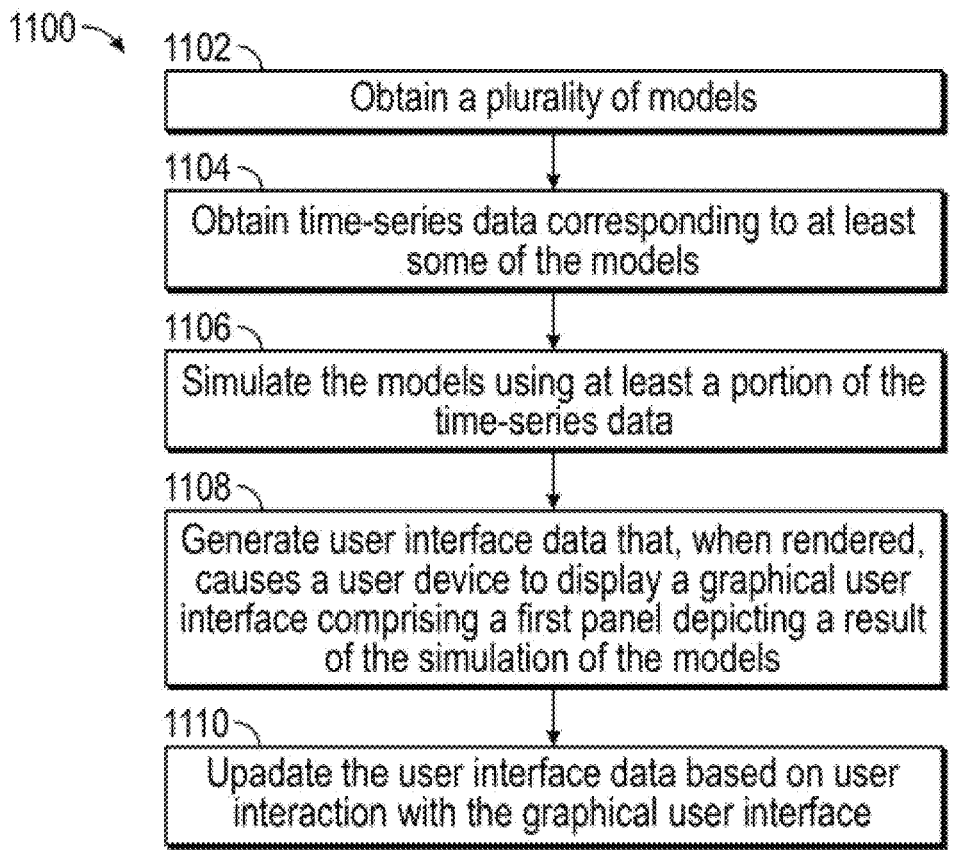
FIG. 11A shows a flowchart illustrating an example process for visualizing and interacting with the plurality of models depicted in a graphical user interface, according to one or more embodiments.
Figure 11B:
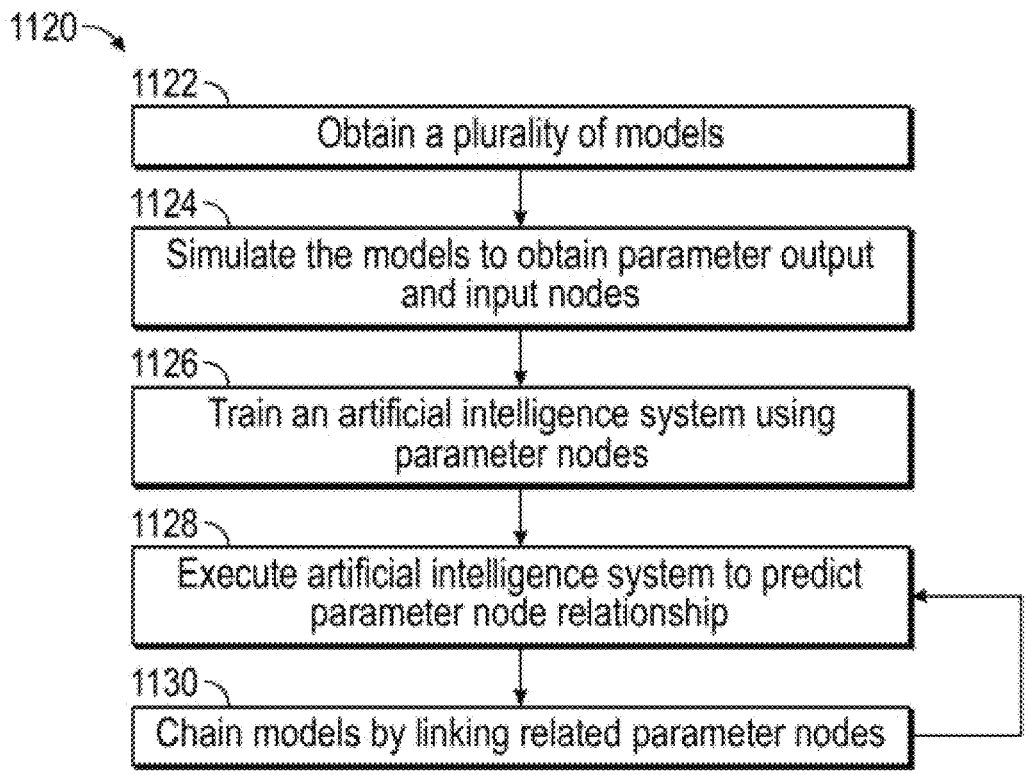
FIG. 11B shows a flowchart illustrating an example process for determining relationships between one or more outputs of a first model and one or more inputs of a second model, and chaining the models together, according to one or more embodiments.

FIG. 11A is a flowchart 1100 illustrating an example process for visualizing and interacting with the plurality of models depicted in the graphical user interfaces, according to one or more embodiments. The process 1100 may be implemented by the system optimization server 104 (e.g., the optimization component 116, the user interface generator 117, the model simulator 118, the subsystem simulator 119, and/or the object simulator 120) of FIG. 1.

At block 1102, a plurality of models is obtained. The models may be obtained by the model simulator 118 illustrated in FIG. 1.

At block 1104, time-series data corresponding to at least some of the models is obtained (e.g., historical model data, live model data, predicted model data, error detection data, event data, etc.). Furthermore, the time-series data corresponding to a model may relate to model specific subsystems, objects, and/or object properties (e.g., property types and/or property values).

At block 1106, the models may be simulated using at least a portion of the time-series data. For example, the model simulator 118 may simulate some or all of the models in the plurality using the time-series data.

At block 1108, user interface data is generated that, when rendered by a user device, causes the user device to display a graphical user interface comprising a first panel depicting a result of the simulation of some or all of the models. The first panel can be an information panel, a trend panel, a simulation panel, a mapping panel, a schematic panel, a time panel, an equipment panel, a toolbar panel, and/or the like. The first panel may comprise various of the simulation result GUI elements/panels described throughout this disclosure in various implementations and in reference to various example GUIs. The user interface data can be transmitted to the user device (e.g., by the user interface generator 117).

At block 1110, the user interface data is updated based on user interaction with the graphical user interface. Updating the user interface data may cause the graphical user interface rendered by a user device to show a result of the user interaction. A user interaction with the graphical user interface can include moving a time slider, using a toolbar add or remove objects, selecting an object, and/or the like (as described throughout this disclosure in various implementations and in reference to various example GUIs)

FIG. 11B is a flowchart 1120 illustrating an example process for determining relationships between one or more parameter outputs nodes of a first model and one or more parameter inputs nodes of a second model that collectively represent a real-world system, and chaining the models together, according to one or more embodiments. The process 1120 may be implemented by the system optimization server 104 (e.g., the optimization component 116, artificial intelligence training system 402, the model connector 404, the model simulator 118, the subsystem simulator 119, and/or the object simulator 120) of FIG. 1.

At block 1122, a plurality of models is obtained. The models may be obtained by the model simulator 118 illustrated in FIG. 1.

At block 1124, the models may be simulated to obtain parameter output and input nodes. The parameter output and input nodes may include simulated model data comprised of model specific technical subsystems, objects, and/or object properties (e.g., property types and/or property values). The models may be simulated by the model simulator 118 illustrated in FIG. 1.

At block 1126, an artificial intelligence system (e.g., artificial intelligence training system 402 illustrated in FIG. 4) may be trained using the parameter input and output nodes as training examples. For example, the artificial intelligence system can be an RNN.

At block 1128, the artificial intelligence system may be executed to predict relationships between the parameter input and output nodes. As described herein, the execution may be repeated multiple times to link and/or re-link parameter output nodes of some models with parameter input nodes of other models.

At block 1130, the models may be chained by linking predicted related parameter input and output nodes and may be continuously re-chained by re-linking related parameter input and output nodes based on the predicted parameter node relationships established by each execution of the artificial intelligence system. Additional details regarding the operations performed in blocks 1126, 1128 and 1130 are further detailed in the present disclosure, e.g., in reference to FIGS. 5-7.

VIII. Example Operations of the System

Figure 12:
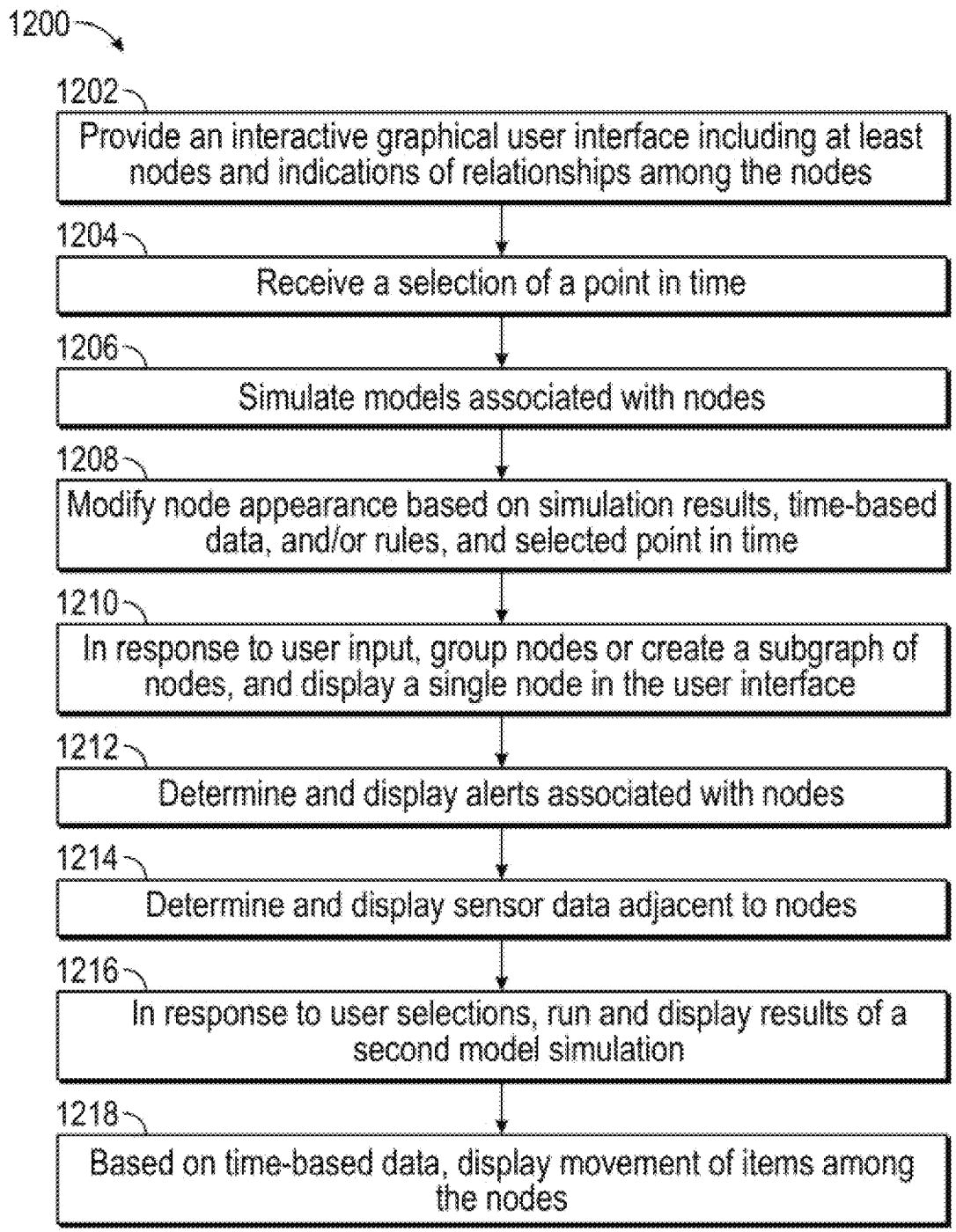
FIG. 12 shows a flowchart illustrating example functionality of interactive graphical user interfaces of the system, according to one or more embodiments.

FIG. 12 is a flowchart 1200 illustrating example functionality related to the interactive graphical user interfaces of the system, according to one or more embodiments. The blocks of the flowchart illustrate example implementations, each block may be optional, and in various implementations various blocks may be rearranged, optional, and/or omitted, and/or additional blocks may be added. The example operations of the system illustrated in FIG. 12 may be implemented, for example, by the system optimization server 104 (e.g., the optimization component 116, the user interface generator 117, the model simulator 118, the subsystem simulator 119, and/or the object simulator 120) of FIG. 1.

At block 1202, the system provides an interactive GUI (e.g., any of the various GUIs described above or below) including at least nodes (or objects, which may be indicated by icons) and indications of relationships among the nodes (e.g., edges). The block may also include adding, removing, and/or otherwise manipulating nodes in the GUI in response to user inputs. The block may also include displaying other aspects of the GUI, including, for example, a chart of time-based data, object properties, a histogram, and/or the like. At block 1204, the system receives a selection of a point in time, e.g., via a time slider or other time input element.

At block 1206, the system simulates models associated with nodes of the GUI for at least the selected point in time, or other points in time. Simulating the models may be performed as described above in reference to, e.g., FIGS. 5-7 and 11A-11B. Simulating the models may include accessing models related with the nodes and time-based data related with the nodes. Simulating the models may also include, based on the simulations, determining property values associated with the objects/nodes. Simulating the models may be performed in response to, for example, selecting a button, a user input, a display of a GUI, adding nodes to a GUI, selecting a point in time, running a simulation, running an optimization/mitigation, and/or the like.

As described herein, the simulation may include multiple simulations or scenarios, and each may include chaining of multiple models. Thus, simulating the models may include determining such multiple scenarios and chained models, and may also include targeting particular goals or metrics, varying parameters in each scenario, and evaluating the results of the simulations/scenarios to determine recommended actions that most closely achieve the goals.

In various implementations, the user may select the one or more models, and one or more parameters (e.g., inputs and outputs) for the respective models. Further, the user may set certain parameter values, which may comprise constraints on the simulation/model.

At block 1208, the system modifies appearances of nodes (e.g., color, highlighting, etc.) based on the simulation results, time-based data, and/or rules associated with the nodes, for the selected point in time. The system may also update details, e.g., evaluation factors in the GUI, associated with the alert/simulation/objects/etc. The details may also include one or more recommended actions. The details may include one or more parameter values, which may be displayed in respective rows of a simulation table. Such updated details are based on the simulation results.

At block 1210, in response to a user input, the system may group nodes or create a subgraph of nodes, and display the group or subgraph of nodes as a single node in the GUI. At block 1212, the system may determine and display alerts associated with one or more nodes. At block 1214, the system may determine and display sensor data, e.g., in readouts, adjacent to nodes. Additionally, the system may determine and display other data, e.g., simulation results, in such readouts, adjacent to nodes. Such display of data may be in response to user inputs specifying display of the data. At block 1216, in response to user selections via the GUI, the system may run and display results of additional simulations. At block 1218, the system may, based on time-based data, display movement of items among the nodes (e.g., as dots or nodules in the map-based GUI examples described above).

In various implementations, the system may also include functionality to link from a GUI of the system, and for a selected object (or group of selected objects), to another application to view data associated with the object (or group of objects) in that other application.

IX. Additional Example Interactive Graphical User Interfaces and Functionality FIGS. 13A-13E and 14A-14D illustrate various example implementations, features, and advantages associated with panel-based and optimization GUIs of the system, according to one or more embodiments. The panel-based and optimization GUIs of the system can, for example, enable analysis of alerts associated with various systems, subsystems, and objects (as described above), and also determine remediations, including suggested changes, for the alerts to optimize for various targets. As with the examples above, the examples below are based on a "supply chain" use case, but similar functionality may be implemented in other use cases.

a. Example Panel-Based and Optimization GUIs and Functionality

Figure 13A:
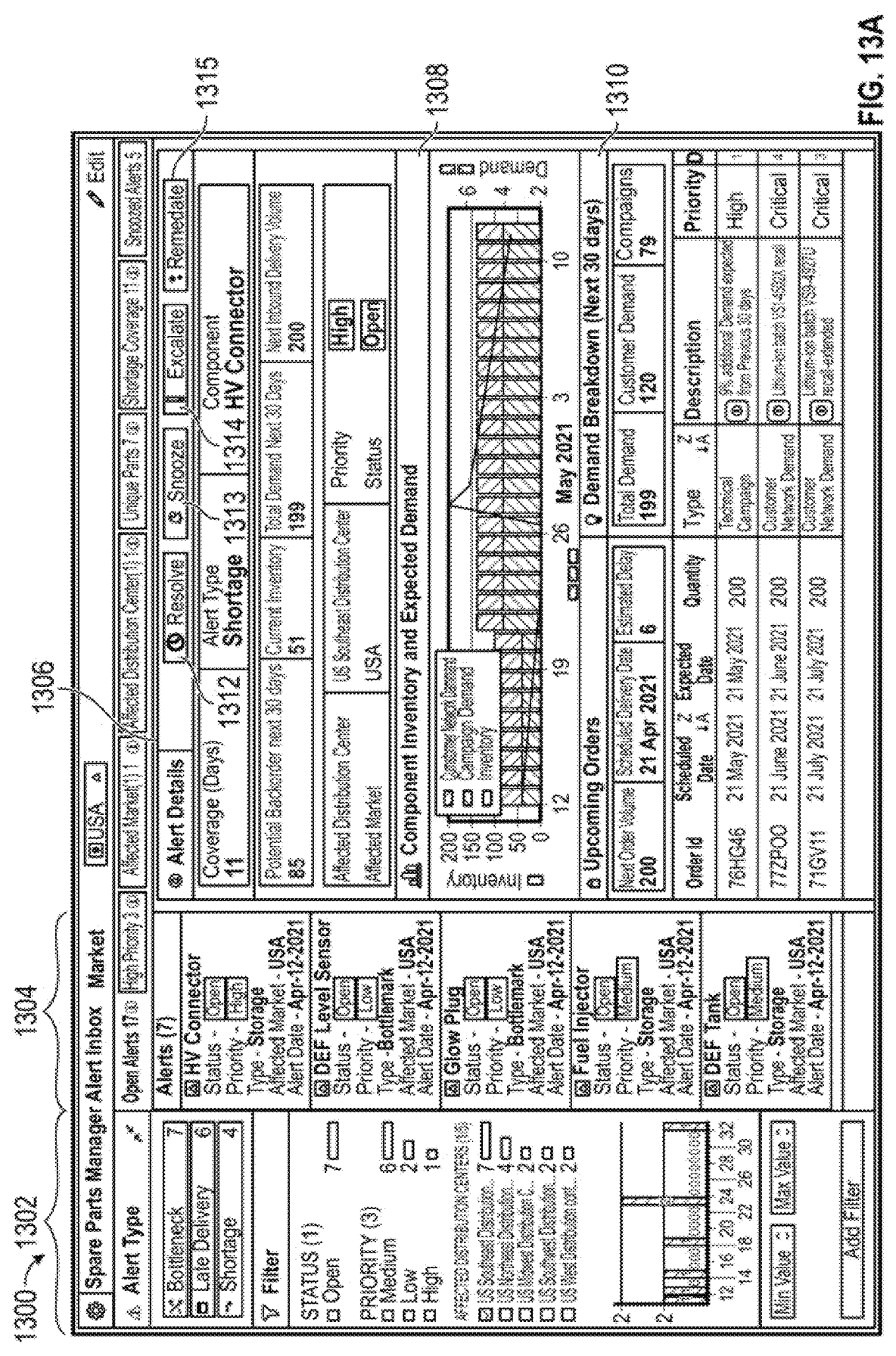

Referring to FIG. 13A, an example user interface 1300 includes an interactive listing of alerts 1304, an interactive sidebar 1302 with various controls for filtering the listing of alerts, and an interactive panel 1306 with information associated with a selected alert (e.g., an alert selected in the listing of alerts 1304). Each alert shown in the list of alerts 1304 can include various information, including, e.g., a status (e.g., whether the alert has been reviewed and/or acted on by a user, or is open), a priority (e.g., which may indicate a severity of the alerts), a type, and/or various other related information. Alerts may be generated by the system, as described herein, based on models and time-based data applied to various related objects (e.g., objects related in a supply chain) via simulations. The time-based data, and/or models, applied to the objects may indicate, for example, shortages or bottlenecks (just to name a couple of possibilities) of goods in the supply chain, which may then be manifest as alerts by the system. The system then enables a user to review the alerts so as to determine mitigations or optimizations, and described herein.

In response to a user selection of an alert in the listing of alerts 1304, the system determines and shows information associated with the selected alert in the panel 1306. The panel 1306 can include various information, examples of which are shown in the example user interface 1300. For example, the panel 1306 may indicate an alert type, a component/object associated with the alert, a number of days covered by the alert, etc. In the example of a supply chain-related alert, the alert may indicate, for example, inventories and demand over time (e.g., as indicated in chart 1308), and/or breakdowns of orders and demand (e.g., as indicated in table 1310). As discussed herein, the simulations of the system can be predictive, thus an alert may be based on an expected demand not being met by orders placed and expected shipment times, for example. In other words, the shortage may be predicted by the system based on a current model of shipments, inventory, demand, and the like.

In the details of the alert, the user may take various actions including, e.g., "resolve" 1312, "snooze" 1313, "escalate" 1314, or "remediate" 1315. The first three actions may enable management of alerts generally, while the fourth action, "remediate" 1315, may cause the system to initiate a "remediation GUI" (which may comprise another GUI of the system, or GUI overlaid on, e.g., the user interface 1300) by which the system may enable the user to explore mitigations or optimizations to remediate the alert.

Figure 13B:
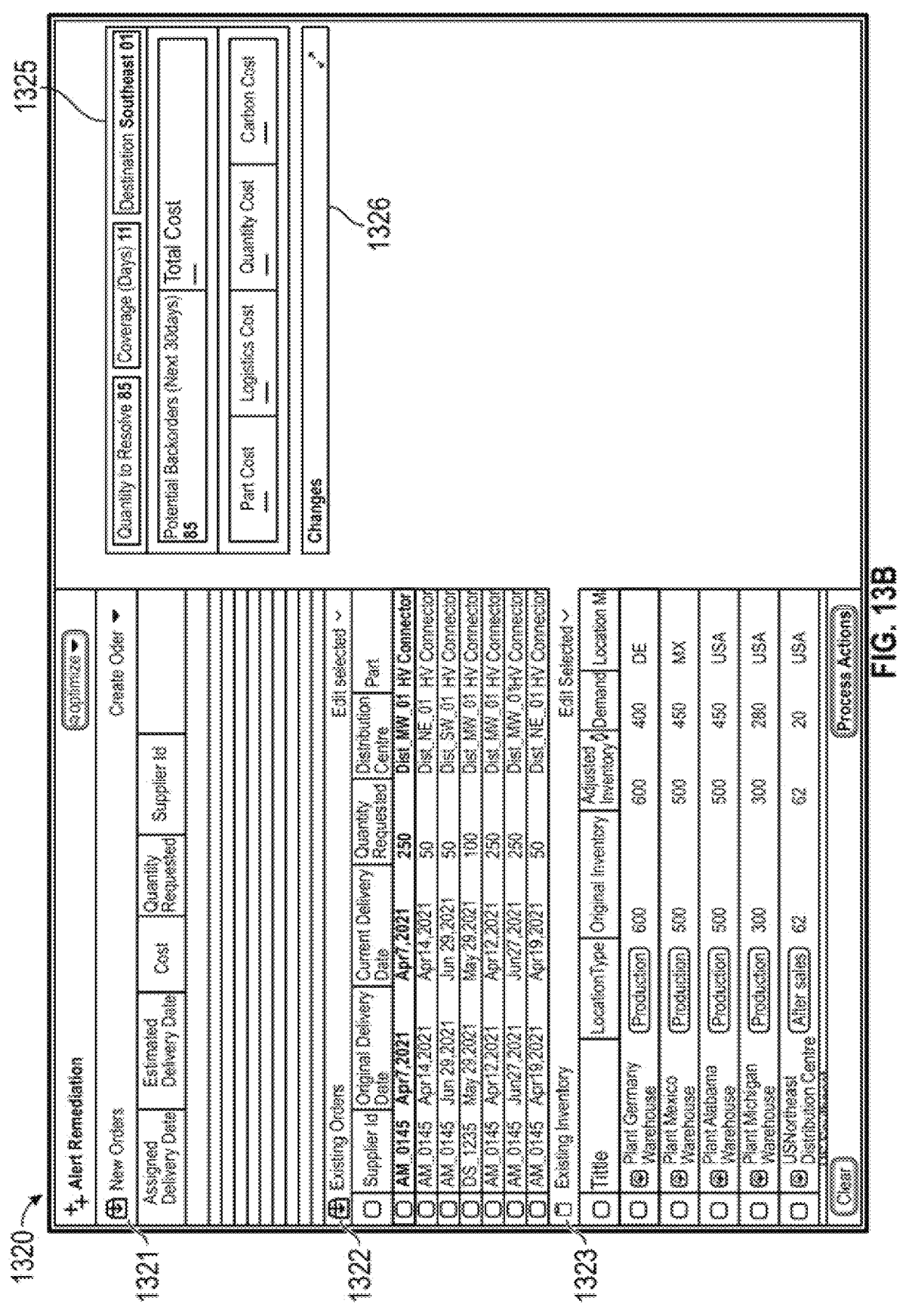

Referring to FIG. 13B, an example remediation GUI 1320 (which may also be referred to herein as a simulation GUI or an optimization GUI in view of the functionality of the GUI as described herein) is shown that includes information related to the current alert, system, and/or simulation. Such information may include a listing of new orders 1321, existing orders 1322, and existing inventory 1323. The GUI 1320 may also include a panel 1325 with an indication of factors (also referred to herein as "evaluation factors" and/or the like) associated with the current alert, system, and/or simulation. The GUI 1320 may also include a panel 1326 with indications of any changes made to the current state to effect optimizations/mitigations. The simulation/optimization GUI 1320 may include functionality similar to the other simulation/optimization GUIs, panels, and features described elsewhere in the present disclosure. For example, the user may take various actions to model the effect of those action on the status of the alert, the factors of which are shown in the right portion of the GUI. For example, the user can create new orders of various types. The user can also edit existing orders (e.g., to rush or cancel those orders), and/or edit existing inventory (e.g., to reallocate or trash that inventory). When the user takes actions, the system automatically runs the changes through the system models via simulations, and shows the impact in the right side of the GUI in panel 1325.

Figure 13C:
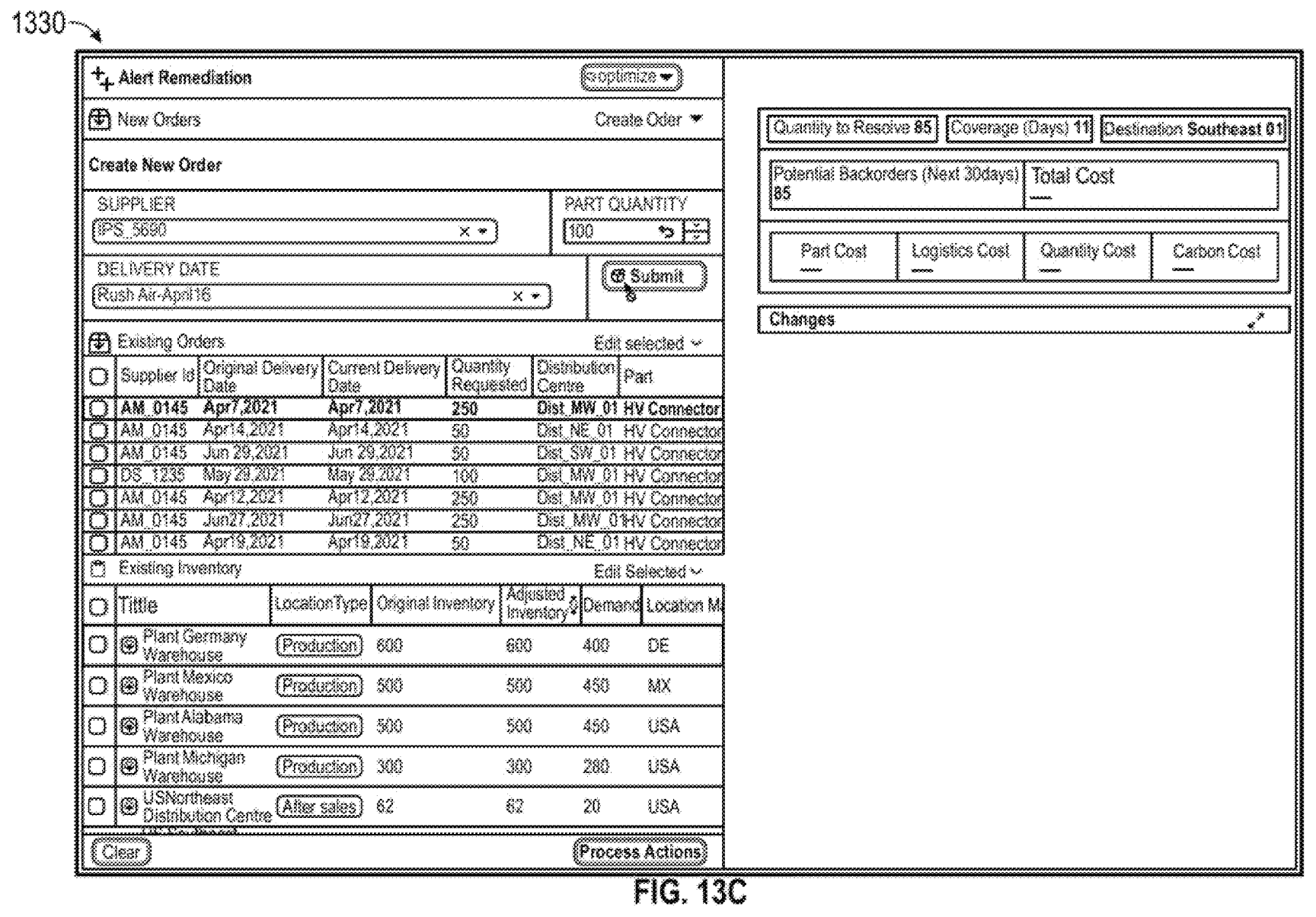

For example, referring to FIG. 13C, example user interface 1330 shows an update to user interface 1320 in which a user is adding a new order via a "create order" button, filling in order details, and selecting a "submit" button. Referring to FIG. 13D, example user interface 1332 shows an update to user interface 1330 in which the new order 1334 has been added to the list of new orders. Additionally, the change made by the user to the current state has been added to panel 1326. Further, the effect of the change on the current state/alert is determined by the system (e.g., via related models and one or more simulations) and displayed in panel 1325. As shown, prior to the added order there were potential backorders of 85, and after the change the potential backorders are shown at 0. However, a cost associated with the change is shown, broken down into its component parts. A "carbon cost" can also be included, which provides an estimation of the carbon footprint/impact of the changes.

Besides manually making changes and seeing the results, the system may automatically run one or more simulations or scenarios and generate recommendations for changes to remediate the alert. In various implementations, the system may optimize for a particular target, e.g., for an optimum cost, an optimum time, or an optimum sustainability (e.g., a minimal carbon footprint). The system may also optimize globally, which may comprise some configurable weighting of cost, time, and/or sustainability.

Figure 13E:
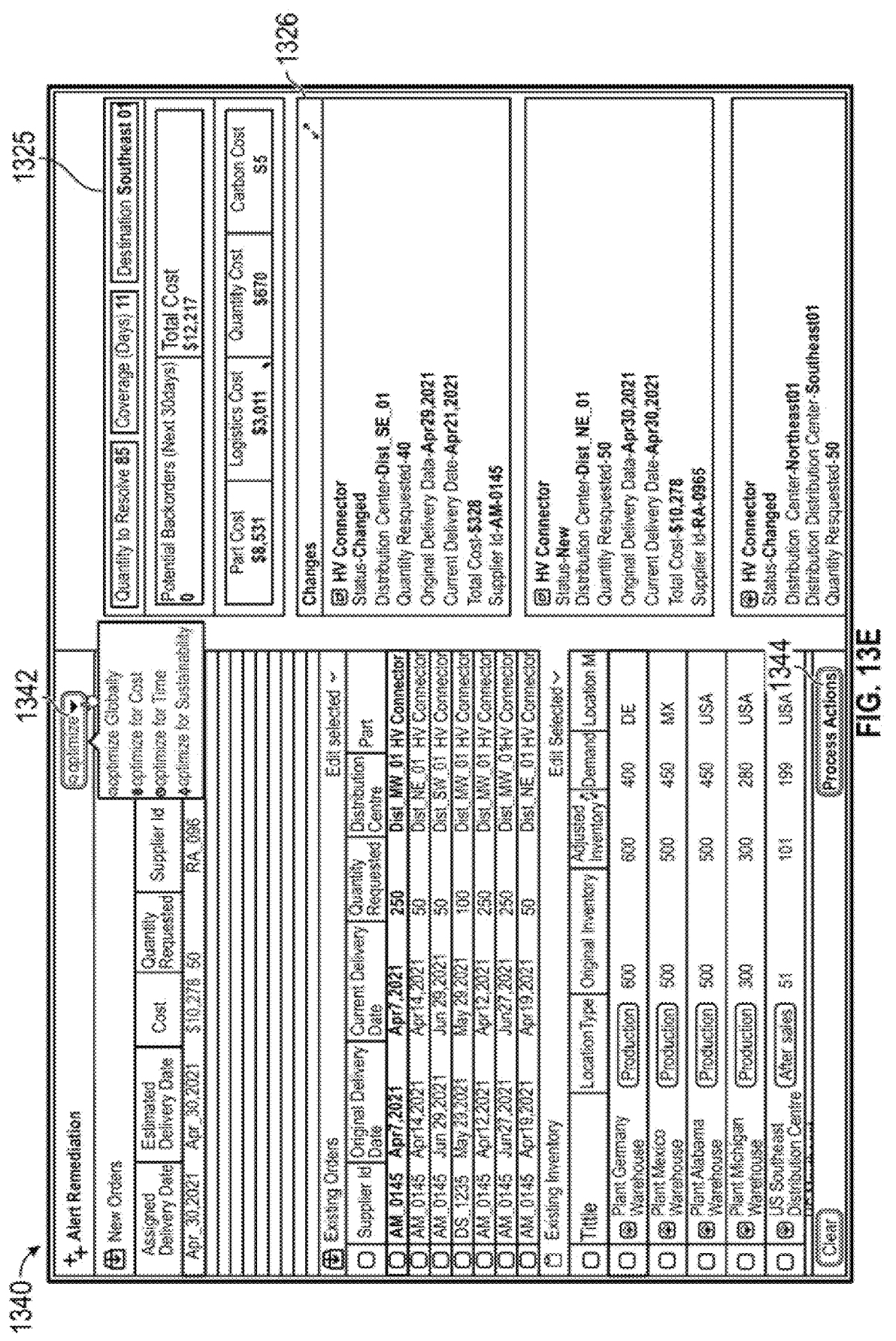

For example, referring to FIG. 13E, example user interface 1340 shows an update to user interface 1332 in which the user has selected the "optimize" button 1342, in response to which various options for optimization goals are shown for selection by the user. For example, the user may select to optimize "globally", in response to which with system may automatically run one or more simulations or scenarios, and generate a list of recommended changes as displayed in panel 1326. As shown, the system recommends changing an order, making a new order, and moving existing inventory. The effect on predicted backorders, costs, sustainability, etc. are shown in panel 1325. If the user decides to implement the changes, the user may select the "process actions" button 1344, in response to which the system will implement the changes.

In various implementations, the user may run the system optimizations multiple times, targeting different goals. The user may similarly explore the effects of various manual modifications/additions. In each case, the system may use time-based data and models for related data objects to determine effects of the changes. As described herein, the "changes" in the alert remediation GUI may comprise modifications to data objects, including adding data objects. Additional details regarding running simulations and running various scenarios are described herein.

b. Additional Example Panel-Based and Optimization GUIs and Functionality, including Examples of Executing Scenarios As noted above, simulations may be performed by a user by providing simulated values for attributes that are then evaluated by multiple chained models to simulate outputs. As discussed further herein, the optimization component 116 provides optimization functionality that enables automatic exploration of a problem space resulting in one or more recommended changes/actions that may be performed based on KPIs or other key metrics or goals. For example, in the supply chain example, an optimization may enable the user to find a precise price point that satisfies multiple targets, such as (1) optimizing revenue (2) without going under inventory limits.

An optimization may be performed by evaluating thousands (or more) scenarios, with each scenario representing a different set of possible actions. For every scenario, a simulation chains together several models and calculates metrics, such as the one or more key metrics that are being optimized. One output of the optimization engine may be a set of actions associated with the optimal scenario, which may be presented as a recommendation to the user. For example, the actions may include the same types of simulated changes that a user may manually simulate, and may be accepted by the user in a similar manner as other simulated changes.

Figure 14A:
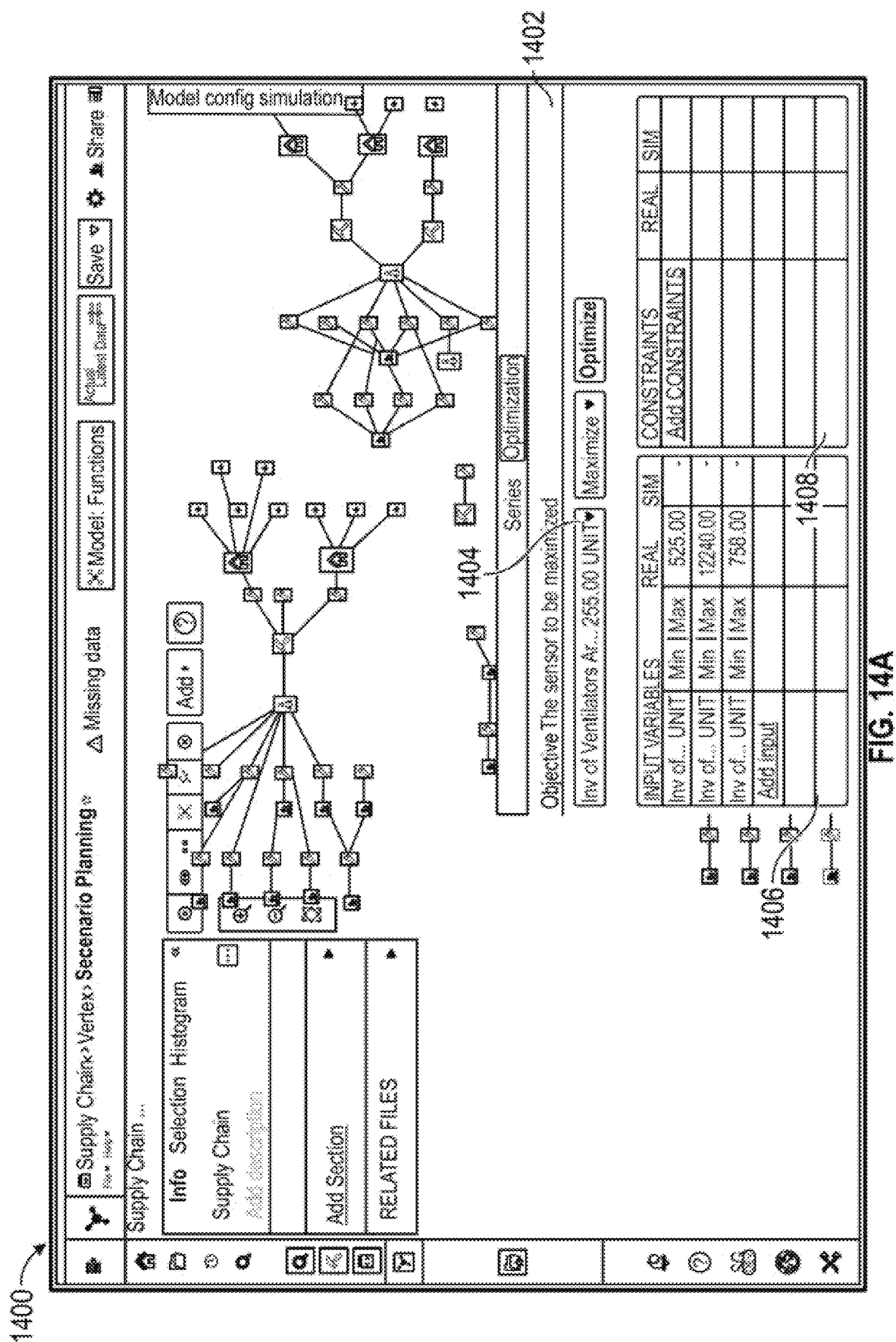

Referring to FIG. 14A, an example user interface 1400 includes many elements similar to previously discussed GUIs, and additionally includes an "optimization" panel 1402, also similar to optimizations GUIs described herein. Via panel 1402 the user may execute various scenarios/simulations, and may optimize for various goals or KPIs. For example, the user may select an objective/goal for which the system is to optimize via controls 1404, may add input variables/parameters via table 1406, and may add one or more constraints via table 1408. As described above, a column of the tables can show current/real values for the parameters, and one or more additional columns can show simulation results for the parameters. The example user interface 1400 shows optimization results that are automatically developed by the optimization component 116 (and/or other aspects of the system optimization server 104) in response to key metrics provided by a user indicating a desire to optimize revenue without going under inventory limits.

Figure 14B:
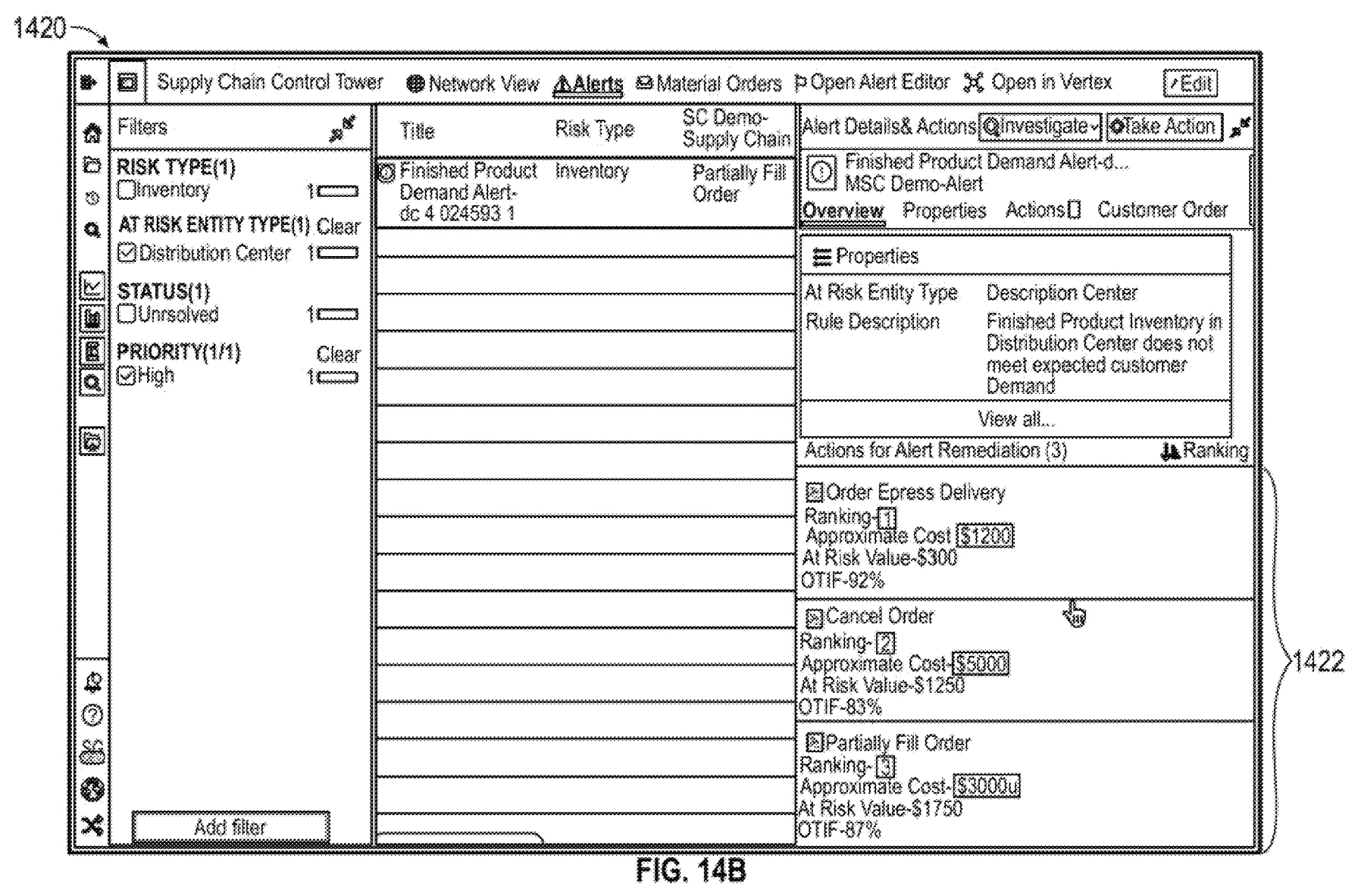

In this example implementation, the user has indicated a desire to maximize inventory of a particular component, e.g., ventilators in this example. Based on this key metric, and possibly others, the optimization component may execute multiple scenarios, each associated with one or more actions that are within constraints of the real-world operations, to predict the value of the key metric. For example, models may be chained together to evaluate different scenarios, based on the specific actions within each scenario. The optimization component 116 (and/or other aspects of the system optimization server 104) may then provide a ranked order of optimal scenarios or recommended/suggested actions, such as may be selectable by a user to implement one of the scenarios or recommended/suggested actions. Referring to FIG. 14B, example user interface 1420 indicates an example of how an optimal scenario, along with its recommended actions 1422, may be presented to the user.

The recommended action may then be viewed, modified, and/or applied in the same way as a set of simulated changes may be implemented. Additionally, the actions of a scenario may be further modified by the user prior to selection for implementation. Thus, each recommendation provided by the system may be generated based on evaluation of many different scenarios for different sets of actions. For every scenario, relevant models may be executed on top of the results of the proposed actions before calculating the key metric being optimized. In some embodiments, the action space is intelligently searched using gradient descent methods.

In some embodiments, when multiple chained models are involved, back propagation methods used in deep learning may be implemented. Optimization can enable uncovering of unexpected solutions, reducing the time it takes to resolve critical issues, and may improve the average quality of solutions. Furthermore, the results are interpretable by non-subject matter experts as the resulting scenario can be evaluated in an operational application that is rooted in the language of the organization (e.g., according to the ontology). This enables technically sound recommendations and robust approval and implementation procedures to ensure that these optimizations and resulting recommendations can seamlessly be integrated into operations to create real value.

Figure 14C:
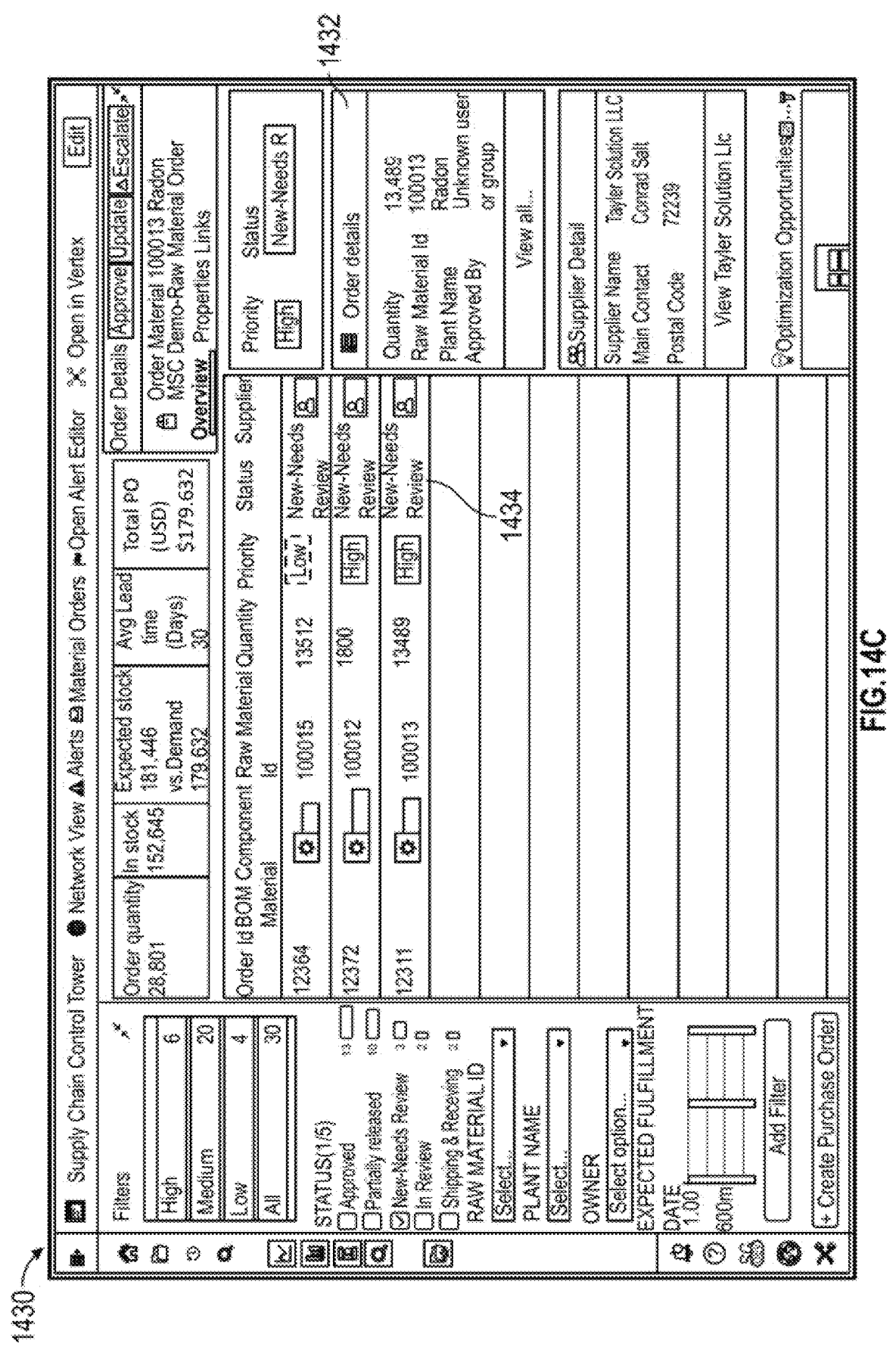

In response to a user selection of a recommended/suggested action, in an implementation the system may automatically perform one or more steps or actions in accordance with the selected recommended action. For example, following an example mentioned above, the user may select the systems recommended action for "order express delivery" as shown. In response to the user's selection, the system may automatically generate an express delivery order of materials for the user. The system may further provide the user with an updated user interface related to "material orders" which may indicate the generated order. Such an example user interface 1430 is shown in FIG. 14C. As shown, the system may indicate details associated with the order (e.g., as shown along right sidebar 1432), including a priority and a status. Via the user interface, the user may enter comments, tag the order for review by a particular user, or approve, update, or escalate the order.

In the present example user interface 1430, order status 1434 is "new—needs review", meaning that a human user needs to review and approve the order before it is sent out by the system. When the user approves the order, the system can record who approved the order, and then automatically connect to an order management system to execute the order. The order decision can also be written/fed back into one or more models or model training sets of the system to enable enrichment of models or algorithms for future recommendations based on end user decisions. The various material orders of the system may be filtered and sorted by the user for quick review.

In various implementations, simulations, optimizations, or models may be saved and/or shared with other users of the system, e.g., for review, approval, and/or implementation.

Figure 14D:
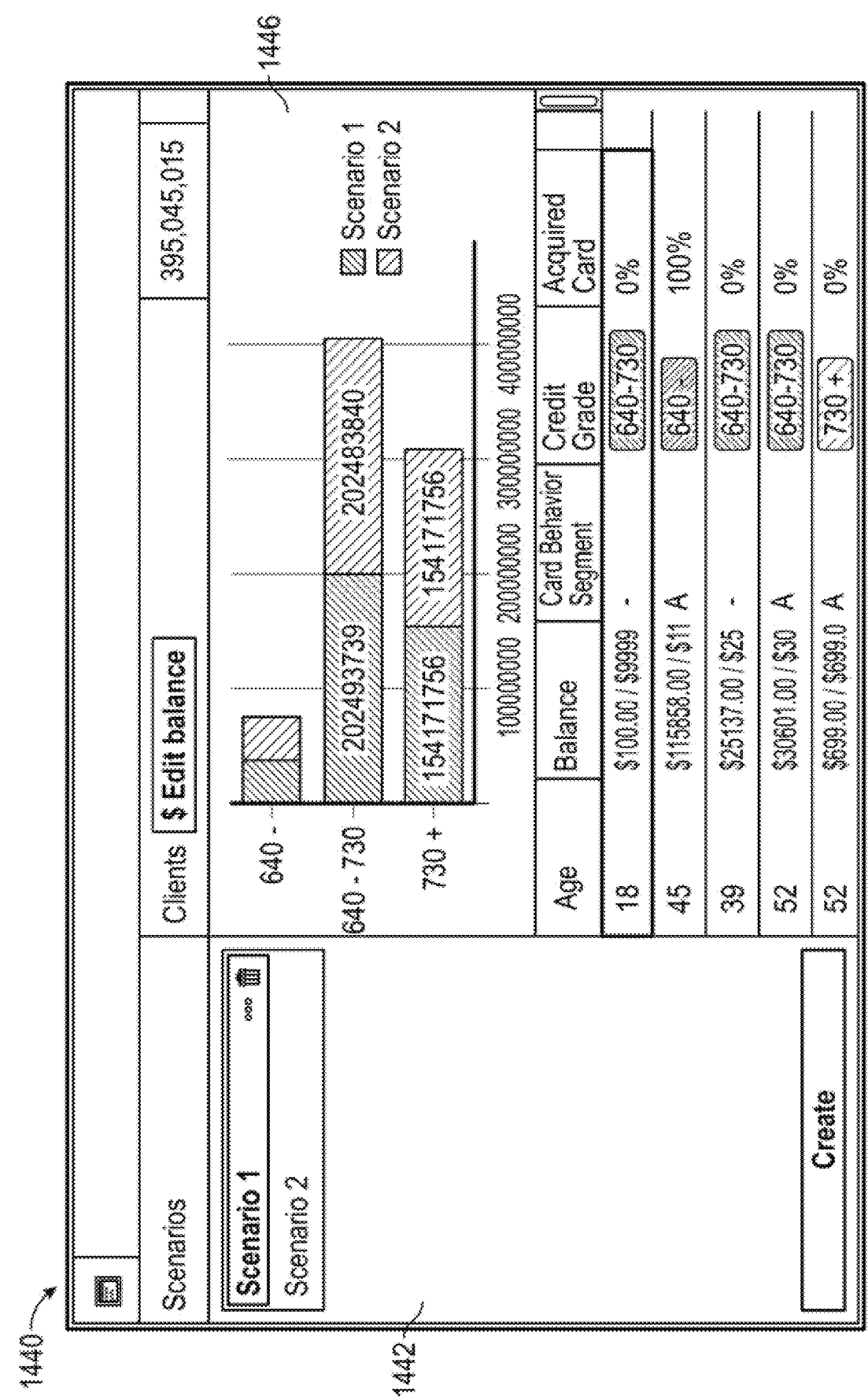

Referring to FIG. 14D, another example user interface 1440 is shown that may be used to execute multiple simulations/scenarios. Via sidebar 1442, the user may create any number of new scenarios/simulations. In the right portion of the GUI, the user may edit parameters associated with the selected scenario and/or review results of executing a simulation with the selected parameters. Columns of the table, such as column 1444, can show both the values before executing the simulation (or for a first simulation), and after executing the simulation (or for a second simulation), separated by a slash or other divider. Additionally, visualizations may be provided, such as bar chart 1446, that provide comparisons among scenarios/simulations.

As described herein, multiple models may be related to one another through a simulation engine. A GUI of the present disclosure (e.g., any of the graph-based, map-based, panel-based, optimization, and/or other GUIs of the present disclosure) can be used to run such simulations, including chaining multiple models in action together. In the supply chain example, the seasonal demand model and production model chained together can allow traversal of a complex supply chain, and allow the system to simulate outcomes associated with particular changes, such as the impact on on-time-delivery of finished goods if a particular supplier delivers only 50% of the expected raw material, and which customers would be most impacted. Values of parameters associated with various objects in the supply chain may be simulated by adjusting values in the columns of simulations tables described in reference to that various GUIs of the present disclosure. In response to adding a simulated value, the chain of models is executed and values of downstream objects are simulated.

Attributes such as changing the price of finished goods may also be simulated, such as to see how those might change the outcome. For example, a price reduction may be simulated to reveal an expected increase in customer demand and the expected raw material inventory going negative. A smaller price reduction may then be simulated to reveal a smaller increase in customer demand, which is more manageable than the expected customer demand increase associated with the larger price reduction, and the inventory dropping to near zero. Production capacity is also simulated and indicates that this simulated change will increase capacity from 85% to 95%.

Time series visualizations, as described herein, may be interactive and a time slider may be moved to simulate the interactions of all the models and impact on supply chains into the future. Nodes in the graph (e.g., representing particular suppliers, distribution centers, etc.) may change colors (e.g., turn red) to alert the user of potential problems in the supply chain, such as low inventory or unexpected increase in demand, as described herein.

Once the user identifies simulated changes that are suitable, the user can make the changes official by causing them to be implemented. Advantageously, the application interacts with the shared simulation layer and simulated outputs can be overlaid with historical values in a single click.

As another example, simulation/optimization and various GUIs of the present disclosure may be used to estimate cost of goods, e.g., for a type of good or for finished goods. For example, each step in a supply chain may be related in the system, and models may be associated with each step. Using the system, the user can, e.g., simulate changes to one of the values (e.g., cost of a particular part), and simulate the effect on final cost of goods. Similar simulations can be used on other fields, such as oil and gas, health care, shipping, etc.

As noted above, an optimization may be performed by evaluating thousands (or more) scenarios, with each scenario representing a different set of possible actions. For every scenario, a simulation chains together several models and calculates metrics, such as the one or more key metrics that are being optimized. One output of the optimization engine may be a set of actions associated with the optimal scenario, which may be presented as one or more recommendations to the user. Each scenario may be selectable by the user, which may initiate display of details regarding the selected scenario. For example, the actions may include the same types of simulated changes that a user may manually simulate, and may be accepted by the user in a similar manner as other simulated changes. Each action may include parameters, such as a name, description, logic (e.g., parameters that are searched in an optimization), a log of uses of the action, and/or the like. Thus, the optimization may present one or more recommended actions that optimize the business goals.

In various implementations, the various GUIs may be combined in various ways. In an example, a "management interface" can provide an overview of a supply chain network and high-level KPIs, and allow the user to drill down into specific areas. The data included in the management interface may be from several disparate global sources that previously would require use of several pieces of disconnected software.

When a supply chain analyst identifies a demand gap, excess inventory, or other issues, immediate corrective action can be taken via the GUIs of the present disclosure, such as by partially filling an order or reallocating stock. From there, a colleague in a distribution center may be alerted of this update and act on it.

Models may be mapped to the ontology to create a system-wide simulation engine that powers what-if analyses. Users at every level of the organization, from strategic to operational, can understand the potential outcomes and side effects of a decision as they are making it. For example, in the supply chain example, production and pricing models leverage data from raw materials and plant capacity, and determines production volume and customer demand estimates based on price changes. This type of model is often used by a supply chain manager to decide how much of particular refined products to make from raw materials. This model may be chained to a seasonal demand model to dynamically optimize the product catalogue for increased revenue.

X. Additional Example Operations of the System

Figure 15A:
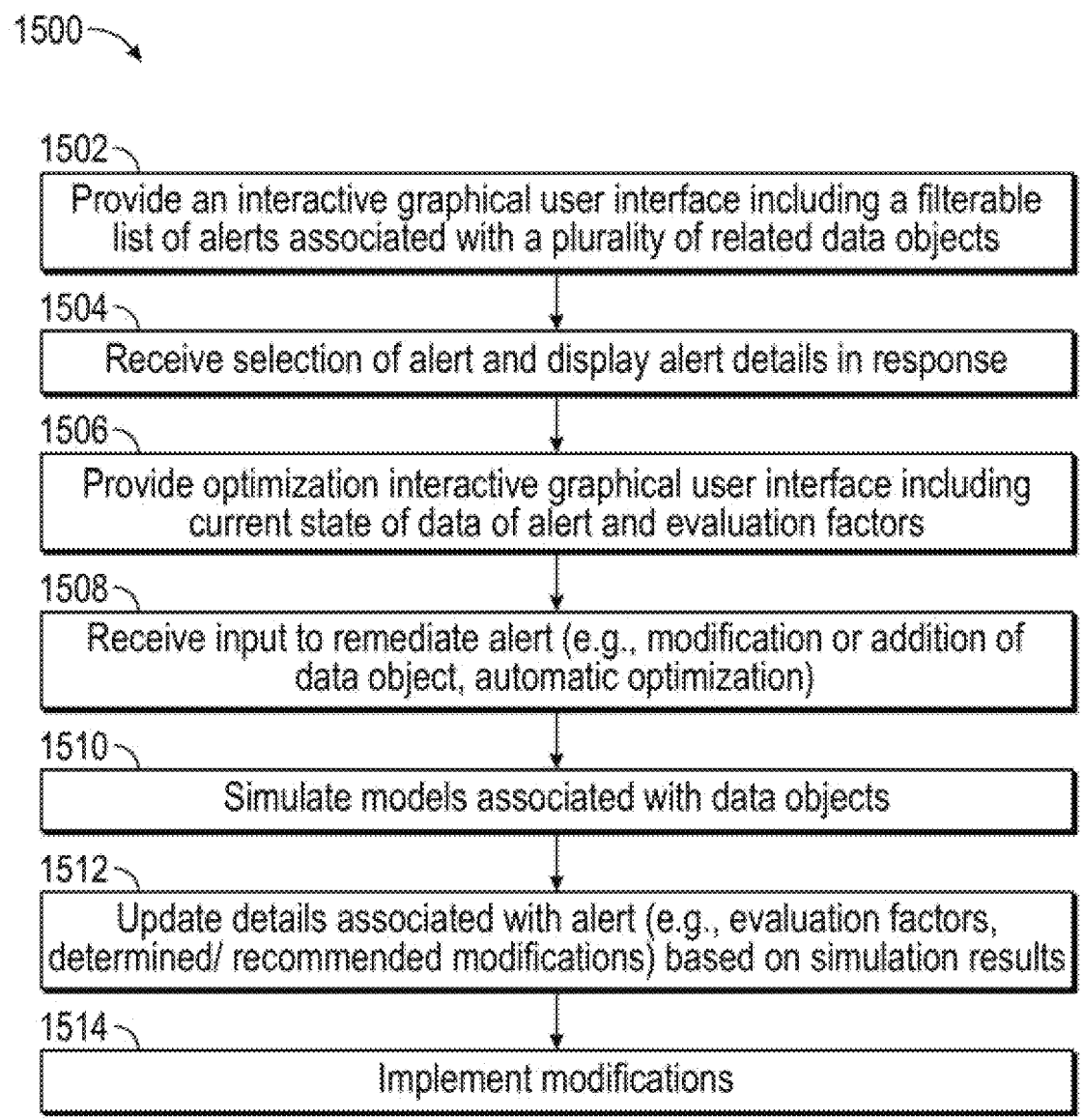
FIGS. 15A-15B show flowcharts illustrating additional example functionality of interactive graphical user interfaces of the system, according to one or more embodiments.
Figure 15B:
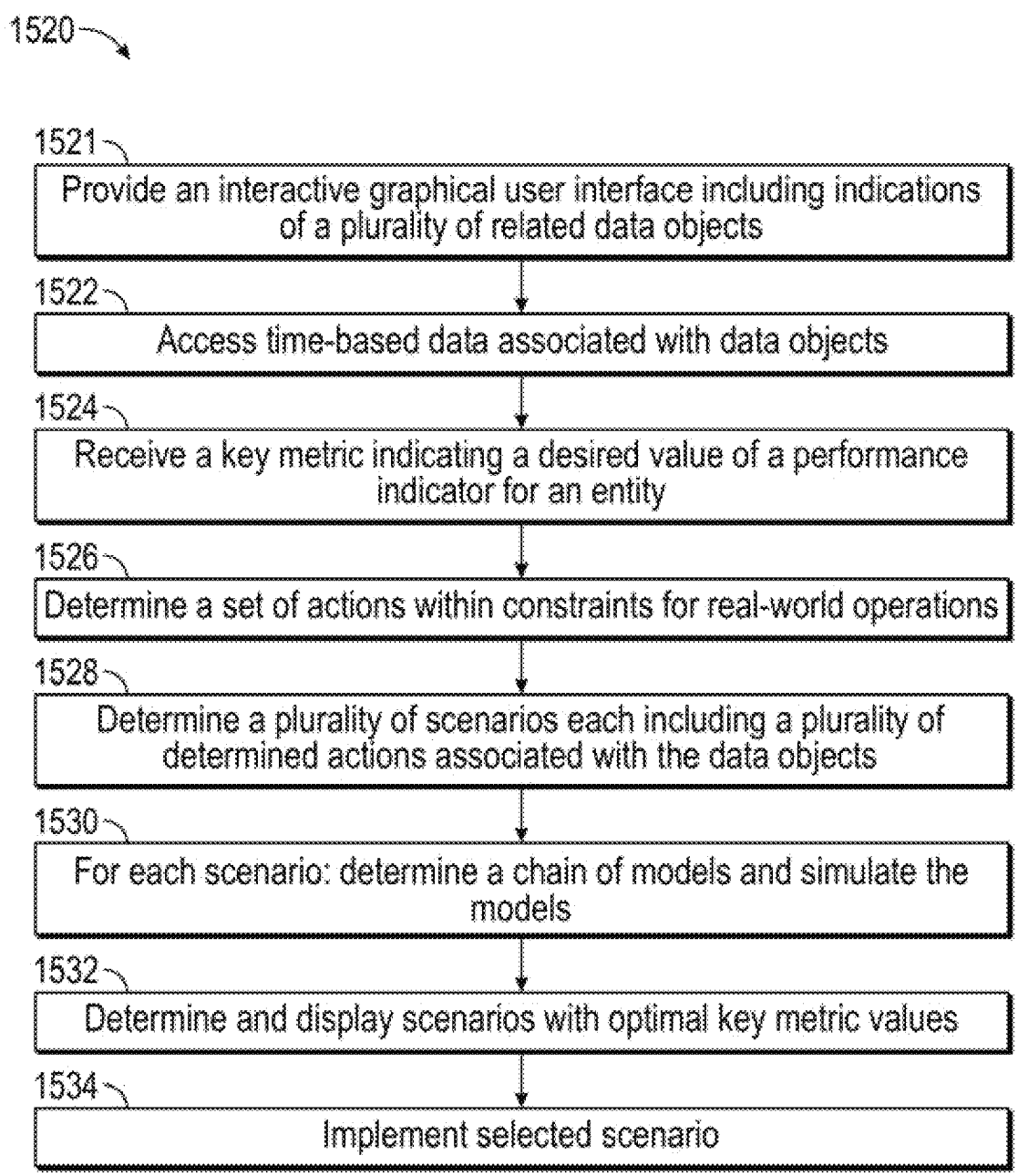

FIGS. 15A-15B are flowcharts 1500 and 1520 illustrating additional example functionality related to the interactive graphical user interfaces of the system, according to one or more embodiments. The blocks of the flowcharts illustrate example implementations, each block may be optional, and in various implementations various blocks may be rearranged, optional, and/or omitted, and/or additional blocks may be added. The example operations of the system illustrated in FIGS. 15A-15B may be implemented, for example, by the system optimization server 104 (e.g., the optimization component 116, the user interface generator 117, the model simulator 118, the subsystem simulator 119, and/or the object simulator 120) of FIG. 1.

Referring to FIG. 15A, at block 1502 the system provides an interactive GUI (e.g., any of the various GUIs described above or below) including at least a filterable list of alerts associated with a plurality of related data objects. At block 1504, the system receives a selection of an alert, and in response causes display of details associated with the alert.

At block 1506, optionally in response to a user input, the system provides an optimization GUI including a current state of data associated with an alert, and/or a related simulation or set of objects, and indications of evaluation factors associated with the alert, and/or the related simulation or set of objects. At block 1508, the system receives an input to remediate the alert, which may include a modification or addition to the objects (e.g., a change to, or an addition of, an order), or a selection to automatically optimize based on one or more goals or targets (e.g., a KPI, a global optimization goal, or based on cost, time, or sustainability). In various implementations, the user may additionally set one or more constraints, or set one or more parameter values.

At block 1510, the system simulates models associated with the data objects. The simulation may be based on a point in time. Simulating the models may be performed as described above in reference to, e.g., FIGS. 5-7 and 11A-11B. Simulating the models may include accessing models related with the data objects and time-based data related with the data objects. Simulating the models may also include, based on the simulations, determining property values associated with the objects. Simulating the models may be performed in response to, for example, selecting a button, a user input, a display of a GUI, adding nodes to a GUI, selecting a point in time, running a simulation, running an optimization/mitigation, and/or the like.

As described herein, the simulation may include multiple simulations or scenarios, and each may include chaining of multiple models. Thus, simulating the models may include determining such multiple scenarios and chained models, and may also include targeting particular goals or metrics, varying parameters in each scenario, and evaluating the results of the simulations/scenarios to determine recommended actions that most closely achieve the goals.

In various implementations, the user may select the one or more models, and one or more parameters (e.g., inputs and outputs) for the respective models. Further, the user may set certain parameter values, which may comprise constraints on the simulation/model.

At block 1512, the system updates details, e.g., evaluation factors in the GUI, associated with the alert/simulation/objects/etc. The details may also include one or more recommended actions. The details may include one or more parameter values, which may be displayed in respective rows of a simulation table. Such updated details are based on the simulation results.

At block 1514, the system may implement one or more modifications/recommended actions, e.g., automatically or in response to a user input selection.

Referring to FIG. 15B, at block 1521 the system provides an interactive GUI (e.g., any of the various GUIs described above or below) including at least indications of a plurality of related data objects. At block 1522, the system can access time-based data associated with the data objects. At block 1524, the system receives a key metric and/or an optimization goal indicating, for example, a desired value of a performance indicator for an entity, or an optimization preference. At block 1526, the system can determine a set of actions within constraints for real-world operations. Alternatively, or in addition, the system can receive a set of constraints from a user.

At block 1528, the system can determine a plurality of scenarios, each including a plurality of determined actions associated with the data objects. Such scenarios can comprise modification or variations of various parameters in the respective scenarios/simulations. Such modifications or variations can be random, or based on random variables.

At block 1530, for each scenario, the system determines a chain of one or more models, and runs simulations based on the models. The simulations may be based on a point in time. Simulating the models may be performed as described above in reference to, e.g., FIGS. 5-7 and 11A-11B. Simulating the models may include accessing models related with the data objects and time-based data related with the data objects. Simulating the models may also include, based on the simulations, determining property values associated with the objects. Simulating the models may be performed in response to, for example, selecting a button, a user input, a display of a GUI, adding nodes to a GUI, selecting a point in time, running a simulation, running an optimization/mitigation, and/or the like.

As described herein, the simulations may include multiple simulations or scenarios, and each may include chaining of multiple models. Thus, simulating the models may include determining such multiple scenarios and chained models, and may also include targeting particular goals or metrics, varying parameters in each scenario, and evaluating the results of the simulations/scenarios to determine recommended actions that most closely achieve the goals.

In various implementations, the user may select the one or more models, and one or more parameters (e.g., inputs and outputs) for the respective models. Further, the user may set certain parameter values, which may comprise constraints on the simulation/model.

In various implementations, determining a chain of one or more models may include, for example, obtaining a plurality of models, wherein the plurality of models comprises a first model and a second model, and wherein each of the first and second models comprises at least one or more objects having one or more object properties; simulating the first and second models to obtain a parameter output node of the first model and a parameter input node of the second model; training an artificial intelligence model using the parameter output and input nodes, wherein the artificial intelligence model, when executed, predicts that the parameter output node is related to the parameter input node; chaining the first and second models by linking the parameter output node with the parameter input node; and optimizing the chained first and second models by recurrently linking related parameter output nodes with related parameter input nodes; and/or optimizing the chained first and second models by iteratively optimizing a converging series of the chained first and second models. Further details related to such chaining of models was provided above.

At block 1532, the system may determine and display a listing of scenarios with optimal key metrics. Such a listing may comprise a listing of recommended actions to achieve a goal or target. The system may also update details, e.g., evaluation factors in the GUI, associated with the alert/simulation/objects/etc. The details may also include one or more recommended actions. The details may include one or more parameter values, which may be displayed in respective rows of a simulation table. Such updated details are based on the simulation results.

At block 1534, the system may implement one or more scenarios/modifications/recommended actions, e.g., automatically or in response to a user input selection. In some implementations and/or use cases, a recommendation may comprise creating a new order, e.g., a material order. Implementing the action, such as generating a material order, may be reviewable by the user prior to execution.

In various implementations, the system may also include functionality to link from a GUI of the system, and for a selected object (or group of selected objects), to another application to view data associated with the object (or group of objects) in that other application.

In various implementations, the system may also determine updated alerts associated with objects based on updated time-based data, simulations, a newly selected point in time, and/or the like. Such updated alerts may be displayed in the GUI in various ways, as described above.

In various implementations, a scenario comprises a "fork" or "branch" of the data in an ontology generated by applying one or more actions and evaluation of a set of models. A fork can contain only the edits or deltas from the base ontology including modified object properties, created objects, deleted objects, created relations/links, and deleted relations/links. In some implementations, a scenario is immutable once created. In such implementations, to "modify" a scenario, a new scenario is created with a modified set of actions or models.

In various implementations, a model is a function that estimates object properties given other object properties. A model can be used to estimate or forecast unknown values in the ontology. In a scenario, a model may also be used to estimate the expected value of a property given a set of actions. An action can represent a change to make directly to the ontology, like an independent variable. A model can represent an expectation of a change which is not directly controlled, like a dependent variable.

XI. Additional Implementation Details and Embodiments

In an implementation the system (e.g., one or more aspects of the computing environment 100, the system optimization server 104, and/or the like) may comprise, or be implemented in, a "virtual computing environment". As used herein, the term "virtual computing environment" should be construed broadly to include, for example, computer readable program instructions executed by one or more processors (e.g., as described in the example of FIG. 3) to implement one or more aspects of the modules and/or functionality described herein. Further, in this implementation, one or more services/modules/engines/etc. of the system may be understood as comprising one or more rules engines of the virtual computing environment that, in response to inputs received by the virtual computing environment, execute rules and/or other program instructions to modify operation of the virtual computing environment. For example, a request received from the user computing device 108 may be understood as modifying operation of the virtual computing environment to cause the request access to a resource from the system. Such functionality may comprise a modification of the operation of the virtual computing environment in response to inputs and according to various rules. Other functionality implemented by the virtual computing environment (as described throughout this disclosure) may further comprise modifications of the operation of the virtual computing environment, for example, the operation of the virtual computing environment may change depending on the information gathered by the system. Initial operation of the virtual computing environment may be understood as an establishment of the virtual computing environment. In some implementations the virtual computing environment may comprise one or more virtual machines, containers, and/or other types of emulations of computing systems or environments. In some implementations the virtual computing environment may comprise a hosted computing environment that includes a collection of physical computing resources that may be remotely accessible and may be rapidly provisioned as needed (commonly referred to as "cloud" computing environment).

Implementing one or more aspects of the system as a virtual computing environment may advantageously enable executing different aspects or modules of the system on different computing devices or processors, which may increase the scalability of the system. Implementing one or more aspects of the system as a virtual computing environment may further advantageously enable sandboxing various aspects, data, or services/modules of the system from one another, which may increase security of the system by preventing, e.g., malicious intrusion into the system from spreading. Implementing one or more aspects of the system as a virtual computing environment may further advantageously enable parallel execution of various aspects or modules of the system, which may increase the scalability of the system. Implementing one or more aspects of the system as a virtual computing environment may further advantageously enable rapid provisioning (or de-provisioning) of computing resources to the system, which may increase scalability of the system by, e.g., expanding computing resources available to the system or duplicating operation of the system on multiple computing resources. For example, the system may be used by thousands, hundreds of thousands, or even millions of users simultaneously, and many megabytes, gigabytes, or terabytes (or more) of data may be transferred or processed by the system, and scalability of the system may enable such operation in an efficient and/or uninterrupted manner.

Various embodiments of the present disclosure may be a system, a method, and/or a computer program product at any possible technical detail level of integration. The computer program product may include a computer readable storage medium (or mediums) having computer readable program instructions thereon for causing a processor to carry out aspects of the present disclosure.

For example, the functionality described herein may be performed as software instructions are executed by, and/or in response to software instructions being executed by, one or more hardware processors and/or any other suitable computing devices. The software instructions and/or other executable code may be read from a computer readable storage medium (or mediums). Computer readable storage mediums may also be referred to herein as computer readable storage or computer readable storage devices.

The computer readable storage medium can be a tangible device that can retain and store data and/or instructions for use by an instruction execution device. The computer readable storage medium may be, for example, but is not limited to, an electronic storage device (including any volatile and/or non-volatile electronic storage devices), a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a solid state drive, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions (as also referred to herein as, for example, "code," "instructions," "module," "application," "software application," and/or the like) for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. Computer readable program instructions may be callable from other instructions or from itself, and/or may be invoked in response to detected events or interrupts. Computer readable program instructions configured for execution on computing devices may be provided on a computer readable storage medium, and/or as a digital download (and may be originally stored in a compressed or installable format that requires installation, decompression or decryption prior to execution) that may then be stored on a computer readable storage medium. Such computer readable program instructions may be stored, partially or fully, on a memory device (e.g., a computer readable storage medium) of the executing computing device, for execution by the computing device. The computer readable program instructions may execute entirely on a user's computer (e.g., the executing computing device), partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart(s) and/or block diagram(s) block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks. For example, the instructions may initially be carried on a magnetic disk or solid state drive of a remote computer. The remote computer may load the instructions and/or modules into its dynamic memory and send the instructions over a telephone, cable, or optical line using a modem. A modem local to a server computing system may receive the data on the telephone/cable/optical line and use a converter device including the appropriate circuitry to place the data on a bus. The bus may carry the data to a memory, from which a processor may retrieve and execute the instructions. The instructions received by the memory may optionally be stored on a storage device (e.g., a solid state drive) either before or after execution by the computer processor.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a service, module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. In addition, certain blocks may be omitted in some implementations. The methods and processes described herein are also not limited to any particular sequence, and the blocks or states relating thereto can be performed in other sequences that are appropriate.

It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. For example, any of the processes, methods, algorithms, elements, blocks, applications, or other functionality (or portions of functionality) described in the preceding sections may be embodied in, and/or fully or partially automated via, electronic hardware such application-specific processors (e.g., application-specific integrated circuits (ASICs)), programmable processors (e.g., field programmable gate arrays (FPGAs)), application-specific circuitry, and/or the like (any of which may also combine custom hard-wired logic, logic circuits, ASICs, FPGAs, etc. with custom programming/execution of software instructions to accomplish the techniques).

Any of the above-mentioned processors, and/or devices incorporating any of the above-mentioned processors, may be referred to herein as, for example, "computers," "computer devices," "computing devices," "hardware computing devices," "hardware processors," "processing units," and/or the like. Computing devices of the above-embodiments may generally (but not necessarily) be controlled and/or coordinated by operating system software, such as Mac OS, iOS, Android, Chrome OS, Windows OS (e.g., Windows XP, Windows Vista, Windows 7, Windows 8, Windows 10, Windows 11, Windows Server, etc.), Windows CE, Unix, Linux, SunOS, Solaris, Blackberry OS, VxWorks, or other suitable operating systems. In other embodiments, the computing devices may be controlled by a proprietary operating system. Conventional operating systems control and schedule computer processes for execution, perform memory management, provide file system, networking, I/O services, and provide a user interface functionality, such as a graphical user interface, among other things.

Figure 3:
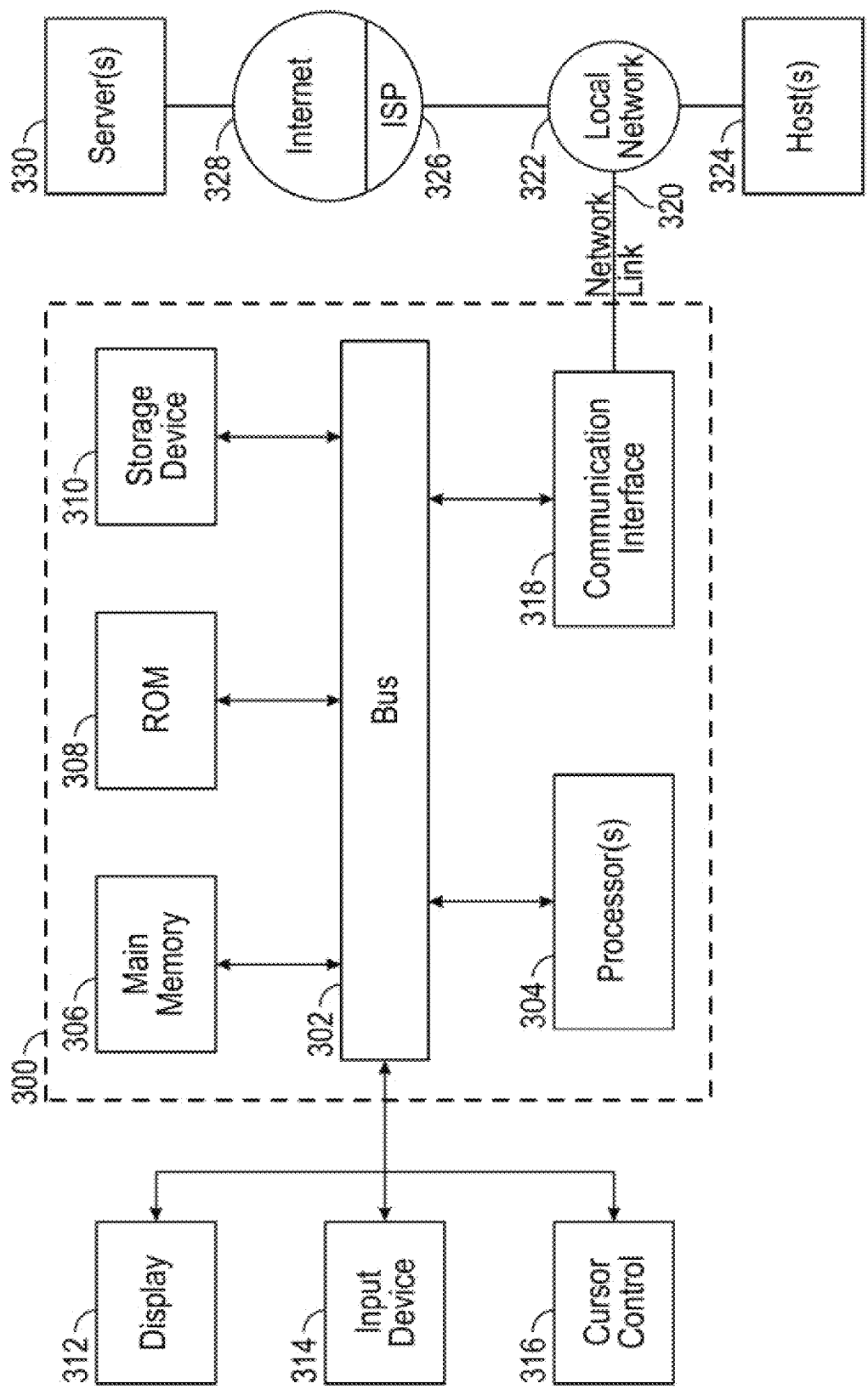
FIG. 3 shows a block diagram illustrating an example computer system upon which various embodiments may be implemented.

For example, FIG. 3 shows a block diagram that illustrates an example computer system 300 upon which various embodiments may be implemented. Computer system 300 includes a bus 302 or other communication mechanism for communicating information, and a hardware processor, or multiple processors, 304 coupled with bus 302 for processing information. Hardware processor(s) 304 may be, for example, one or more general purpose microprocessors.

Computer system 300 also includes a main memory 306, such as a random access memory (RAM), cache and/or other dynamic storage devices, coupled to bus 302 for storing information and instructions to be executed by processor 304. Main memory 306 also may be used for storing temporary variables or other intermediate information during execution of instructions to be executed by processor 304. Such instructions, when stored in storage media accessible to processor 304, render computer system 300 into a special-purpose machine that is customized to perform the operations specified in the instructions.

Computer system 300 further includes a read only memory (ROM) 308 or other static storage device coupled to bus 302 for storing static information and instructions for processor 304. A storage device 310, such as a magnetic disk, optical disk, or USB thumb drive (Flash drive), etc., is provided and coupled to bus 302 for storing information and instructions.

Computer system 300 may be coupled via bus 302 to a display 312, such as a cathode ray tube (CRT) or LCD display (or touch screen), for displaying information to a computer user. An input device 314, including alphanumeric and other keys, is coupled to bus 302 for communicating information and command selections to processor 304. Another type of user input device is cursor control 316, such as a mouse, a trackball, or cursor direction keys for communicating direction information and command selections to processor 304 and for controlling cursor movement on display 312. This input device typically has two degrees of freedom in two axes, a first axis (e.g., x) and a second axis (e.g., y), that allows the device to specify positions in a plane. In some embodiments, the same direction information and command selections as cursor control may be implemented via receiving touches on a touch screen without a cursor.

Computer system 300 may include a user interface module to implement a GUI that may be stored in a mass storage device as computer executable program instructions that are executed by the computing device(s). Computer system 300 may further, as described below, implement the techniques described herein using customized hard-wired logic, one or more ASICs or FPGAs, firmware and/or program logic which in combination with the computer system causes or programs computer system 300 to be a special-purpose machine. According to one embodiment, the techniques herein are performed by computer system 300 in response to processor(s) 304 executing one or more sequences of one or more computer readable program instructions contained in main memory 306. Such instructions may be read into main memory 306 from another storage medium, such as storage device 310. Execution of the sequences of instructions contained in main memory 306 causes processor(s) 304 to perform the process steps described herein. In alternative embodiments, hard-wired circuitry may be used in place of or in combination with software instructions.

Various forms of computer readable storage media may be involved in carrying one or more sequences of one or more computer readable program instructions to processor 304 for execution. For example, the instructions may initially be carried on a magnetic disk or solid state drive of a remote computer. The remote computer can load the instructions into its dynamic memory and send the instructions over a telephone line using a modem. A modem local to computer system 300 can receive the data on the telephone line and use an infra-red transmitter to convert the data to an infra-red signal. An infra-red detector can receive the data carried in the infra-red signal and appropriate circuitry can place the data on bus 302. Bus 302 carries the data to main memory 306, from which processor 304 retrieves and executes the instructions. The instructions received by main memory 306 may optionally be stored on storage device 310 either before or after execution by processor 304.

Computer system 300 also includes a communication interface 318 coupled to bus 302. Communication interface 318 provides a two-way data communication coupling to a network link 320 that is connected to a local network 322. For example, communication interface 318 may be an integrated services digital network (ISDN) card, cable modem, satellite modem, or a modem to provide a data communication connection to a corresponding type of telephone line. As another example, communication interface 318 may be a local area network (LAN) card to provide a data communication connection to a compatible LAN (or WAN component to communicated with a WAN). Wireless links may also be implemented. In any such implementation, communication interface 318 sends and receives electrical, electromagnetic or optical signals that carry digital data streams representing various types of information.

Network link 320 typically provides data communication through one or more networks to other data devices. For example, network link 320 may provide a connection through local network 322 to a host computer 324 or to data equipment operated by an Internet Service Provider (ISP) 326. ISP 326 in turn provides data communication services through the world wide packet data communication network now commonly referred to as the "Internet" 328. Local network 322 and Internet 328 both use electrical, electromagnetic or optical signals that carry digital data streams. The signals through the various networks and the signals on network link 320 and through communication interface 318, which carry the digital data to and from computer system 300, are example forms of transmission media.

Computer system 300 can send messages and receive data, including program code, through the network(s), network link 320 and communication interface 318. In the Internet example, a server 330 might transmit a requested code for an application program through Internet 328, ISP 326, local network 322 and communication interface 318.

The received code may be executed by processor 304 as it is received, and/or stored in storage device 310, or other non-volatile storage for later execution.

As described above, in various embodiments certain functionality may be accessible by a user through a web-based viewer (such as a web browser), or other suitable software program). In such implementations, the user interface may be generated by a server computing system and transmitted to a web browser of the user (e.g., running on the user's computing system). Alternatively, data (e.g., user interface data) necessary for generating the user interface may be provided by the server computing system to the browser, where the user interface may be generated (e.g., the user interface data may be executed by a browser accessing a web service and may be configured to render the user interfaces based on the user interface data). The user may then interact with the user interface through the web-browser. User interfaces of certain implementations may be accessible through one or more dedicated software applications. In certain embodiments, one or more of the computing devices and/or systems of the disclosure may include mobile computing devices, and user interfaces may be accessible through such mobile computing devices (for example, smartphones and/or tablets).

In some embodiments, an alert and/or notification is automatically transmitted to the user device operated by the entity associated with the alert and/or notification from the system (e.g. system simulation server and/or physical or logical system). The alert and/or notification can be transmitted at the time that the alert and/or notification is generated or at some determined time after generation of the alert and/or notification. When received by the user device, the alert and/or notification can cause the user device to display the alert and/or notification via the activation of an application on the user device (e.g., a browser, a mobile application, etc.). For example, receipt of the alert and/or notification may automatically activate an application on the user device, such as a messaging application (e.g., SMS or MMS messaging application), a standalone application (e.g., a data analysis application), or a browser, for example, and display information included in the alert and/or notification. If the user device is offline when the alert and/or notification is transmitted, the application may be automatically activated when the user device is online such that the alert and/or notification is displayed. As another example, receipt of the alert and/or notification may cause a browser to open and be redirected to a login page so that the entity can log and view the alert and/or notification. Alternatively, the alert and/or notification may include a URL of a webpage (or other online information) associated with the alert and/or notification, such that when the user device (e.g., a mobile device) receives the alert, a browser (or other application) is automatically activated and the URL included in the alert and/or notification is accessed via the Internet.

Many variations and modifications may be made to the above-described embodiments, the elements of which are to be understood as being among other acceptable examples. All such modifications and variations are intended to be included herein within the scope of this disclosure. The foregoing description details certain embodiments. It will be appreciated, however, that no matter how detailed the foregoing appears in text, the systems and methods can be practiced in many ways. As is also stated above, it should be noted that the use of particular terminology when describing certain features or aspects of the systems and methods should not be taken to imply that the terminology is being re-defined herein to be restricted to including any specific characteristics of the features or aspects of the systems and methods with which that terminology is associated.

The systems, methods, and devices described herein each have several aspects, no single one of which is solely responsible for its desirable attributes. Without limiting the scope of this disclosure, several non-limiting features will now be discussed briefly. The following paragraphs describe various example implementations of the devices, systems, and methods described herein. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

In some embodiments, the technical objects may comprise physical or virtual measuring devices or sensors coupled to physical or virtual technical items or products, pumps, machinery, welding stations, vats, containers, compressors, fans, turbines, blowers, air conditioning systems, heating systems, noise and attenuation systems, ventilation systems, hydraulic systems, pneumatic systems, actuators, fasteners, threads, piping systems, valves, beams, columns, cables, nozzles, semiconductor devices, motors, transformers, electrical components, wires, generators, nuclear reactors, items or products, organizations, countries, counties, factories, customers, hospitals, or other objects relevant to the pertaining model.

In some embodiments, the one or more object properties may be numerical, physical, geometrical, inferred, real, simulated, or virtual. Further the object properties may comprise of logical computations related to order volume, sales amounts, sales quantity during a time period (e.g., a day, a week, a year, etc.), population density, patient volume, or other object properties relevant to the pertaining model. Alternatively or in addition, the technical object properties may comprise of measurements related to temperature, pressure, flow rate, capacity, time, length, mass, electric current, amount of substance, luminous intensity, plane angle, solid angle, frequency, energy, power, charge, voltage, capacitance, resistance, conductance, flux, inductance, radioactivity, dose, catalytic activity, area, volume, speed, acceleration, density, or other object properties relevant to the pertaining model.

In some embodiments, the data resulting from the simulation of multiple models may comprise of historical object data, historical object property data, live object data, live object property data, predicted object data and predicted object property data.

In some embodiments, the given period of time the trend panel displays for one or more object properties of an object may comprise of seconds, minutes, hours, days, weeks, or years.

In some embodiments, the state of a technical object may comprise of open, closed, running above specification, running below specification, in repair, broken, or other like status indicators relevant to the pertaining model.

In some embodiments, the events that occurred in association with an technical object may comprise weather events, maintenance events, or other like events relevant to the pertaining model.

Aspects of the present disclosure are described herein with reference to Application Programming Interfaces. Various third-parties operate electronic services systems which in some instances, these systems may allow access through APIs. Typically, each API requires its own set of information about a data object, such as name, age, and height for a data object representing a person. Advantageously, embodiments of the present disclosure may collect information related to a data object, form API requests in the format and containing the information required by the API of each third-party ("third-party format"), collect responses from the API of each third-party, translate the different results back into a uniform format that facilitates comparison, storage and/or processing ("common format"), and show the results to the user. For example, different third-parties may require different types of information, and in different format; for example, third-party A may require a data object's name and age properties, whereas third-party B may require an a data object's age and height properties but not name.

Advantageously, rather than presenting the user with different third-parties' requests to provide different information repeatedly, the system may retrieve the required information from its database and automatically convert it into the format expected by the third-party. Advantageously, the system may then also convert the individual responses received from each API, which may again be in a third-party-specific format, into a common format that may facilitate comparison by the user. Similarly, various embodiments may use external APIs to access other services.

Conditional language, such as, among others, "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

The term "substantially" when used in conjunction with the term "real-time" forms a phrase that will be readily understood by a person of ordinary skill in the art. For example, it is readily understood that such language will include speeds in which no or little delay or waiting is discernible, or where such delay is sufficiently short so as not to be disruptive, irritating, or otherwise vexing to a user.

Conjunctive language such as the phrase "at least one of X, Y, and Z," or "at least one of X, Y, or Z," unless specifically stated otherwise, is to be understood with the context as used in general to convey that an item, term, etc. may be either X, Y, or Z, or a combination thereof. For example, the term "or" is used in its inclusive sense (and not in its exclusive sense) so that when used, for example, to connect a list of elements, the term "or" means one, some, or all of the elements in the list. Thus, such conjunctive language is not generally intended to imply that certain embodiments require at least one of X, at least one of Y, and at least one of Z to each be present.

The term "a" as used herein should be given an inclusive rather than exclusive interpretation. For example, unless specifically noted, the term "a" should not be understood to mean "exactly one" or "one and only one"; instead, the term "a" means "one or more" or "at least one," whether used in the claims or elsewhere in the specification and regardless of uses of quantifiers such as "at least one," "one or more," or "a plurality" elsewhere in the claims or specification.

The term "comprising" as used herein should be given an inclusive rather than exclusive interpretation. For example, a general purpose computer comprising one or more processors should not be interpreted as excluding other computer components, and may possibly include such components as memory, input/output devices, and/or network interfaces, among others.

While the above detailed description has shown, described, and pointed out novel features as applied to various embodiments, it may be understood that various omissions, substitutions, and changes in the form and details of the devices or processes illustrated may be made without departing from the spirit of the disclosure. As may be recognized, certain embodiments of the inventions described herein may be embodied within a form that does not provide all of the features and benefits set forth herein, as some features may be used or practiced separately from others. The scope of certain inventions disclosed herein is indicated by the appended claims rather than by the foregoing description. All changes which come within the meaning and range of equivalency of the claims are to be embraced within their scope.

XII. Example Clauses

Examples of the implementations of the present disclosure can be described in view of the following example clauses. The features recited in the below example implementations can be combined with additional features disclosed herein. Furthermore, additional inventive combinations of features are disclosed herein, which are not specifically recited in the below example implementations, and which do not include the same features as the specific implementations below. For sake of brevity, the below example implementations do not identify every inventive aspect of this disclosure. The below example implementations are not intended to identify key features or essential features of any subject matter described herein. Any of the example clauses below, or any features of the example clauses, can be combined with any one or more other example clauses, or features of the example clauses or other features of the present disclosure.

Clause 1: A computer-implemented method comprising, by one or more hardware processors executing program instructions: providing an interactive user interface including: a plurality of nodes (and/or objects) and indications of links among the plurality of nodes, and a user interface element for selecting a date and/or time; accessing time-based data associated with one or more of the plurality of nodes for a selected date and/or time; altering an appearance of the one or more of the plurality of nodes based at least in part on the accessed time-based data; receiving, from a user, a key metric indicating a desired value of a performance indicator of an entity; determining a set of actions that are within constraints for real-world operations of the entity; determining a plurality of scenarios, each scenario including a plurality of the determined actions; for each scenario: determining a chain of one or more models that are executable to predict a value of the key metric based on the plurality of actions of the particular scenario; simulating the chain of models to determine a simulated key metric value; determining one or more scenarios having optimal simulated key metric values; and displaying an indication of the one or more scenarios.

Clause 2: The method of Clause 2, wherein each of the displayed scenarios is selectable by the user to cause display of the actions associated with the scenario.

Clause 3: The method of Clause 2 further comprising: in response to selection of a first scenario of the displayed scenarios, implementing the actions associated with the scenario.

Clause 4: The method of Clause 3, wherein implementing the actions associated with the scenario includes generating a material order, the material order being reviewable and editable by the user.

Clause 5: The method of Clause 1, wherein said determining a chain of one or more models comprises: obtaining a plurality of models, wherein the plurality of models comprises a first model and a second model, and wherein each of the first and second models comprises at least one or more objects having one or more object properties; simulating the first and second models to obtain a parameter output node of the first model and a parameter input node of the second model; training an artificial intelligence model using the parameter output and input nodes, wherein the artificial intelligence model, when executed, predicts that the parameter output node is related to the parameter input node; chaining the first and second models by linking the parameter output node with the parameter input node; and optimizing the chained first and second models by recurrently linking related parameter output nodes with related parameter input nodes; and/or optimizing the chained first and second models by iteratively optimizing a converging series of the chained first and second models.

Clause 6: The method of Clause 1, wherein said obtaining a plurality of models comprises: receiving user input selecting the plurality of models.

Clause 7: The method of Clause 1, wherein one or more of: the simulating is based at least in part on time-based data associated with one or more nodes; the simulating is based at least in part on one or more models; a user specifies one or more values and/or parameters associated with models used in running the simulation; user interface elements are displayed to enable a user to view simulation information; and/or a comparison between two or more simulation is displayed.

Clause 8: The method of any of Clauses 1-7, wherein the interactive user interface comprises a graph-based interactive user interface.

Clause 9: The method of any of Clauses 1-7, wherein the interactive user interface comprises a map-based interactive user interface.

Clause 10: The method of any of Clauses 1-7, wherein the interactive user interface comprises a panel-based interactive user interface.

Clause 11: The method of any of Clauses 1-7, wherein the interactive user interface comprises any combination graph-, map-, or panel-based interactive user interfaces.

Clause 12: The method of any of Clauses 8-11 further comprising: displaying movement of data and/or items among the plurality of objects and/or nodes based at least in part on the accessed time-based data.

Clause 13: The method of any of Clauses 8-12 further comprising: determining alerts associated with objects and/or nodes based on time-based data and/or other data associated with the objects and/or nodes; determining updated alerts associated with objects and/or nodes based on time-based data and/or other data associated with the objects and/or nodes after application of a scenario; indicating, in the interactive user interface, objects and/or nodes with which alerts are associated.

Clause 14: The method of any of Clauses 8-13 further comprising: enabling linking from the interactive user interface to another related interactive user interface of another type.

Clause 15: The method of Clause 14, wherein the linking includes the user selecting a particular object and/or node with which alerts are associated, and linking to a panel-based interactive user interface that displays details of the associated alerts.

Clause 16: A computer-implemented method comprising, by one or more hardware processors executing program instructions: providing a graph-based interactive user interface including: a plurality of nodes (and/or objects) and indications of links among the plurality of nodes, and a user interface element for selecting a date and/or time; accessing time-based data associated with one or more of the plurality of nodes for a selected date and/or time; and altering an appearance of the one or more of the plurality of nodes based at least in part on the accessed time-based data.

Clause 17: The computer-implemented method of Clause 16, wherein: the graph-based interactive user interface further includes: a user interface element for causing display of time-based data associated with one or more of the plurality of nodes.

Clause 18: The computer-implemented method of any of Clauses 16-17 further comprising, by the one or more hardware processors executing program instructions: enabling user interaction with the graph-based interactive user interface by which a user may edit the plurality of nodes, the indications of links among the plurality of nodes, locations of the plurality of nodes, properties associated with the plurality of nodes, and/or the like.

Clause 19: The computer-implemented method of any of Clauses 16-18 further comprising, by the one or more hardware processors executing program instructions: in response to a user input, adding a node to the graph-based interactive user interface.

Clause 20: The computer-implemented method of any of Clauses 16-19 further comprising, by the one or more hardware processors executing program instructions: in response to a user input, adding one or more nodes to the graph-based interactive user interface that are related to a selected node.

Clause 21: The computer-implemented method of Clause 20, wherein: the added one or more nodes are identified based at least in part on a relationship or link, or and ontology.

Clause 22: The computer-implemented method of any of Clauses 16-21, wherein: the nodes of the plurality of nodes may represent one or more of: objects, groups of objects, subgraphs, and/or the like.

Clause 23: The computer-implemented method of any of Clauses 16-22, wherein: the graph-based interactive user interface further includes: a histogram displaying properties common among one or more selected nodes of the plurality of nodes.

Clause 24: The computer-implemented method of Clause 23, wherein: the user may filter the selected nodes via histogram selection such that the selected nodes either comprise nodes that satisfy the selected properties in the histogram, or comprise nodes that do not satisfy the selected properties in the histogram.

Clause 25: The computer-implemented method of any of Clauses 16-24 further comprising, by the one or more hardware processors executing program instructions: in response to a user input, grouping one or more nodes of the plurality of nodes into a single node in the graph-based interactive user interface.

Clause 26: The computer-implemented method of any of Clauses 16-25 further comprising, by the one or more hardware processors executing program instructions: in response to a user input, creating a subgraph comprising one or more nodes, and displaying the subgraph as a single node in the graph-based interactive user interface.

Clause 27: The computer-implemented method of any of Clauses 16-26, wherein: altering the appearance of the one or more of the plurality of nodes comprises coloring, highlighting, and/or the like.

Clause 28: The computer-implemented method of any of Clauses 16-27, wherein: the appearance of the one or more of the plurality of nodes is altered based on one or more rules and/or time-based data associated with the one or more of the plurality of nodes.

Clause 29: The computer-implemented method of any of Clauses 16-28 further comprising, by the one or more hardware processors executing program instructions: displaying alerts associated with one or more of the nodes and/or the like, wherein the alerts are based on one or more rules and/or time-based data associated with the one or more of the plurality of nodes.

Clause 30: The computer-implemented method of any of Clauses 16-29 further comprising, by the one or more hardware processors executing program instructions: displaying labels and/or sensor or data readouts associated with one or more of the plurality of nodes.

Clause 31: The computer-implemented method of any of Clauses 16-30 further comprising, by the one or more hardware processors executing program instructions: executing a simulation (and/or optimization) associated with one or more nodes.

Clause 32: The computer-implemented method of Clause 31, wherein one or more of: the simulation is based at least in part on time-based data associated with one or more nodes; the simulation is based at least in part on one or more models; a user specifies one or more values and/or parameters associated with models used in running the simulation; user interface elements are displayed to enable a user to view simulation information; and/or a comparison between two or more simulation is displayed.

Clause 33: The computer-implemented method of Clause 32 further comprising, by the one or more hardware processors executing program instructions: determining and displaying updates to any alerts and/or altered appearances of objects or nodes based on results of a simulation or optimization.

Clause 34: The computer-implemented method of any of Clauses 16-33 further comprising, by the one or more hardware processors executing program instructions: displaying movement of data and/or items among the plurality of objects and/or nodes based at least in part on the accessed time-based data.

Clause 35: The computer-implemented method of any of Clauses 16-34 further comprising: enabling linking from the graph-based interactive user interface to another related interactive user interface of another type.

Clause 36: The computer-implemented method of Clause 35, wherein the linking includes the user selecting a particular object and/or node with which alerts are associated, and linking to a panel-based interactive user interface that displays details of the associated alerts.

Clause 37: The computer-implemented method of any of Clauses 16-36, in which a map-based user interface replaces the graph-based user interface.

Clause 38: A computer-implemented method comprising, by one or more hardware processors executing program instructions: providing a panel-based interactive user interface including: a filterable listing of alerts, and details associated with a selected alert; accessing data associated with a selected alert; and displaying details associated with the selected alert.

Clause 39: The computer-implemented method of Clause 38, wherein the alert is associated with a data object.

Clause 40: The computer-implemented method of any of Clauses 38-39, wherein the alert is determined based on data associated with a data object and/or other data objects associated with the data object.

Clause 41: The computer-implemented method of any of Clauses 38-40, wherein the data comprises time-based data.

Clause 42: The computer-implemented method of any of Clauses 38-41, wherein the details include time-based charts that are optionally interactive.

Clause 43: The computer-implemented method of any of Clauses 38-42, wherein the user may select a link to another interactive user interface of a different type from the panel-based graphical user interface to interact with data associated with the alert.

Clause 44: The computer-implemented method of any of Clauses 38-43 further comprising, by the one or more hardware processors executing program instructions: in response to a user input selecting to remediate the alert, providing a simulation/optimization interactive user interface including a current state of data associated with the alert and evaluation factors associated with the alert.

Clause 45: The computer-implemented method of Clause 44 further comprising, by the one or more hardware processors executing program instructions: enabling the user to manually update/modify the current state of data associated with the alert (e.g., adding new orders, altering existing orders, altering existing inventory, and the like); and in response, updating the evaluation factors associated with the alert based on the manual updates/modifications.

Clause 46: The computer-implemented method of any of Clauses 44-45 further comprising, by the one or more hardware processors executing program instructions: in response to a user input to optimize the current state of data associated with the alert, automatically determining updates/modifications to the current state of data associated with the alert (e.g., adding new orders, altering existing orders, altering existing inventory, and the like) to optimize the evaluation factors associated with the alert; and updating the evaluation factors associated with the alert based on the optimizing.

Clause 47: The computer-implemented method of Clause 46, wherein optimizing the evaluation factors associated with the alert includes at least one of global optimization, cost optimization, time optimization, or sustainability optimization.

Clause 48: The computer-implemented method of any of Clauses 44-47, wherein the evaluation factors are determined based on one or more models.

Clause 49: The computer-implemented method of any of Clauses 45-48 further comprising, by the one or more hardware processors executing program instructions: enabling the user select to implement the updates/modifications to the current state of data associated with the alert.

Clause 50: A system comprising: a computer readable storage medium having program instructions embodied therewith; and one or more processors configured to execute the program instructions to cause the system to perform the computer-implemented method of any of Clauses 1-49.

Clause 51: A computer program product comprising a computer readable storage medium having program instructions embodied therewith, the program instructions executable by one or more processors to cause the one or more processors to perform the computer-implemented method of any of Clauses 1-49.

Clause 52: A computer-implemented method comprising, by one or more hardware processors executing program instructions: providing a graph-based interactive user interface including: a plurality of nodes and indications of links among the plurality of nodes, and a user interface element for selecting a date and/or time; accessing time-based data associated with one or more of the plurality of nodes for a selected date and/or time; and altering an appearance of the one or more of the plurality of nodes based at least in part on the accessed time-based data.

Clause 53: The computer-implemented method of Clause 52, wherein: the graph-based interactive user interface further includes: a user interface element for causing display of time-based data associated with one or more of the plurality of nodes.

Clause 54: The computer-implemented method of any of Clauses 52-53 further comprising, by the one or more hardware processors executing program instructions: enabling user interaction with the graph-based interactive user interface by which a user may edit the plurality of nodes, the indications of links among the plurality of nodes, locations of the plurality of nodes, properties associated with the plurality of nodes, and/or the like.

Clause 55: The computer-implemented method of any of Clauses 52-54 further comprising, by the one or more hardware processors executing program instructions: in response to a user input, adding a node to the graph-based interactive user interface.

Clause 56: The computer-implemented method of any of Clauses 52-55 further comprising, by the one or more hardware processors executing program instructions: in response to a user input, adding one or more nodes to the graph-based interactive user interface that are related to a selected node.

Clause 57: The computer-implemented method of Clause 56, wherein: the added one or more nodes are identified based at least in part on a relationship or link, or and ontology.

Clause 58: The computer-implemented method of any of Clauses 52-57, wherein: the nodes of the plurality of nodes may represent one or more of: objects, groups of objects, subgraphs, and/or the like.

Clause 59: The computer-implemented method of any of Clauses 52-58, wherein: the graph-based interactive user interface further includes: a histogram displaying properties common among one or more selected nodes of the plurality of nodes.

Clause 60: The computer-implemented method of Clause 59, wherein: the user may filter the selected nodes via histogram selection such that the selected nodes either comprise nodes that satisfy the selected properties in the histogram, or comprise nodes that do not satisfy the selected properties in the histogram.

Clause 61: The computer-implemented method of any of Clauses 52-60 further comprising, by the one or more hardware processors executing program instructions: in response to a user input, grouping one or more nodes of the plurality of nodes into a single node in the graph-based interactive user interface.

Clause 62: The computer-implemented method of any of Clauses 52-61 further comprising, by the one or more hardware processors executing program instructions: in response to a user input, creating a subgraph comprising one or more nodes, and displaying the subgraph as a single node in the graph-based interactive user interface.

Clause 63: The computer-implemented method of any of Clauses 52-62, wherein: altering the appearance of the one or more of the plurality of nodes comprises coloring, highlighting, and/or the like.

Clause 64: The computer-implemented method of any of Clauses 52-63, wherein: the appearance of the one or more of the plurality of nodes is altered based one or more rules and/or time-based data associated with the one or more of the plurality of nodes.

Clause 65: The computer-implemented method of any of Clauses 52-64 further comprising, by the one or more hardware processors executing program instructions: displaying alerts associated with one or more of the nodes and/or the like.

Clause 66: The computer-implemented method of any of Clauses 52-65 further comprising, by the one or more hardware processors executing program instructions: displaying labels and/or sensor or data readouts associated with one or more of the plurality of nodes.

Clause 67: The computer-implemented method of any of Clauses 52-66 further comprising, by the one or more hardware processors executing program instructions: executing a simulation associated with one or more nodes.

Clause 68: The computer-implemented method of Clause 67, wherein one or more of: the simulation is based at least in part on time-based data associated with one or more nodes; the simulation is based at least in part on one or more models; a user specifies one or more values and/or parameters associated with models used in running the simulation; user interface elements are displayed to enable a user to view simulation information; and/or a comparison between two or more simulation is displayed.

Clause 69: The computer-implemented method of any of Clauses 52-68 further comprising, by the one or more hardware processors executing program instructions: providing a map-based interactive user interface including: a plurality of objects and/or nodes and indications of links among the plurality of objects and/or nodes, and user interface element for selecting a date and/or time; accessing time-based data associated with one or more of the plurality of objects and/or nodes for a selected date and/or time; and displaying movement of data and/or items among the the plurality of objects and/or nodes based at least in part on the accessed time-based data.

Clause 70: A computer-implemented method comprising, by one or more hardware processors executing program instructions: providing a map-based interactive user interface including: a plurality of objects and/or nodes and indications of links among the plurality of objects and/or nodes, and a user interface element for selecting a date and/or time; accessing time-based data associated with one or more of the plurality of objects and/or nodes for a selected date and/or time; and displaying movement of data and/or items among the plurality of objects and/or nodes based at least in part on the accessed time-based data.

Clause 71: A system comprising: a computer readable storage medium having program instructions embodied therewith; and one or more processors configured to execute the program instructions to cause the system to perform the computer-implemented method of any of Clauses 52-70.

Clause 72: A computer program product comprising a computer readable storage medium having program instructions embodied therewith, the program instructions executable by one or more processors to cause the one or more processors to perform the computer-implemented method of any of Clauses 52-70.

Clause 73: A computer-implemented method for visualizing and interacting with a plurality of models and an interactive graphical user interface, the computer-implemented method comprising, by one or more hardware processors executing program instructions: providing an interactive graphical user interface including: a plurality of nodes and indications of relationships among the plurality of nodes, and a user interface element for selecting a point in time; receiving a selection of a point in time; accessing one or more models associated with one or more of the plurality of nodes; accessing time-based data associated with the one or more of the plurality of nodes and useable in the corresponding one or more models; simulating the one or more models using the associated time-based data to determine property values associated with the one or more of the plurality of nodes; and based on results of the simulating and the selected point in time, altering an appearance of the one or more of the plurality of nodes.

Clause 74: The computer-implemented method of Clause 73 further comprising, by the one or more hardware processors executing program instructions: in response to receiving a user input: adding a node to the user interface that is related to a selected node, and adding an indication of a relationship between the added node and the selected node.

Clause 75: The computer-implemented method of any of Clauses 73-74 further comprising, by the one or more hardware processors executing program instructions: in response to receiving a user input: causing display of a chart showing the accessed time-based data.

Clause 76: The computer-implemented method of any of Clauses 73-75, wherein the user interface further includes: a histogram displaying properties common among one or more selected nodes of the plurality of nodes.

Clause 77: The computer-implemented method of Clause 76 further comprising, by the one or more hardware processors executing program instructions: in response to receiving a user input via the histogram: updating the user interface to indicate a selection of the plurality of nodes corresponding to the user input.

Clause 78: The computer-implemented method of any of Clauses 73-77 further comprising, by the one or more hardware processors executing program instructions: in response to receiving a user input: grouping one or more nodes of the plurality of nodes into a single node in the user interface.

Clause 79: The computer-implemented method of any of Clauses 73-78 further comprising, by the one or more hardware processors executing program instructions: in response to receiving a user input: creating a subgraph comprising one or more nodes; and displaying the subgraph as a single node in the user interface.

Clause 80: The computer-implemented method of any of Clauses 73-79, wherein altering the appearance of the one or more of the plurality of nodes comprises at least one or: coloring or highlighting.

Clause 81: The computer-implemented method of any of Clauses 73-80, wherein the appearance of the one or more of the plurality of nodes is further altered based on at least one of: one or more rules or time-based data associated with the one or more of the plurality of nodes.

Clause 82: The computer-implemented method of any of Clauses 73-81 further comprising, by the one or more hardware processors executing program instructions: displaying alerts associated with one or more of the nodes, wherein the alerts are based on at least one of: one or more rules or time-based data associated with the one or more of the plurality of nodes.

Clause 83: The computer-implemented method of any of Clauses 73-82 further comprising, by the one or more hardware processors executing program instructions: displaying, adjacent to respective nodes, sensor data readouts associated with one or more of the plurality of nodes.

Clause 84: The computer-implemented method of any of Clauses 73-83 further comprising, by the one or more hardware processors executing program instructions: receive user inputs specifying one or more models, one or more inputs, and one or more outputs; and in response to receiving the user inputs: executing a second simulation associated with one or more nodes of the plurality of nodes; and causing display of a result of the second simulation.

Clause 85: The computer-implemented method of Clause 84 further comprising, by the one or more hardware processors executing program instructions: causing display of a comparison between two or more simulations including at least the second simulation.

Clause 86: The computer-implemented method of any of Clauses 84-85 further comprising, by the one or more hardware processors executing program instructions: determining and displaying updates to altered appearances of nodes based on the result of the second simulation.

Clause 87: The computer-implemented method of any of Clauses 73-86 further comprising, by the one or more hardware processors executing program instructions: displaying movement of items among the plurality of nodes based at least in part on the accessed time-based data.

Clause 88: The computer-implemented method of any of Clauses 73-87 further comprising: in response to receiving a user input associated with a node: linking from the user interface to another related interactive graphical user interface of another type to display information associated with the node.

Clause 89: The computer-implemented method of Clause 88, wherein the linking includes linking to a panel-based interactive graphical user interface that displays details of alerts associated with the node.

Clause 90: The computer-implemented method of any of Clauses 73-89, wherein the user interface is at least one of: graph-based or map-based.

Clause 91: A system comprising: a computer readable storage medium having program instructions embodied therewith; and one or more processors configured to execute the program instructions to cause the system to perform the computer-implemented method of any of Clauses 73-90.

Clause 92: A computer program product comprising a computer readable storage medium having program instructions embodied therewith, the program instructions executable by one or more processors to cause the one or more processors to perform the computer-implemented method of any of Clauses 73-90.

Clause 93: A computer-implemented method for visualizing and interacting with a plurality of models and an interactive graphical user interface, the computer-implemented method comprising, by one or more hardware processors executing program instructions: providing an interactive graphical user interface including a filterable listing of alerts associated with a plurality of related data objects; in response to receiving a selection of an alert from the listing of alerts, displaying details associated with the selected alert including an indication of a reason for the alert; and in response to receiving a user input selecting to remediate the alert by at least one of: modifying at least one of the plurality of related data objects, or adding a data object: accessing one or more models associated with one or more of the plurality of related data objects; accessing time-based data associated with the one or more of the plurality of related data objects and useable in the corresponding one or more models; simulating the one or more models using the associated time-based data to determine property values associated with the one or more of the plurality of related data objects; and based on results of the simulating, updating the details associated with the selected alert to indicate a change in evaluation factors associated with the alert and the plurality of related data objects.

Clause 94: The computer-implemented method of Clause 93 further comprising, by the one or more hardware processors executing program instructions: in response to receiving a second user input: linking to another interactive graphical user interface of a different type from the user interface to interact with data associated with the alert.

Clause 95: The computer-implemented method of any of Clauses 93-94 further comprising, by the one or more hardware processors executing program instructions: further in response to receiving the user input selecting to remediate the alert: providing an optimization interactive graphical user interface including a current state of data associated with the alert and evaluation factors associated with the alert.

Clause 96: The computer-implemented method of any of Clauses 93-95, wherein the at least one of: modifying at least one of the plurality of related data objects, or adding a data object, comprises: adding a new order, canceling an existing order, altering an existing order, or altering an existing inventory.

Clause 97: The computer-implemented method of any of Clauses 93-96 further comprising, by the one or more hardware processors executing program instructions: in response to a second user input to optimize a current state of data associated with the alert, automatically determining modifications to the current state of data associated with the alert to optimize the evaluation factors associated with the alert; and updating the evaluation factors associated with the alert based on the optimizing.

Clause 98: The computer-implemented method of Clause 97 further comprising, by the one or more hardware processors executing program instructions: displaying, in the user interface, a listing of the determined modifications to the current state of data associated with the alert to optimize the evaluation factors associated with the alert.

Clause 99: The computer-implemented method of any of Clauses 97-98, wherein optimizing the evaluation factors associated with the alert includes at least one of global optimization, cost optimization, time optimization, or sustainability optimization.

Clause 100: The computer-implemented method of Clause 99 further comprising, by the one or more hardware processors executing program instructions: enabling the user to select to implement the modifications to the current state of data associated with the alert.

Clause 101: A system comprising: a computer readable storage medium having program instructions embodied therewith; and one or more processors configured to execute the program instructions to cause the system to perform the computer-implemented method of any of Clauses 93-100.

Clause 102: A computer program product comprising a computer readable storage medium having program instructions embodied therewith, the program instructions executable by one or more processors to cause the one or more processors to perform the computer-implemented method of any of Clauses 93-100.

Clause 103: A computer-implemented method for visualizing and interacting with a plurality of models and an interactive graphical user interface, the computer-implemented method comprising, by one or more hardware processors executing program instructions: providing an interactive graphical user interface including indications of a plurality of related data objects or data associated with a plurality of related data objects; accessing time-based data associated with one or more of the plurality of related data objects; receiving, from a user, a key metric indicating a desired value of a performance indicator of an entity; determining a set of actions that are within constraints for real-world operations of the entity; determining a plurality of scenarios, each scenario including a plurality of the determined actions associated with the related data objects; for each scenario: determining a chain of one or more models that are executable to predict a value of the key metric based on the plurality of actions of the particular scenario; and simulating, using at least the accessed time-based data, the chain of models to determine a simulated key metric value; determining one or more scenarios having optimal simulated key metric values; and displaying, in the user interface, an indication of the one or more scenarios.

Clause 104: The computer-implemented of Clause 103, wherein each of the displayed scenarios is selectable by the user to cause display of the actions associated with the scenario.

Clause 105: The computer-implemented of any of Clauses 103-104 further comprising, by the one or more hardware processors executing program instructions: in response to selection of a first scenario of the displayed scenarios, implementing the actions associated with the scenario.

Clause 106: The computer-implemented of Clause 105, wherein implementing the actions associated with the scenario includes generating a material order, the material order being reviewable and editable by the user.

Clause 107: The computer-implemented of any of Clauses 103-106, wherein said determining a chain of one or more models comprises: obtaining a plurality of models, wherein the plurality of models comprises a first model and a second model, and wherein each of the first and second models comprises at least one or more objects having one or more object properties; simulating the first and second models to obtain a parameter output node of the first model and a parameter input node of the second model; training an artificial intelligence model using the parameter output and input nodes, wherein the artificial intelligence model, when executed, predicts that the parameter output node is related to the parameter input node; chaining the first and second models by linking the parameter output node with the parameter input node; and optimizing the chained first and second models by recurrently linking related parameter output nodes with related parameter input nodes; and/or optimizing the chained first and second models by iteratively optimizing a converging series of the chained first and second models.

Clause 108: The computer-implemented of Clause 107, wherein said obtaining a plurality of models comprises: receiving user input selecting the plurality of models.

Clause 109: The computer-implemented of any of Clauses 103-108, wherein the user interface comprises any combination graph-, map-, or panel-based interactive user interfaces.

Clause 110: The computer-implemented of Clause 109 further comprising, by the one or more hardware processors executing program instructions: displaying movement of items among the plurality of related data objects based at least in part on the accessed time-based data.

Clause 111: The computer-implemented of any of Clauses 109-110 further comprising, by the one or more hardware processors executing program instructions: determining alerts associated with data objects based on the time-based data or other data associated with the data objects; determining updated alerts associated with data objects based on the time-based data or other data associated with the data objects after application of a scenario; and indicating, in the user interface, data objects with which updated alerts are associated.

Clause 112: The computer-implemented of any of Clauses 109-111 further comprising, by the one or more hardware processors executing program instructions: in response to receiving a user input: linking to another interactive graphical user interface of a different type from the user interface to interact with data associated with an alert.

Clause 113: The computer-implemented of Clause 112, wherein the linking includes the user selecting a particular data object with which alerts are associated, and linking to a panel-based interactive user interface that displays details of the associated alerts.

Clause 114: A system comprising: a computer readable storage medium having program instructions embodied therewith; and one or more processors configured to execute the program instructions to cause the system to perform the computer-implemented method of any of Clauses 103-113.

Clause 115: A computer program product comprising a computer readable storage medium having program instructions embodied therewith, the program instructions executable by one or more processors to cause the one or more processors to perform the computer-implemented method of any of Clauses 103-113.

What is claimed is:

1. A computer-implemented method comprising, by one or more hardware processors executing program instructions:
   accessing, for each of one or more nodes of a plurality of nodes, provided in a user interface, a respective associated model corresponding to each node;
   accessing, for each of the one or more nodes, respective associated time-based data useable in the corresponding associated model;
   simulating the one or more models using the associated time-based data to determine property values associated with the respective one or more nodes, wherein the one or more models are configured to simulate one or more real-world systems; and
   based on results of the simulating and a selected point in time, updating an appearance of at least one of the one or more nodes displayed in the user interface.

2. The computer-implemented method of claim 1 further comprising, by the one or more hardware processors executing program instructions:
   in response to receiving a user input:
      adding a node to the user interface that is related to a selected node, and
      adding an indication of a relationship between the added node and the selected node.

3. The computer-implemented method of claim 1 further comprising, by the one or more hardware processors executing program instructions:
   in response to receiving a user input:
      causing display of a chart showing the accessed time-based data.

4. The computer-implemented method of claim 1, wherein the user interface further includes:
   a histogram displaying properties common among one or more selected nodes of the plurality of nodes.

5. The computer-implemented method of claim 4 further comprising, by the one or more hardware processors executing program instructions:
   in response to receiving a user input via the histogram:
      causing updating of the user interface to indicate a selection of one or more nodes of the plurality of nodes corresponding to the user input.

6. The computer-implemented method of claim 1 further comprising, by the one or more hardware processors executing program instructions:
   in response to receiving a user input:
      grouping one or more nodes of the plurality of nodes into a single node in the user interface.

7. The computer-implemented method of claim 1 further comprising, by the one or more hardware processors executing program instructions:
   in response to receiving a user input:
      creating a subgraph comprising one or more nodes; and
      causing displaying of the subgraph as a single node in the user interface.

8. The computer-implemented method of claim 1, wherein updating the appearance of the at least one of the one or more nodes comprises at least one of: coloring, emphasizing, or highlighting.

9. The computer-implemented method of claim 1, wherein the appearance of the at least one of the one or more nodes is further updated based on at least one of: one or more rules or time-based data associated with the at least one of the one or more nodes.

10. The computer-implemented method of claim 1 further comprising, by the one or more hardware processors executing program instructions:
    causing display of an alert associated with one or more of the nodes, wherein the alert is based on at least one of: one or more rules or time-based data associated with the at least one of the one or more nodes.

11. The computer-implemented method of claim 1 further comprising, by the one or more hardware processors executing program instructions:
    causing display, adjacent to respective nodes, of sensor data readouts associated with one or more of the plurality of nodes.

12. The computer-implemented method of claim 1 further comprising, by the one or more hardware processors executing program instructions:
    receiving user inputs specifying one or more models, one or more inputs, and one or more outputs; and
    in response to receiving the user inputs:
       executing a second simulation associated with one or more nodes of the plurality of nodes; and
       causing display of a result of the second simulation.

13. The computer-implemented method of claim 12 further comprising, by the one or more hardware processors executing program instructions:
    causing display of a comparison between two or more simulations including at least the second simulation.

14. The computer-implemented method of claim 12 further comprising, by the one or more hardware processors executing program instructions:
    determining and causing display of updates to appearances of nodes based on the result of the second simulation.

15. The computer-implemented method of claim 1 further comprising, by the one or more hardware processors executing program instructions:

causing display of movement of items among one or more nodes of the plurality of nodes based at least in part on the accessed time-based data.

16. The computer-implemented method of claim 1 further comprising:
   in response to receiving a user input associated with a node:
      linking from the user interface to another related interactive graphical user interface of another type to display information associated with the node.

17. The computer-implemented method of claim 16, wherein the linking includes linking to a panel-based interactive graphical user interface that includes details of alerts associated with the node.

18. The computer-implemented method of claim 1, wherein the user interface is at least one of: graph-based or map-based.

19. A system comprising:
   one or more computer readable storage mediums having program instructions embodied therewith; and
   one or more processors configured to execute the program instructions to cause the system to perform the computer-implemented method of claim 1.

20. A computer program product comprising one or more computer readable storage mediums having program instructions embodied therewith, the program instructions executable by one or more processors to cause the one or more processors to perform the computer-implemented method of claim 1.

* * * * *